US012731546B2

(12) United States Patent
Bae et al.

(10) Patent No.: US 12,731,546 B2
(45) Date of Patent: Sep. 8, 2026

(54) DISPLAY DEVICE

(71) Applicant: LG Display Co., Ltd., Seoul (KR)

(72) Inventors: YeonGyeong Bae, Paju-si (KR); Minjun Kim, Paju-si (KR); Junho Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 19/095,801

(22) Filed: Mar. 31, 2025

(65) Prior Publication Data

US 2025/0372038 A1 Dec. 4, 2025

(30) Foreign Application Priority Data

Jun. 3, 2024 (KR) ........................ 10-2024-0072256

(51) Int. Cl.

| | |
|---|---|
| ***G09G 3/3233*** | (2016.01) |
| ***H10K 59/12*** | (2023.01) |
| ***H10K 59/131*** | (2023.01) |
| ***H10K 59/35*** | (2023.01) |
| ***H10K 59/88*** | (2023.01) |
| ***H10K 71/00*** | (2023.01) |

(52) U.S. Cl.

CPC ....... *G09G 3/3233* (2013.01); *H10K 59/1201* (2023.02); *H10K 59/131* (2023.02); *H10K 59/353* (2023.02); *H10K 59/88* (2023.02); *H10K 71/861* (2023.02); *G09G 2300/0413* (2013.01); *G09G 2300/0819* (2013.01); *G09G 2300/0842* (2013.01); *G09G 2300/0861* (2013.01); *G09G 2320/0233* (2013.01); *G09G 2330/08* (2013.01); *G09G 2330/10* (2013.01); *G09G 2354/00* (2013.01)

(58) Field of Classification Search

CPC ........... H10K 58/88; G09G 2300/0413; G09G 2330/08; G09G 2330/10; G09G 3/006; G09G 2330/12

See application file for complete search history.

(56) References Cited

U.S. PATENT DOCUMENTS

2015/0243214 A1* 8/2015 Jeong ..................... G09G 3/035 345/78
2015/0262526 A1* 9/2015 Park ..................... G09G 3/3233 345/76
2024/0054927 A1* 2/2024 Park ....................... G09G 3/006

* cited by examiner

*Primary Examiner* — Sanjiv D. Patel
(74) *Attorney, Agent, or Firm* — Seed Intellectual Property Law Group LLP

(57) ABSTRACT

A display device includes a first and a second subpixel in a display area. The first subpixel includes a first subpixel circuit and a first light emitting element, a first common signal among a plurality of common signals is applied to the first subpixel circuit. The second subpixel includes a second subpixel circuit and a second light emitting element, a second common signal among the plurality of common signals is applied to the second subpixel circuit. A first dummy subpixel is disposed in a non-display area and includes a first dummy subpixel circuit. A first dummy signal line is disposed in the non-display area and is connected to the first dummy subpixel circuit. A dummy connection control line is disposed across the display area and the non-display area and disposed adjacent to the first dummy subpixel circuit, the first subpixel circuit, and the second subpixel circuit.

34 Claims, 23 Drawing Sheets

FIG.8

SP1 { ED1 / SPC1    SP2 { ED2 / SPC2    SP3 { ED3 / SPC3

DISPLAY DEVICE

CROSS-REFERENCE TO RELATED APPLICATION

This application claims priority from Korean Patent Application No. 10-2024-0072256, filed on Jun. 3, 2024, which is hereby incorporated by reference for all purposes as if fully set forth herein.

BACKGROUND

Technical Field

Embodiments of the disclosure relate to a display device.

Description of the Related Art

Recent advances in display technology have increased the complexity of pixel architectures within modern panels. In particular, each pixel typically includes multiple subpixels (often corresponding to red, green, and blue), each of which is driven by delicate transistor-based circuits and light-emitting elements. Even minor defects—caused by process variations, foreign matter, or circuit irregularities—can produce bright or dark spots, creating noticeable flaws in the displayed image and reducing overall yield. In many instances, if one or more subpixels in a panel are defective, it may result in discarding the entire display, significantly driving up manufacturing costs.

BRIEF SUMMARY

To address the various technical problems in the related art, the inventors of the present disclosure appreciated the need for techniques and structures that can both identify and repair defective subpixels, whether the defect exists in a single subpixel or spans multiple adjacent subpixels. By incorporating dedicated "dummy" circuits or specialized connection lines, a defective subpixel's normal function can be restored, helping to reduce waste, maintain high image quality, and improve the overall manufacturing yield of display panels. The various embodiments of the present disclosure provide a display device architecture specifically configured to detect, isolate, and restore defective subpixels (restoring the functionality of the defective subpixel).

Embodiments of the disclosure may provide a display device that enables high yield.

Embodiments of the disclosure may provide a display device having a repair structure capable of normalizing a defective subpixel.

Embodiments of the disclosure may provide a display device with a defective subpixel normalized.

Embodiments of the disclosure may provide a display device having a repair structure capable of normalizing all of successively disposed subpixels when a defect occurs in all of the successively disposed subpixels.

Embodiments of the disclosure may provide a display device with all defects of successively disposed subpixels normalized.

A display device according to embodiments of the disclosure may comprise a first subpixel disposed in a display area, and including a first subpixel circuit to which a first common signal among a plurality of common signals is applied and a first light emitting element adjacent to the first subpixel circuit, a second subpixel disposed in the display area, and including a second subpixel circuit to which a second common signal among the plurality of common signals is applied and a second light emitting element adjacent to the second subpixel circuit, a first dummy subpixel disposed in a non-display area and including a first dummy subpixel circuit, a first dummy signal line disposed in the non-display area and connected to the first dummy subpixel circuit, and a dummy connection control line disposed across (in or over) the display area and the non-display area and disposed adjacent to the first dummy subpixel circuit, the first subpixel circuit, and the second subpixel circuit.

A display device according to embodiments of the disclosure may comprise a plurality of subpixels disposed in a display area and including a first subpixel and a second subpixel, and a plurality of dummy subpixel circuits disposed in a non-display area. The first subpixel may include a first light emitting element and a first subpixel circuit, and the second subpixel may include a second light emitting element and a second subpixel circuit. The first light emitting element and the first subpixel circuit may be electrically disconnected from each other, and the second light emitting element and the second subpixel circuit may be electrically disconnected from each other. The plurality of dummy subpixel circuits may include a first dummy subpixel circuit electrically connected to the first light emitting element and a second dummy subpixel circuit electrically connected to the second light emitting element.

According to embodiments of the disclosure, there may be provided a display device that enables high yield.

According to embodiments of the disclosure, there may be provided a display device having a repair structure capable of normalizing a defective subpixel.

According to embodiments of the disclosure, there may be provided a display device with a defective subpixel normalized.

According to embodiments of the disclosure, there may be provided a display device having a repair structure capable of normalizing all of successively disposed subpixels when a defect occurs in all of the successively disposed subpixels.

According to embodiments of the disclosure, there may be provided a display device with all defects of successively disposed subpixels normalized.

According to embodiments of the disclosure, there may be provided a display device capable of recycling and process optimization and reducing manufacturing yields through an effective repair process for defects even when a defect occurs in at least one subpixel that is not disposed successively or in two or more subpixels that are disposed successively.

DESCRIPTION OF THE SEVERAL VIEWS OF THE DRAWINGS

The above and other objects, features, and advantages of the disclosure will be more clearly understood from the following detailed description, taken in conjunction with the accompanying drawings, in which:

FIGS. 7 and 8 illustrate a stack structure of a light emitting element of a display panel according to embodiments of the disclosure;

DETAILED DESCRIPTION

Figure 1:
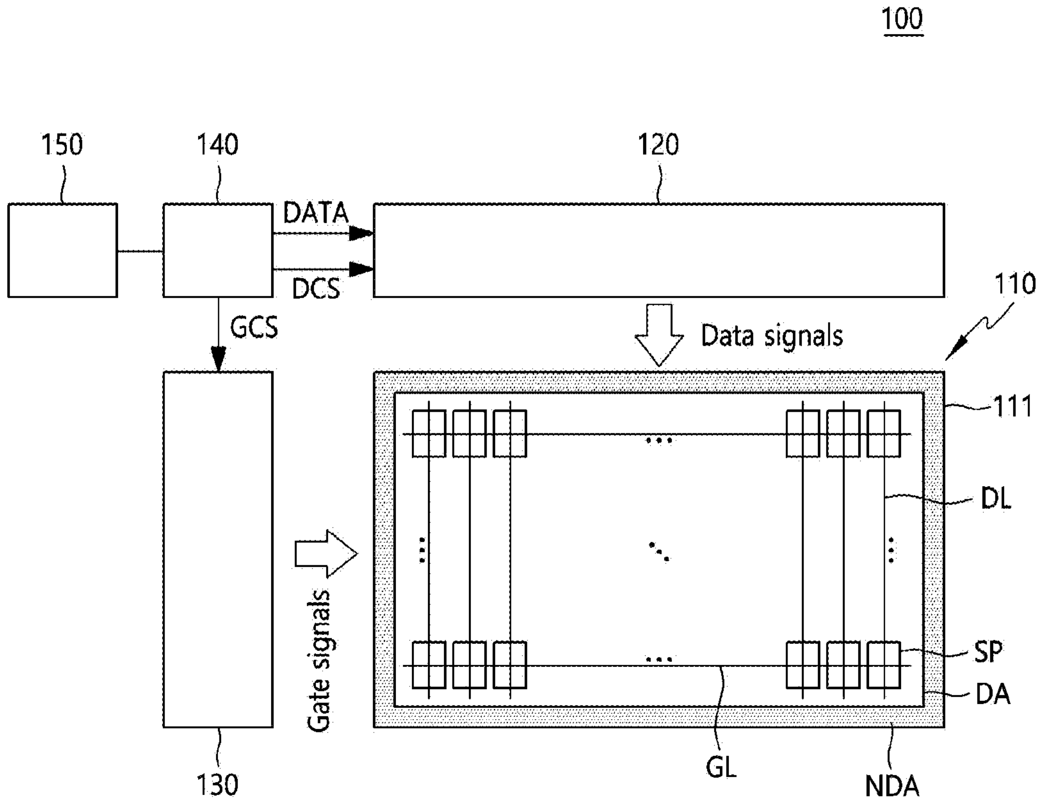
FIG. 1 illustrates a display device according to embodiments of the disclosure.

Advantages and features of the disclosure, and methods for achieving the same may be understood through the embodiments to be described below taken in conjunction with the accompanying drawings. However, the disclosure is not limited to the embodiments disclosed herein, and various changes may be made thereto. The embodiments disclosed herein are provided only to inform one of ordinary skilled in the art of the category of the disclosure. The disclosure is defined only by the appended claims.

The shapes, sizes, dimensions (e.g., length, width, height, thickness, radius, diameter, area, etc.), ratios, angles, number of elements, and the like illustrated in the accompanying drawings for describing the embodiments of the present disclosure are merely examples, and the present disclosure is not limited thereto.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The same reference numeral denotes the same element throughout the specification. When determined to make the subject matter of the disclosure unclear, the detailed description of the known art or functions may be skipped. As used herein, when a component "includes," "has," or "is composed of" another component, the component may add other components unless the component "only" includes, has, or is composed of" the other component. As used herein, the singular forms "a," "an," and "the" are intended to include the plural forms as well, unless the context clearly indicates otherwise.

Components are interpreted to include a margin of error, even if not explicitly stated otherwise.

As used herein, the terms "connected" and "coupled" are intended to have the broadest possible meaning. Specifically, the phrase "A is connected to B" encompasses both a direct connection—where no intervening components or elements are present—and an indirect connection, where one or more intermediate components or elements exist between A and B. In other words, "A is connected to B" includes both direct physical or electrical coupling and indirect coupling through one or more intervening components. Unless explicitly stated otherwise, these terms do not require direct physical or electrical contact. The term "coupled" should be interpreted in the same manner.

If the description is of a positional relationship, for example, "on," "above," "under," "below," "next to," etc., of two parts, one or more other parts may be located between the two parts, unless "directly" is used.

When such terms as, e.g., "after," "next to," "after," and "before," are used to describe a temporal relationship, operation methods, and fabricating methods, it may include a non-continuous relationship unless the term "immediately" or "directly" is used.

When describing the flow relationship between signals, e.g., 'a signal is transferred from node A to node B' may include when the signal is transferred from node A to node B via another node unless the signal is 'directly' transferred from node A to node B.

Although the terms "first" and "second" are used to describe various components, the components are not limited by the terms. These terms are provided simply to distinguish one component from another. Accordingly, the first component mentioned herein may also be the second component within the technical spirit of the disclosure.

The term "defect" as used herein refers to any condition, failure, or irregularity in a display device that results in the malfunction, degradation, or unintended operation of a subpixel or its associated circuitry. A defect may arise due to manufacturing inconsistencies, operational wear, or external factors, impacting the display panel's ability to function as intended. Such defects may affect individual subpixels, multiple adjacent subpixels, or the circuitry responsible for driving the subpixels.

A defect broadly includes, but is not limited to, 1) Electrical Disconnection: A break in the electrical connection between a subpixel circuit and its corresponding light-emitting element, preventing proper activation of the subpixel; 2) Open Circuit Faults: A discontinuity in conductive traces, electrodes, or interconnects that interrupts signal transmission to a subpixel circuit; 3) Short Circuit Faults: An unintended electrical connection between two or more conductive paths, causing continuous or erratic subpixel illumination; 4) Transistor Malfunctions: Defects in driving or switching transistors, including gate leakage, breakdown, or improper switching, which impede proper subpixel operation; 5) Data Line or Common Signal Line Defects: Signal line failures that result in incorrect voltage levels or an inability to transmit data to the subpixel circuits; 6) Partial or Complete Subpixel Failure: A subpixel that fails to emit light, exhibits flickering, or operates at an unintended luminance level due to electrical, material, or structural failure. This definition includes all types of failures that impact display performance, whether temporary or permanent, mechanical or electrical.

The feature of various embodiments of the disclosure may be partially or wholly combined or coupled with each other, and various technical interlockings and operations are possible, and the embodiments may be practiced independently of each other or in conjunction with each other.

Hereinafter, various embodiments of the disclosure are described in detail with reference to the accompanying drawings.

FIG. 1 illustrates a display device 100 according to embodiments of the disclosure.

Referring to FIG. 1, a display device 100 according to embodiments of the disclosure may include a display panel 110 and display driving circuits, as components for displaying images. The display driving circuit may be a circuit for driving the display panel 110. The display driving circuits may include a data driving circuit 120, a gate driving circuit 130, and a controller 140, but embodiments of the disclosure are not limited thereto.

The display panel 110 may include a substrate 111 and a plurality of subpixels SP disposed on the substrate 111.

The substrate 111 may include a display area DA and a non-display area NDA.

The display area DA is an area where images may be displayed, and may also be referred to as an active area. A plurality of subpixels SP for image display may be disposed in the display area DA.

The non-display area NDA is an area where no image is displayed and may be an area outside the display area DA. The non-display area NDA may also be referred to as a bezel (or bezel area). The non-display area NDA may include a pad area.

For example, the non-display area NDA may include a first non-display area, a second non-display area, a third non-display area, and a fourth non-display area. The first non-display area may be positioned outside the display area DA in the row direction. The second non-display area may be positioned outside the display area DA in the row direction and may be positioned opposite to the first non-display area. The third non-display area may be positioned outside the display area DA in the column direction. The fourth non-display area may be positioned outside the display area DA in the column direction and may be positioned opposite to the third non-display area.

Among the first to fourth non-display areas, the fourth non-display area may include a pad area where a driving circuit is connected, bonded (or attached), and the first to third non-display areas may have a very small size, but the embodiments of the disclosure are not limited thereto.

As another example, the boundary area between the display area DA and the non-display area NDA may be bent so that the non-display area NDA may be positioned under the display area.

Oo or little change may be made to the non-display area NDA shown to the user when the user views the display area 100 from the front, but embodiments of the disclosure are not limited thereto.

The display device 100 according to embodiments of the disclosure may be a self-emission display device in which the display panel 110 emits light by itself, but embodiments of the disclosure are not limited thereto. When the display device 100 according to the embodiments of the disclosure is a self-emission display device, each of the plurality of subpixels SP may include a light emitting element.

For example, the display device 100 according to embodiments of the disclosure may be an organic light emitting diode display in which the light emitting element is implemented as an organic light emitting diode (OLED). As another example, the display device 100 according to embodiments of the disclosure may be an inorganic light emitting display device in which the light emitting element is implemented as an inorganic material-based light emitting diode. As another example, the display device 100 according to embodiments of the disclosure may be a quantum dot display device in which the light emitting element is implemented as a quantum dot which is self-emission semiconductor crystal. As another example, the display device 100 according to embodiments of the disclosure may be a micro LED display device or a mini LED display device.

The structure of each of the plurality of subpixels SP may vary according to the type of the display device 100. For example, when the display device 100 is a self-emission display device in which the subpixels SP emit light by themselves, each subpixel SP may include a light emitting element that emits light by itself, one or more transistors, and one or more capacitors, but embodiments of the disclosure are not limited thereto.

Various types of signal lines for driving a plurality of subpixels SP may be disposed on the substrate 111 of the display panel 110. For example, various types of signal lines may include a plurality of data lines DL transferring data signals (also referred to as data voltages or image signals) and a plurality of gate lines GL transferring gate signals (also referred to as scan signals).

The plurality of data lines DL and the plurality of gate lines GL may cross each other. Each of the plurality of data lines DL may be disposed to extend in the column direction. Each of the plurality of gate lines GL may be disposed to extend in the row direction. According to embodiments of the disclosure, the column direction and the row direction may be relative directions. For example, the column direction may be the row direction depending on the viewpoint, and the row direction may be the column direction depending on the viewpoint. For convenience of description, described below is an example in which each of the plurality of data lines DL is disposed in the column direction, and each of the plurality of gate lines GL is disposed in the row direction, but embodiments of the disclosure are not limited thereto. In embodiments of the disclosure, the angle between the row direction and the column direction may be 90 degrees or may an angle different from 90 degrees. Further, in embodiments of the disclosure, the row direction may be referred to as a first direction, and the column direction may be referred to as a second direction.

The data driving circuit 120 may be a circuit for driving the plurality of data lines DL, and may out data signals to the plurality of data lines DL.

The data driving circuit 120 may receive digital image data DATA from the controller 140 and may convert the received image data DATA into analog data signals (or also referred to as data voltages) and output them to the plurality of data lines DL.

For example, the data driving circuit 120 may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110, but embodiments of the disclosure are not limited thereto.

The data driving circuit 120 may be connected to one side (e.g., an upper or lower side) of the display panel 110. As another example, depending on the driving scheme or the panel design scheme, data driving circuits 120 may be connected with both the sides (e.g., both the upper and lower sides) of the display panel 110, or two or more of the four sides of the display panel 110.

The data driving circuit 120 may be connected outside the display area DA of the display panel 110, but as another example, the data driving circuit 120 may be disposed in the display area DA of the display panel 110.

The gate driving circuit 130 is a circuit for driving the plurality of gate lines GL, and may output gate signals to the plurality of gate lines GL.

The gate driving circuit 130 may receive a first gate voltage corresponding to a turn-on voltage (or also referred to as a turn-on level voltage) and a second gate voltage corresponding to a turn-off voltage (or also referred to as a turn-off level voltage) together with various gate driving control signals GCS, generate gate signals including a section having the first gate voltage and a section having the second gate voltage for a predetermined time (e.g., one frame time), and supply the generated gate signals to the plurality of gate lines GL. For example, the turn-on level voltage may be a high level voltage, and the turn-off level voltage may be a low level voltage. As another example, the turn-on level voltage may be a low level voltage, and the turn-off level voltage may be a high level voltage.

In the display device 100 according to embodiments of the disclosure, the gate driving circuit 130 may be embedded, in a gate in panel (GIP) type, in the display panel 110, but embodiments of the disclosure are not limited thereto. When the gate driving circuit 130 is of the gate in panel type, the gate driving circuit 130 may be formed on the substrate 111 of the display panel 110 during the manufacturing process of the display panel 110.

For example, the gate driving circuit 130 may be disposed in the non-active area NDA of the display panel 110.

As another example, the gate driving circuit 130 may be disposed in the display area DA of the display panel 110. For example, the gate driving circuit 130 may be disposed in a first partial area in the display area DA (e.g., a left area or a right area in the display area DA). As another example, the gate driving circuit 130 may be disposed in a first partial area in the display area DA (e.g., a left area or right area in the display area DA) and a second partial area (e.g., a right area or left area in the display area DA). As another example, the gate driving circuit 130 may be disposed across (over) the entire display area DA.

When the gate driving circuit 130 is disposed in the display area DA of the display panel 110, the gate driving circuit 130 may vertically overlap the subpixels SP disposed in the display area DA. For example, the gate driving circuit 130 may vertically overlap the light emitting elements and transistors included in the disposed subpixels SP in the display area DA. The gate driving circuit 130 may vertically overlap a plurality of light emitting elements and a plurality of transistors included in a plurality of subpixels SP disposed in the display area DA. The gate driving circuit 130 may include a plurality of transistors. Each of the plurality of transistors included in the gate driving circuit 130 may include an active layer including a first semiconductor material, and each of the plurality of transistors included in the subpixels SP may include an active layer including a second semiconductor material. For example, the first semiconductor material and the second semiconductor material may be substantially identical. As another example, the first semiconductor material and the second semiconductor material may be different from each other. For example, the first semiconductor material may be a silicon-based semiconductor material (e.g., low temperature poly silicon), and the second semiconductor material may be an oxide semiconductor material. For example, the active layer may be, but is not limited to, a semiconductor layer.

The controller 140 is a device for controlling the data driving circuit 120 and the gate driving circuit 130 and may control driving timings for the plurality of data lines DL and driving timings for the plurality of gate lines GL.

The controller 140 may supply a data driving control signal DCS to the data driving circuit 120 to control the data driving circuit 120 and may supply a gate driving control signal GCS to the gate driving circuit 130 to control the gate driving circuit 130.

The controller 140 may receive input image data from the host system 150 and supply image data DATA to the data driving circuit 120 based on the input image data.

The controller 140 may be implemented as a separate component from the data driving circuit 120, or the controller 140 and the data driving circuit 120 may be integrated into an integrated circuit (IC).

The controller 140 may be a timing controller used in display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor, but is not limited thereto.

The controller 140 may be mounted on a printed circuit board or a flexible printed circuit and may be electrically connected with the data driving circuit 120 and the gate driving circuit 130 through the printed circuit board or the flexible printed circuit.

The controller 140 may transmit/receive signals to/from the data driving circuit 120 according to one or more predetermined interfaces. The interface may include, e.g., a low voltage differential signaling (LVDS) interface, an embedded clock point-point interface (EPI) interface, and a serial peripheral interface (SPI), but embodiments of the disclosure are not limited thereto.

To provide a touch sensing function as well as an image display function, the display device 100 according to embodiments of the disclosure may include a touch sensor and a touch sensing circuit that senses the touch sensor to detect whether a touch occurs by a touch object, such as a finger or pen, or the position of the touch.

The touch sensing circuit may include a touch driving circuit that drives and senses the touch sensor and generates and outputs touch sensing data and a touch controller that may detect an occurrence of a touch or the position of the touch using touch sensing data.

The touch sensor may include a plurality of touch electrodes. The touch sensor may further include a plurality of touch lines for electrically connecting the plurality of touch electrodes and the touch driving circuit.

The touch sensor may be present in a touch panel form outside the display panel 110 or may be present inside the display panel 110. When the touch panel, in the form of a touch panel, exists outside the display panel 110, the touch panel is of an external type. When the touch sensor is of the external type, the touch panel and the display panel 110 may be separately manufactured or may be combined during an assembly process. The external-type touch panel may include a touch panel substrate and a plurality of touch electrodes on the touch panel substrate.

When the touch sensor is present inside the display panel 110, the touch sensor may be formed on the substrate 111, together with signal lines and electrodes related to display driving, during the manufacturing process of the display panel 110.

The touch driving circuit may supply a touch driving signal to at least one of the plurality of touch electrodes and may sense at least one of the plurality of touch electrodes to generate touch sensing data.

The touch sensing circuit may perform touch sensing in a self-capacitance sensing scheme or a mutual-capacitance sensing scheme.

When the touch sensing circuit performs touch sensing in the self-capacitance sensing scheme, the touch sensing circuit may perform touch sensing based on capacitance between each touch electrode and the touch object (e.g., finger or pen). According to the self-capacitance sensing scheme, each of the plurality of touch electrodes may serve both as a driving touch electrode and as a sensing touch electrode. The touch driving circuit may drive all or some of the plurality of touch electrodes and sense all or some of the plurality of touch electrodes.

When the touch sensing circuit performs touch sensing in the mutual-capacitance sensing scheme, the touch sensing circuit may perform touch sensing based on capacitance between the touch electrodes. According to the mutual-capacitance sensing scheme, the plurality of touch electrodes are divided into driving touch electrodes and sensing touch electrodes. The touch driving circuit may drive the driving touch electrodes and sense the sensing touch electrodes.

The touch driving circuit and the touch controller included in the touch sensing circuit may be implemented as separate devices or as a single device. The touch driving circuit and the data driving circuit may be implemented as separate devices or as a single device.

The display device 100 may further include a power supply circuit for supplying various types of power to the display driver integrated circuit and/or the touch sensing circuit. The power supply circuit may supply various voltages and power voltages related to display driving to the display driving circuit or display panel 110.

The display device 100 according to embodiments of the disclosure may be a mobile terminal, such as a smart phone or a tablet, or a monitor or television (TV) in various sizes but, without limited thereto, may be a display in various types and various sizes capable of displaying information or images.

The display device 100 according to embodiments of the disclosure may further include an electronic device such as a camera (image sensor), a detection sensor, or the like. For example, the detection sensor may be a sensor that detects an object or a human body by receiving light such as infrared rays, ultrasonic waves, or ultraviolet rays, but embodiments of the disclosure are not limited thereto.

Figure 2:
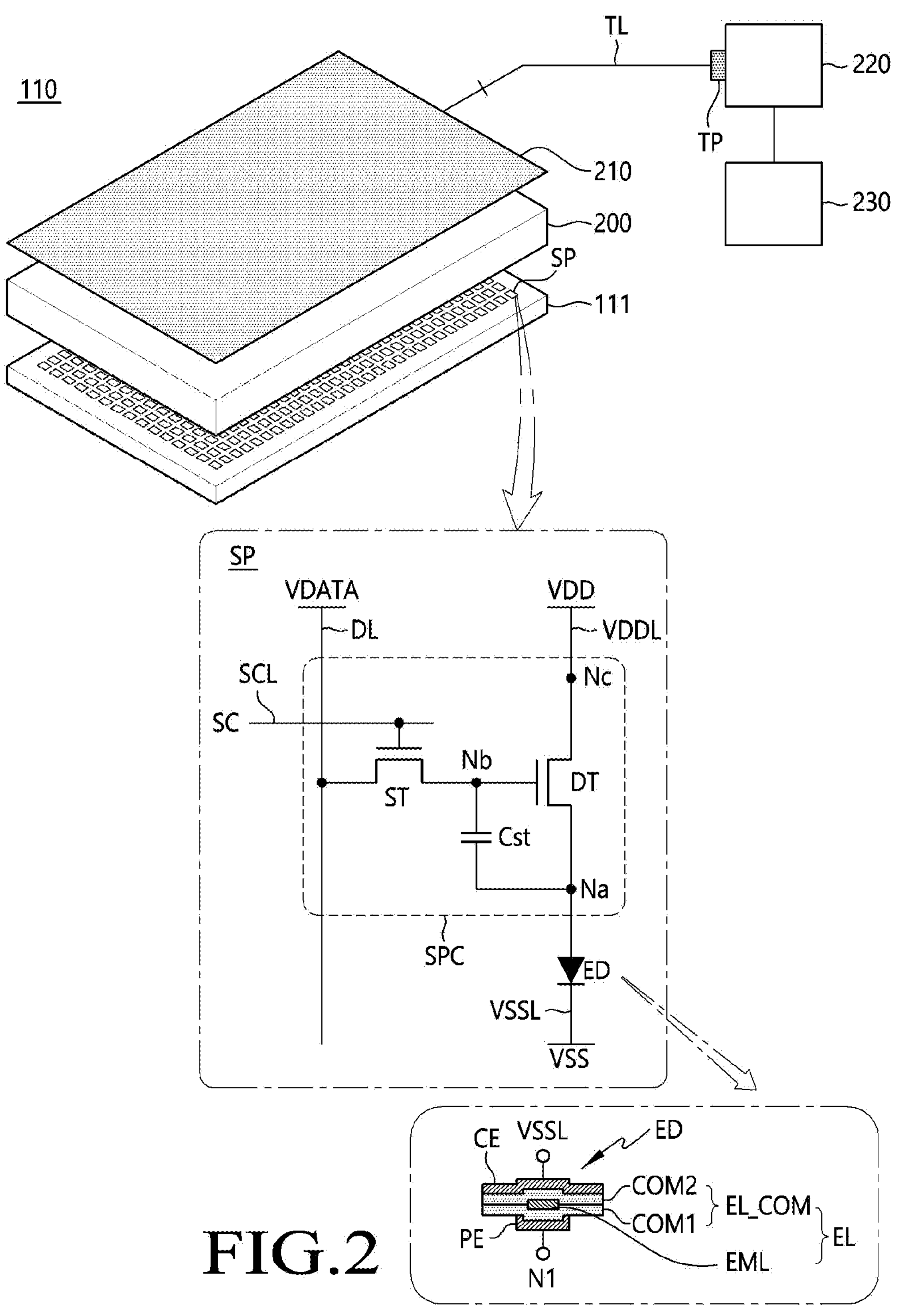
FIG. 2 illustrates a display panel according to an embodiment of the disclosure.

FIG. 2 illustrates a display panel 110 according to an embodiment of the disclosure.

Referring to FIG. 2, the display panel 110 may include a substrate 111 disposed in a plurality of subpixels SP and an encapsulation layer 200 on the substrate 111. The encapsulation layer 200 may also be referred to as an encapsulation substrate or an encapsulation portion.

Referring to FIG. 2, when the display device 100 according to embodiments of the disclosure is a self-luminous display device, each of the plurality of subpixels SP disposed on the substrate 111 may include a light emitting element ED and a subpixel circuit SPC for driving the light emitting element ED.

Referring to FIG. 2, the subpixel circuit SPC may include a plurality of transistors and at least one capacitor for driving the light emitting element ED, but embodiments of the disclosure are not limited thereto. In the disclosure, the subpixel circuit SPC may drive the light emitting element ED by supplying a driving current to the light emitting element ED at a predetermined timing. The light emitting element ED may be driven by a driving current to emit light.

The plurality of transistors may include a driving transistor DT for driving the light emitting element ED and a scanning transistor ST that is turned on or off according to the scan signal SC.

The driving transistor DT may supply a driving current to the light emitting element ED.

The scanning transistor ST may be configured to control the electrical state of a corresponding node in the subpixel circuit SPC or to control the state or operation of the driving transistor DT.

The at least one capacitor may include a storage capacitor Cst for maintaining a constant voltage during a frame.

To drive the subpixel SP, a data signal VDATA as an image signal and a scan signal SC as a gate signal may be applied to the subpixel SP. Further, to drive the subpixel SP, a common driving signal including a driving voltage VDD and a base voltage VSS may be applied to the subpixel SP.

The light emitting element ED may include a pixel electrode PE, an intermediate layer EL, and a common electrode CE. An intermediate layer EL may be disposed between the pixel electrode PE and the common electrode CE.

For example, the pixel electrode PE may be an electrode disposed in each subpixel SP, and the common electrode CE may be an electrode commonly disposed in all the subpixels SP. For example, the pixel electrode PE may be an anode and the common electrode CE may be a cathode. As another example, the pixel electrode PE may be a cathode and the common electrode CE may be an anode. Hereinafter, for convenience of description, an example in which the pixel electrode PE is an anode and the common electrode CE is a cathode is described.

When the light emitting element ED is an organic light emitting element, the intermediate layer EL may include a light emitting layer EML, a first common intermediate layer COM1 between the pixel electrode PE and the light emitting layer EML, and a second common intermediate layer COM2 between the light emitting layer EML and the common electrode CE. The first common intermediate layer COM1 and the second common intermediate layer COM2 may be collectively referred to as a common intermediate layer EL_COM.

The light emitting layer EML may be disposed for each subpixel SP. The common intermediate layer EL_COM may be commonly disposed across (over) the plurality of subpixels SP, but embodiments of the disclosure are not limited thereto.

The light emitting layer EML may be disposed for each emission area. The common intermediate layer EL_COM may be commonly disposed across a plurality of emission areas and non-emission areas, but embodiments of the disclosure are not limited thereto.

For example, the first common intermediate layer COM1 may include a hole injection layer HIL, an electron blocking layer EBL, and a hole transport layer HTL, but embodiments of the disclosure are not limited thereto. The second common intermediate layer COM2 may include an electron transport layer ETL, a hole blocking layer HBL, and an electron injection layer EIL, but embodiments of the disclosure are not limited thereto.

The hole injection layer HIL may inject holes from the pixel electrode PE to the hole transport layer HTL, and the hole transport layer HTL may transport holes to the light emitting layer EML. The electron injection layer EIL may inject electrons from the common electrode CE to the electron transport layer ETL, and the electron transport layer ETL may transport electrons to the light emitting layer EML.

For example, the common electrode CE may be electrically connected to the base voltage line VSSL. A base voltage VSS, which is a type of common driving signal, may be applied to the common electrode CE through the base voltage line VSSL. The pixel electrode PE may be electrically connected directly or indirectly (through another transistor) to the first node Na of the driving transistor DT of each subpixel SP. In the disclosure, "base voltage VSS" may also be referred to as a "low-potential power voltage" or a "low-potential voltage," and "base voltage line VSSL" may also be referred to as a "low-potential power voltage line" or a "low-potential voltage line."

Each light emitting element ED may include an overlapping portion of the pixel electrode PE, the light emitting layer EML in the intermediate layer EL, and the common electrode CE. A predetermined emission area may be formed by each light emitting element ED. For example, the light emitting area of each light emitting element ED may include an overlapping area of the pixel electrode PE, the light emitting layer EML in the intermediate layer EL, and the common electrode CE.

For example, the light emitting element ED may be an organic light emitting diode (OLED), an inorganic light emitting diode (LED), a quantum dot light emitting element, a micro LED, or a mini LED, but embodiments of the disclosure are not limited thereto. For example, when the light emitting element ED is an organic light emitting diode (OLED), the intermediate layer EL of the light emitting element ED may include an intermediate layer EL including an organic material.

The driving transistor DT may be a driving transistor for supplying a driving current to the light emitting element ED. The driving transistor DT may be connected between a driving voltage line VDDL and the light emitting element ED.

The driving transistor DT may include a first node Na, a second node Nb, and a third node Nc. The first node Na may be electrically connected to the light emitting element ED, the second node Nb may receive a data signal VDATA, and the third node Nc may receive a driving voltage VDD from the driving voltage line VDDL. The driving transistor DT may be connected on the first node Na and the third node Nc.

In the driving transistor DT, the second node Nb may be a gate node, the first node Na may be a source node or a drain node, and the third node Nc may be a drain node or a source node. Hereinafter, for convenience of description, an example is described in which in the driving transistor DT, the second node Nb may be a gate node, the first node Na may be a source node, and the third node Nc may be a drain node, but embodiments of the disclosure are not limited thereto.

The scanning transistor ST included in the subpixel circuit SPC illustrated in FIG. 2 may be a switching transistor for transferring the data signal VDATA, which is an image signal, to the second node Na, which is the gate node of the driving transistor DT.

The scanning transistor ST may be controlled to be turned on and off by the scan signal SC, which is a gate signal applied through the scan line SCL, which is a type of the gate line GL, to control electrical connection between the second node Nb of the driving transistor DT and the data line DL. The drain electrode or the source electrode of the scanning transistor ST may be electrically connected to the data line DL, the source electrode or the drain electrode of the scanning transistor ST may be electrically connected to the second node Nb of the driving transistor DT, and the gate electrode of the scanning transistor ST may be electrically connected to the scan line SCL.

The storage capacitor Cst may be electrically connected between the first node Na and second node Nb of the driving transistor DT. The storage capacitor Cst may include a first capacitor electrode electrically connected to the first node Na of the driving transistor DT or corresponding to the first node Na of the driving transistor DT, and a second capacitor electrode electrically connected to the second node Nb of the driving transistor DT or corresponding to the second node Nb of the driving transistor DT.

The capacitor Cst may be an external capacitor intentionally designed to be outside the driving transistor DT, but not a parasite capacitor (e.g., Cgs or Cgd) which is an internal capacitor that may be present between the first node Na and the second node Nb of the driving transistor DT, but embodiments of the disclosure are not limited thereto.

Each of the driving transistor DT and the scanning transistor ST may be an n-type transistor or a p-type transistor, but embodiments of the disclosure are not limited thereto. For example, one of the driving transistor DT and the scanning transistor ST may be either an n-type transistor or a p-type transistor.

The display panel 110 may have a top emission structure or a bottom emission structure.

When the display panel 110 has a top emission structure, at least a portion of the subpixel circuit SPC may overlap at least a portion of the light emitting element ED in a vertical direction. Accordingly, the area of the emission area may increase and the aperture ratio may increase.

When the display panel 110 has a bottom emission structure, the subpixel circuit SPC may not overlap the light emitting element ED in the vertical direction.

The subpixel circuit SPC may have a 2T (transistor) 1C (capacitor) structure which includes two transistors DT and ST and one capacitor Cst as shown in FIG. 2 and, in some cases, each subpixel SP may further include one or more transistors or one or more capacitors.

For example, the subpixel circuit SPC may have an 8T1C structure including 8 transistors and 1 capacitor. As another example, the subpixel circuit SPC may have a 6T2C structure including 6 transistors and 2 capacitors. As another example, the subpixel circuit SPC may have a 7T1C structure including 7 transistors and 1 capacitor. Embodiments of the disclosure are not limited thereto.

Depending on the structure of the subpixel circuit SPC, the type and number of gate lines or the gate signals supplied to the subpixel SP may vary. Further, the type and the number of common driving signals supplied to the subpixel SP may vary depending on the structure of the subpixel circuit SPC.

Since the circuit elements (e.g., the light emitting element ED implemented as an organic light emitting diode (OLED) including an organic material) in each subpixel SP are vulnerable to external moisture or oxygen, the encapsulation layer 200 may be disposed on the display panel 110. The encapsulation layer 200 may prevent external moisture or oxygen from penetrating into circuit elements (e.g., the light emitting element ED). The encapsulation layer 200 may be configured in various forms so that the light emitting elements ED do not contact moisture or oxygen. For example, the encapsulation layer 200 may be constituted of two or more layers in which organic films and inorganic films are alternately stacked, but embodiments of the disclosure are not limited thereto.

Referring to FIG. 2, a display device 100 according to embodiments of the disclosure may include a touch sensor layer 210 including a plurality of sensor electrodes to sense the user's touch, a touch driving circuit 220 configured to sense the plurality of sensor electrodes, and a touch controller 230 configured to determine the presence or absence of a touch or touch coordinates using the sensing result (touch sensing data) of the touch driving circuit 220.

The touch sensor layer 210 may be embedded in the display panel 110. For example, the touch sensor layer 210 may be disposed on the encapsulation layer 200 in the display panel 110. The touch sensor layer 210 may be a touch unit.

The display panel 110 may further include a plurality of touch pads TP electrically connected to the touch driving circuit 220 and a plurality of touch routing lines for electrically connecting the plurality of sensor electrodes included in the touch sensor layer 210 to the plurality of touch pads TP connected to the touch driving circuit 220.

Figure 3:
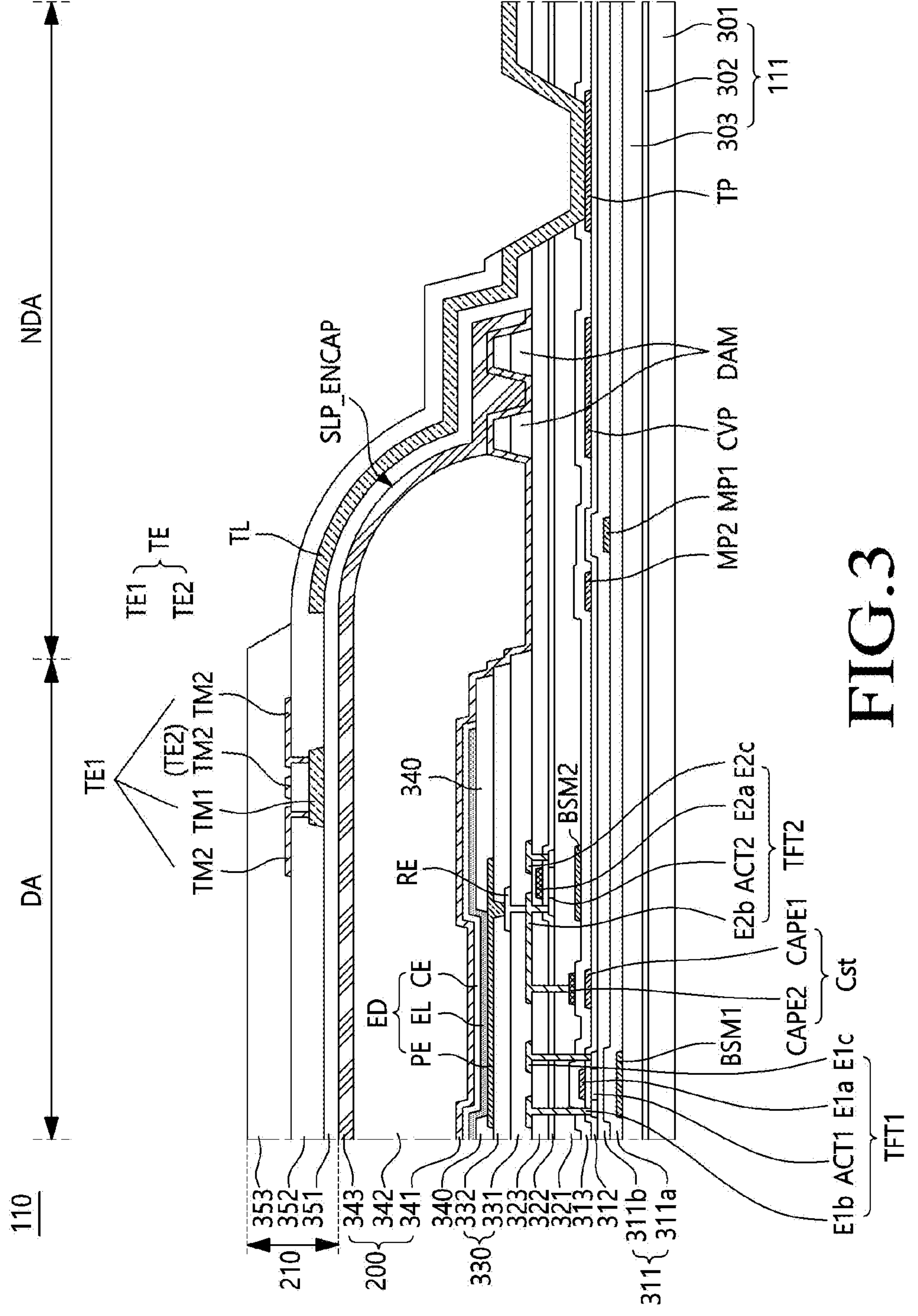
FIG. 3 is a cross-sectional view illustrating a display panel according to embodiments of the disclosure.

FIG. 3 is a cross-sectional view of a display panel 110 according to embodiments of the disclosure.

Referring to FIG. 3, the display panel 110 according to embodiments of the disclosure may include a transistor unit, a light emitting element unit, and an encapsulation unit, but embodiments of the disclosure are not limited thereto.

The substrate 111 may be a single layer or multiple layers. When the substrate 111 includes multiple layers, the substrate 111 may include a first substrate 301, an intermediate substrate layer (or intermediate layer) 302, and a second substrate 303. The intermediate substrate layer 302 may be positioned between the first substrate 301 and the second substrate 303. For example, each of the first substrate 301 and the second substrate 303 may be a polyimide (PI) layer, but embodiments of the disclosure are not limited thereto. The intermediate substrate layer 302 may be an inorganic insulation layer, but embodiments of the disclosure are not limited thereto. When an electric charge is charged to the first substrate PII which is a polyimide layer, the intermediate substrate layer 302 may prevent the electric charge from affecting transistors disposed on the second substrate 303 through the second substrate 303 which is a polyimide layer.

Further, the intermediate substrate layer 302 may prevent a moisture component from penetrating upward through the first substrate 301. For example, the intermediate substrate layer 302 may be formed of a single layer of silicon nitride (SiNx) or silicon oxide (SiOx) or multiple layers thereof, or may be formed of a double layer of silicon dioxide ($SiO_2$) and silicon nitride (SiNx), but is not limited thereto.

The transistor unit may include a substrate 111, an insulation layer 311, 312, 313, 321, 322, and 323 on the substrate 111, thin film transistors TFT1 and TFT2, a storage capacitor Cst, and various electrodes or signal lines.

The thin film transistors TFT1 and TFT2 included in the transistor unit may include a first thin film transistor TFT1 and a second thin film transistor TFT2.

The first thin film transistor TFT1 may include a first active layer ACT1, a first electrode Ela, a second electrode E1*b*, and a third electrode E1*c*.

The first electrode Ela may be a gate electrode, the second electrode E1*b* may be a source electrode or a drain electrode, and the third electrode E1*c* may be a drain electrode or a source electrode. Hereinafter, for convenience of description, the first electrode Ela is referred to as a first gate electrode Ela, the second electrode E1*b* is referred to as a first source electrode E1*b*, and the third electrode E1*c* is referred to as a first drain electrode E1*c*, but embodiments of the disclosure are not limited thereto. However, embodiments of the disclosure are not limited thereto.

The first active layer ACT1 may be a first semiconductor material, but embodiments of the disclosure are not limited thereto. For example, the first semiconductor material may include an oxide semiconductor, amorphous silicon, polysilicon, or low temperature polysilicon (LTPS), but embodiments of the disclosure are not limited thereto. The first thin film transistor TFT1 may be implemented as a p-channel transistor or an n-channel thin film transistor, but embodiments of the disclosure are not limited thereto.

The second thin film transistor TFT2 may include a second active layer ACT2, a fourth electrode E2*a*, a fifth electrode E2*b*, and a sixth electrode E2*c*.

The fourth electrode E2*a* may be a gate electrode, the fifth electrode E2*b* may be a source electrode or a drain electrode, and the sixth electrode E2*c* may be a drain electrode or a source electrode. Hereinafter, for convenience of description, the fourth electrode E2*a* is referred to as a second gate electrode E2*a*, the fifth electrode E2*b* is referred to as a second source electrode E2*b*, and the sixth electrode E2*c* is referred to as a second drain electrode E2*c*. However, embodiments of the disclosure are not limited thereto.

The second active layer ACT2 may include a second semiconductor material, but embodiments of the disclosure are not limited thereto. For example, the second semiconductor material may include an oxide semiconductor, amorphous silicon, polysilicon, or low temperature polysilicon (LTPS), but embodiments of the disclosure are not limited thereto. The second thin film transistor TFT2 may be implemented as a p-channel transistor or an n-channel thin film transistor, but embodiments of the disclosure are not limited thereto.

For example, one of the first active layer ACT1 of the first thin film transistor TFT1 and the second active layer ACT2 of the second thin film transistor TFT2 may include an oxide semiconductor material. As another example, one of the first active layer ACT1 of the first thin film transistor TFT1 and the second active layer ACT2 of the second thin film transistor TFT2 may include a low-temperature polysilicon semiconductor material. As another example, the first active layer ACT1 of the first thin film transistor TFT1 and the second active layer ACT2 of the second thin film transistor TFT2 may include an oxide semiconductor material. As another example, the first active layer ACT1 of the first thin film transistor TFT1 and the second active layer ACT2 of the second thin film transistor TFT2 may include a low-temperature polysilicon semiconductor material. As another example, of the first thin film transistor TFT1 and the second thin film transistor TFT2, the driving transistor DT may configure an oxide semiconductor as an active layer, and the scanning transistor ST may configure low-temperature polysilicon as an active layer. As another example, of the first thin film transistor TFT1 and the second thin film transistor TFT2, the driving transistor DT may configure low-temperature polysilicon as an active layer, and the scanning transistor ST may configure an oxide semiconductor as an active layer. As another example, a transistor included in a gate driving circuit 130 of a gate in panel (GIP) type may configure an oxide semiconductor or low-temperature polysilicon as an active layer. As another example, all the transistors configured on the substrate 111 and transistors included in a gate driving circuit 130 of a gate in panel (GIP) type may configure an oxide semiconductor as an active layer.

The second active layer ACT2 of the second thin film transistor TFT2 may be positioned higher from the substrate 111 than the first active layer ACT1 of the first thin film transistor TFT1.

The first buffer layer 311 may be disposed under the first active layer ACT1 of the first thin film transistor TFT1, and a second buffer layer 321 may be disposed under the second active layer ACT2 of the second thin film transistor TFT2. For example, the first active layer ACT1 of the first thin film transistor TFT1 may be positioned on the first buffer layer 311, and the second active layer ACT2 of the second thin film transistor TFT2 may be positioned on the second buffer layer 321. The second buffer layer 321 may be positioned higher than the first buffer layer 311.

The storage capacitor Cst may be disposed in various metal layers in the display panel 110. For example, the storage capacitor Cst may include a first capacitor electrode CAPE1 and a second capacitor CAPE2.

The light emitting element portion may include a plurality of light emitting elements ED disposed on the planarization layer 330. Each of the light emitting elements ED may include a pixel electrode PE, an intermediate layer EL, and a common electrode CE.

The encapsulation unit may include an encapsulation layer 200 on the plurality of light emitting elements ED. The encapsulation layer 200 may be a single layer or multiple layers, but embodiments of the disclosure are not limited thereto. The encapsulation portion may further include a dam DAM in addition to the encapsulation layer 200.

Hereinafter, a structure or a vertical structure of the display panel 110 according to embodiments of the disclosure is described in more detail with reference to FIG. 3.

Referring to FIG. 3, the first buffer layer 311 may be disposed on the substrate 111. The first buffer layer 311 may be a single layer or multiple layers, but embodiments of the disclosure are not limited thereto. When the first buffer layer 311 includes multiple layers, the first buffer layer 311 may include a lower buffer layer 311*a* and an upper buffer layer 311*b*.

The first active layer ACT1 of the first thin film transistor TFT1 may be disposed on the first buffer layer 311. The first active layer ACT1 may include a channel area in which a channel is formed, a source connection area on one side of the channel area, and a drain connection area on the other side of the channel area.

The first insulation layer 312 may be disposed on the first active layer ACT1 of the first thin film transistor TFT1. The first gate electrode Ela of the first thin film transistor TFT1 may be disposed on the first insulation layer 312. The second insulation layer 313 may be disposed on the first gate electrode Ela of the first thin film transistor TFT1. The first insulation layer 312 may be a gate insulation layer, but embodiments of the disclosure are not limited thereto. The second insulation layer 313 may be an interlayer insulation layer, but embodiments of the disclosure are not limited thereto.

The second buffer layer 321 may be disposed on the second insulation layer 313.

The second active layer ACT2 of the second thin film transistor TFT2 may be disposed on the second buffer layer 321. The second active layer ACT2 may include a channel area in which a channel is formed, a source connection area on one side of the channel area, and a drain connection area on the other side of the channel area.

The third insulation layer 322 may be disposed on the second active layer ACT2 of the second thin film transistor TFT2. The second gate electrode E2*a* of the second thin film transistor TFT2 may be disposed. The fourth insulation layer 323 may be disposed on the second gate electrode E2*a* of the second thin film transistor TFT2. The third insulation layer 322 may be a gate insulation layer, but embodiments of the disclosure are not limited thereto. The fourth insulation layer 323 may be an interlayer insulation layer, but embodiments of the disclosure are not limited thereto.

The first source electrode E1*b* and the first drain electrode E1*c* of the first thin film transistor TFT1, and the second source electrode E2*b* and the second drain electrode E2*c* of the second thin film transistor TFT2 may be disposed on the fourth insulation layer 323.

The first source electrode E1*b* and the first drain electrode E1*c* of the first thin film transistor TFT1 may be connected to the source connection area and the drain connection area, respectively, of the first active layer ACT1 through holes of the fourth insulation layer 323, the third insulation layer 322, the second buffer layer 321, the second insulation layer 313, and the first insulation layer 312.

The second source electrode E2*b* and the second drain electrode E2*c* of the second thin film transistor TFT2 may be connected to the source connection area and the drain connection area, respectively, of the second active layer ACT2 through the holes of the fourth insulation layer 323 and the third insulation layer 322.

The first source electrode E1*b* and the first drain electrode E1*c* of the first thin film transistor TFT1, and the second source electrode E2*b* and the second drain electrode E2*c* of the second thin film transistor TFT2 may include a first metal and may be disposed in the first metal layer. Here, the first metal and the first metal layer may be referred to as a first source-drain metal and a first source-drain metal layer.

Referring to FIG. 3, e.g., the storage capacitor Cst may be formed by a first capacitor electrode CAPE and a second capacitor electrode CAPE2. In some cases, the storage capacitor Cst may be formed by three or more capacitor electrodes, or may have a form in which two or more capacitors are connected in parallel.

Each of the first capacitor electrode CAPE1 and the second capacitor electrode CAPE2 may be disposed on various metal layers disposed in the display panel 110.

For example, the first capacitor electrode CAPE1 may include the same first gate metal as the first gate electrode Ela of the first thin film transistor TFT1 on the first insulation layer 312 and may be disposed in the first gate metal layer, but embodiments of the disclosure are not limited thereto. For example, the second capacitor electrode CAPE2 may be disposed on the second insulation layer 313.

The second source electrode E2*b* of the second thin film transistor TFT2 may be electrically connected to the second capacitor electrode CAPE2 through holes of the fourth insulation layer 323, the third insulation layer 322, and the second buffer layer 321.

For example, when the subpixel SP is configured as shown in FIG. 2, the first thin film transistor TFT1 may be the scanning transistor ST of FIG. 2, and the second thin film transistor TFT2 may be the driving transistor DT of FIG. 2.

The transistor unit may further include metal layers MP1 and MP2. For example, the first metal layer MP1 may be disposed between the lower buffer layer 311*a* and the upper buffer layer 311*b* included in the first buffer layer 311, but embodiments of the disclosure are not limited thereto. The second metal layer MP2 may include the same first gate metal as the first gate electrode Ela of the first thin film transistor TFT1, and may be disposed in the first gate metal layer, but embodiments of the disclosure are not limited thereto. The first metal layer MP1 may be a first metal pattern, and the second metal layer MP2 may be a second metal pattern, but embodiments of the disclosure are not limited thereto.

Each of the first metal layer MP1 and the second metal layer MP2 may be disposed in the display area DA or the non-display area NDA.

Referring to FIG. 3, the transistor unit may further include a first shield pattern BSM1 disposed on the substrate 111. The first shield pattern BSM1 may overlap the first active layer ACT1 of the first thin film transistor TFT1. The first shield pattern BSM1 may be disposed under the first active layer ACT1 of the first thin film transistor TFT1. For example, the first shield pattern BSM1 may be disposed between the substrate 111 and the first buffer layer 311, or may be disposed between the lower buffer layer 311*a* and the upper buffer layer 311*b*.

The transistor unit may further include a second shield pattern BSM2 disposed on the substrate 111. The second shield pattern BSM2 may overlap the second active layer ACT2 of the second thin film transistor TFT2. The second shield pattern BSM2 may be disposed under the second active layer ACT2 of the second thin film transistor TFT2. For example, the second shield pattern BSM2 may be disposed in a metal layer between the second insulation layer 313 and the second buffer layer 321. The second shield pattern BSM2 may be disposed in the same metal layer as the second capacitor CAPE2, but embodiments of the disclosure are not limited thereto. As another example, the second shield pattern BSM2 may be disposed in the same first gate metal layer as the first gate electrode Ela of the first thin film transistor TFT1.

Referring to FIG. 3, the transistor unit may further include a common driving signal layer CVP to which a common driving signal is applied. The common driving signal layer CVP may be disposed in the display area DA or the non-display area NDA.

For example, the common driving signal applied to a common driving signal layer CVP may also be referred to as a power signal and may include at least one of a driving voltage VDD and a base voltage VSS. The driving voltage VDD may be referred to as a high-potential driving voltage (a high-potential power supply voltage or a high-potential voltage), and the base voltage VSS may be referred to as a low-potential driving voltage (a low-potential power supply voltage or a low-potential voltage).

The planarization layer 330 may be disposed on the first thin film transistor TFT1 and the second thin film transistor TFT2, and may be disposed under the light emitting element ED. The planarization layer 330 may be an organic insulation layer including an organic insulating material.

For example, the planarization layer 330 may be constituted of one layer. As another example, the planarization layer 330 may include two layers. The planarization layer 330 may include a first planarization layer 331 and a second planarization layer 332. As another example, the planarization layer 330 may include three or more layers. Embodiments of the disclosure are not limited thereto.

Referring to FIG. 3, the first planarization layer 331 may be disposed on the first source electrode E1*b* and the first drain electrode E1*c* of the first thin film transistor TFT1, and the second source electrode E2*b* and the second drain electrode E2*c* of the second thin film transistor TFT2. For example, the first planarization layer 331 may be disposed on the first thin film transistor TFT1 and the second thin film transistor TFT2. For example, the first planarization layer 331 may be disposed while covering both the first thin film transistor TFT1 and the second thin film transistor TFT2.

Referring to FIG. 3, a connection electrode RE may be disposed on the first planarization layer 331. The connection electrode RE may electrically connect the second source electrode E2*b* of the second thin film transistor TFT2 and the pixel electrode PE.

The connection electrode RE may be electrically connected to the second source electrode E2*b* of the second thin film transistor TFT2 through the hole of the first planarization layer 331. The second source electrode E2*b* of the second thin film transistor TFT2 may be electrically connected to the second capacitor electrode CAPE2 of the storage capacitor Cst.

The connection electrode RE may be disposed in the second metal layer on the first planarization layer 331 and may include a second metal. The second metal and the second metal layer may be referred to as a second source-drain metal and a second source-drain metal layer.

The second planarization layer 332 may be disposed on the connection electrode RE.

Referring to FIG. 3, the light emitting element unit may be disposed on the second planarization layer 332. The light emitting element ED may be formed on the second planarization layer 332. The light emitting element ED may include a pixel electrode PE, an intermediate layer EL, and a common electrode CE. The emission area of the light emitting element ED may be formed in an area in which the pixel electrode PE, the intermediate layer EL, and the common electrode CE overlap and contact each other.

The pixel electrode PE may be disposed on the second planarization layer 332. The pixel electrode PE may be electrically connected to the connection electrode RE through the hole of the second planarization layer 332.

A bank 340 may be disposed on the pixel electrode PE. The opening of the bank 340 may expose a portion of the pixel electrode PE to form the emission area. The opening of the bank 340 may overlap a portion of the pixel electrode PE.

For example, the bank 340 may be formed of a material including a black pigment, or an organic material such as a benzocyclobutene resin, a polyimide resin, an acrylic resin, or a photosensitive polymer, but embodiments of the disclosure are not limited thereto. When the bank 340 is formed of a material including a black pigment, a black dye, or the like, it may be a black bank. When the bank 340 is formed of a material including a black pigment or a black dye, light from the outside may be blocked or light reflected from the outside may be blocked, and thus the luminance of the display device 100 may be further enhanced.

The intermediate layer EL of the light emitting element ED may be disposed on a portion of the pixel electrode PE and the bank 340. The common electrode CE may be disposed on the intermediate layer EL.

Referring to FIG. 3, the encapsulation unit may be disposed on the light emitting element unit and may be positioned on the common electrode CE. The encapsulation unit may include the encapsulation layer 200 formed on the common electrode CE.

The encapsulation layer 200 may prevent moisture or oxygen from penetrating into the light emitting element ED. For example, the encapsulation layer 200 may prevent moisture or oxygen from penetrating into the organic material included in the intermediate layer EL of the light emitting element ED. The encapsulation layer 200 may be formed of a single layer or multiple layers, but embodiments of the disclosure are not limited thereto.

For example, the encapsulation layer 200 may include a first encapsulation layer 341, a second encapsulation layer 342, and a third encapsulation layer 343, but embodiments of the disclosure are not limited thereto. For example, the first encapsulation layer 341 and the third encapsulation layer 343 may include an inorganic layer, and the second encapsulation layer 342 may include an organic layer, but embodiments of the disclosure are not limited thereto.

The display panel 110 according to embodiments of the disclosure may have a built-in touch sensor. In this case, the display panel 110 according to embodiments of the disclosure may include a touch sensor layer 210 formed on the encapsulation layer 200. The touch sensor layer 210 may be a touch unit.

Referring to FIG. 3, the touch sensor layer 210 may include a plurality of touch electrodes TE corresponding to touch sensors, and may include a touch metal layer on which a plurality of touch metals are disposed to form a plurality of touch electrodes TE.

For example, the touch metal layer may include a first touch metal layer on which a plurality of first touch metals TM1 are disposed, and a second touch metal layer on which a plurality of second touch metals TM2 are disposed. In this case, the touch sensor layer 210 may include a touch inter-layer insulation layer 352 between the first touch metal layer and the second touch metal layer.

One of the first touch metal layer and the second touch metal layer may be a sensor metal layer and the other may be a bridge metal layer.

For example, the first touch metal layer may be a bridge metal layer, and the second touch metal layer may be a sensor metal layer. In this case, the plurality of second touch metals TM2 disposed in the second touch metal layer may be sensor metals forming touch sensors, and the plurality of first touch metals TM1 disposed in the first touch metal layer may be bridge metals electrically connecting the plurality of second touch metals TM2, which are sensor metals.

As another example, the first touch metal layer may be a sensor metal layer, and the second touch metal layer may be a bridge metal layer. In this case, the plurality of first touch metals TM1 disposed in the first touch metal layer may be sensor metals forming touch sensors, and the plurality of second touch metals TM2 disposed in the second touch metal layer may be bridge metals electrically connecting the plurality of first touch metals TM1, which are sensor metals.

As another example, each of the first touch metal layer and the second touch metal layer may be a sensor metal layer and a bridge metal layer. For example, the first touch metal layer may be a sensor metal layer and a bridge metal layer, and the second touch metal layer may be a sensor metal layer and a bridge metal layer. In this case, the plurality of first touch metals TM1 disposed in the first touch metal layer may include sensor metals and bridge metals, and the plurality of second touch metals TM2 disposed in the second touch metal layer may include sensor metals and bridge metals.

The touch sensor layer 210 may include at least one insulation layer (or touch insulation layer).

For example, the touch sensor layer 210 may include an insulation layer 352 disposed between the first touch metal layer on which the plurality of first touch metals TM1 are disposed and the second touch metal layer on which the plurality of second touch metals TM2 are disposed. For example, the insulation layer 352 may be an inorganic layer including an inorganic insulating material or an organic layer including an organic insulating material.

As another example, the touch sensor layer 210 may further include a buffer layer (or touch buffer layer) 351 between the encapsulation layer 200 and the touch metal layer. The buffer layer 351 may be disposed between the encapsulation layer 200 and the first touch metal layer on which a plurality of first touch metals TM1 are disposed. Here, the buffer layer 351 may be omitted. For example, the buffer layer 351 may be an inorganic layer including an inorganic insulating material or an organic layer including an organic insulating material.

As another example, the sensor layer 210 may further include a protection layer (or touch protection layer) 353 on the touch metal layer. The protection layer 353 may be disposed on the first touch metal layer on which a plurality of second touch metals TM2 are disposed. For example, the protection layer 353 may be an inorganic layer including an inorganic insulating material or an organic layer including an organic insulating material. The protection layer 353 may extend to an upper portion of the touch line TL. The protection layer 353 may further extend to an upper portion of the touch pad TP.

Each of the plurality of touch electrodes TE may be formed of at least one second touch metal TM2. Each of the plurality of touch electrodes TE may be a mesh type electrode having a plurality of openings, but embodiments of the disclosure are not limited thereto.

For example, the plurality of touch electrodes TE may include a first touch electrode TE1 and a second touch electrode TE2. When the first touch metal layer is a bridge metal layer and the second touch metal layer is a sensor metal layer, two or more second touch metals TM2 forming the first touch electrode TE1 corresponding to the touch sensor may be electrically connected through the first touch metals TM1, which are bridge metals. For example, the second touch metals TM2 spaced apart from each other may be electrically connected by the first touch metal TM1 to constitute one first touch electrode TE1.

The plurality of first touch metals TM1 may be disposed on the buffer layer 351. The insulation layer 352 may be disposed on the plurality of first touch metals TM1. The plurality of second touch metals TM2 may be disposed on the insulation layer 352. Some of the plurality of second touch metals TM2 may be connected to the corresponding first touch metal TM1 through a hole in the insulation layer 352.

Referring to FIG. 3, the plurality of first touch metals TM1 and the plurality of second touch metals TM2 may be disposed not to overlap the light emitting element ED. The plurality of first touch metals TM1 and the plurality of second touch metals TM2 may overlap the bank 340.

The protection layer 353 may be disposed on the touch metal layer. The protection layer 353 may be disposed while covering the plurality of touch metals TM1 and TM2 disposed in the touch metal layer.

Referring to FIG. 3, the touch line TL may electrically connect the touch electrode TE and the touch pad TP. The touch line TL may be formed of at least one of the first touch metal TM1 and the second touch metal TM2. For example, the touch line TL may be configured in at least one of the first touch metal layer and the second touch metal layer. However, embodiments of the disclosure are not limited thereto.

The touch line TL may be formed of a first touch metal TM1, the touch line TL may be formed of a second touch metal TM2 or formed of a first touch metal TM1 and a second touch metal TM2. When one touch line TL is formed of the first touch metal TM1 and the second touch metal TM2, the first touch metal TM1 and the second touch metal TM2 constituting one touch line TL may be electrically connected through the hole in the insulation layer 352.

When the display panel 110 is of a type in which a touch sensor is embedded, the touch line TL may extend along the outer inclined surface SLP_ENCAP of the encapsulation layer 200, and may extend beyond the upper portion of at least one dam DAM to the touch pad TP in the non-display area NDA.

Figure 4:
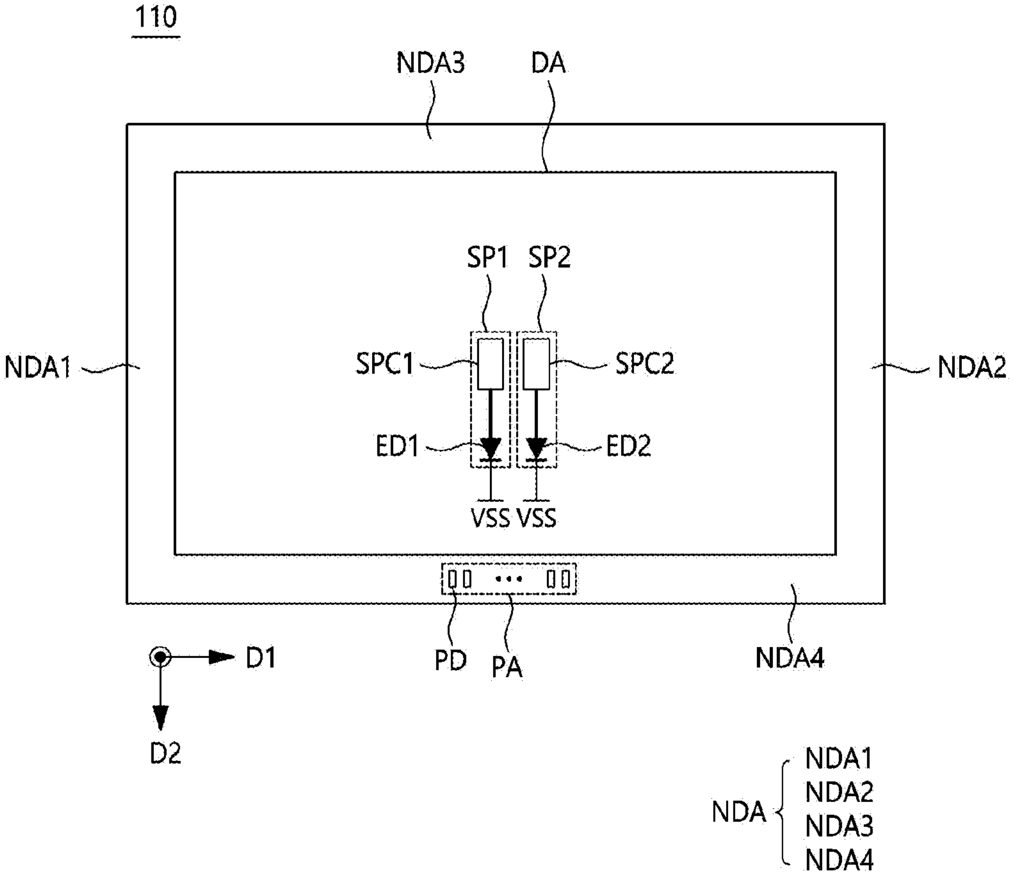
FIG. 4 is a plan view illustrating a display panel according to embodiments of the disclosure.

FIG. 4 is a plan view of a display panel 110 according to embodiments of the disclosure.

Referring to FIG. 4, the display panel 110 according to embodiments of the disclosure may include a display area DA in which an image is displayed and a non-display area NDA in which an image is not displayed.

The non-display area NDA may include a first non-display area NDA1, a second non-display area NDA2, a third non-display area NDA3, and a fourth non-display area NDA4.

For example, the first non-display area NDA1 may be positioned outside the display area DA in the first direction D1. The second non-display area NDA2 may be positioned outside the display area DA in the first direction D1 and opposite to the first non-display area NDA1. The third non-display area NDA3 may be positioned outside the display area DA in the second direction D2. The fourth non-display area NDA4 may be positioned outside the display area DA in the second direction D2 and opposite to the third non-display area NDA3. For example, the first direction D1 may be a row direction and the second direction D2 may be a column direction. As another example, the first direction D1 may be a column direction and the second direction D2 may be a row direction.

For example, the fourth non-display area NDA4 among the first to fourth non-display areas NDA1, NDA2, NDA3, and NDA4 may include a pad area PA. The pad area PA is an area for connecting or bonding (or attaching) a driving circuit, and have a plurality of pads PD disposed therein.

Referring to FIG. 4, a plurality of subpixels SP disposed in the display area DA may include a first subpixel SP1 and a second subpixel SP2.

The first subpixel SP1 and the second subpixel SP2 may be disposed adjacent to each other. This may mean that the first subpixel SP1 and the second subpixel SP2 are successively arranged. When the first subpixel SP1 and the second subpixel SP2 are successively arranged, no subpixel may be disposed between the first subpixel SP1 and the second subpixel SP2.

When the first subpixel SP1 and the second subpixel SP2 are disposed adjacent to each other, the first light emitting element ED1 of the first subpixel SP1 and the second light emitting element ED2 of the second subpixel SP2 may be disposed adjacent to each other. That the first light emitting element ED1 of the first subpixel SP1 and the second light emitting element ED2 of the second subpixel SP2 are adjacent to each other may mean that the first light emitting element ED1 of the first subpixel SP1 and the second light emitting element ED2 of the second subpixel SP2 are successively arranged.

Further, when the first subpixel SP1 and the second subpixel SP2 are disposed adjacent to each other, the first subpixel circuit SPC1 of the first subpixel SP1 and the second subpixel circuit SPC2 of the second subpixel SP2 may also be disposed adjacent to each other.

For example, as shown in FIG. 4, the first subpixel SP1 and the second subpixel SP2 may be disposed adjacent to each other in the first direction D1. For example, the first subpixel SP1 and the second subpixel SP2 may be successively arranged in the first direction D1.

As another example, the first subpixel SP1 and the second subpixel SP2 may be disposed adjacent to each other in the second direction D2. For example, the first subpixel SP1 and the second subpixel SP2 may be successively arranged in the second direction D2.

Referring to FIG. 4, the first subpixel SP1 may include a first light emitting element ED1 and a first subpixel circuit SPC1 configured to drive the first light emitting element ED1. The first subpixel circuit SPC1 may be disposed adjacent to the first light emitting element ED1, and may include at least one transistor and at least one storage capacitor.

The second subpixel SP2 may include a second light emitting element ED2 and a second subpixel circuit SPC2 configured to drive the second light emitting element ED2. The second subpixel circuit SPC2 is disposed adjacent to the second light emitting element ED2, and may include at least one transistor and at least one storage capacitor.

For example, each of the first subpixel circuit SPC1 and the second subpixel circuit SPC2 may include two transistors and one storage capacitor (see FIG. 2). As another example, each of the first subpixel circuit SPC1 and the second subpixel circuit SPC2 may include eight transistors and one storage capacitor (see FIG. 9). However, the structure of each of the first subpixel circuit SPC1 and the second subpixel circuit SPC2 is not limited thereto.

Referring to FIG. 4, when a defect occurs in the first subpixel circuit SPC1 of the respective first subpixel circuit SPC1 and the second subpixel circuit SPC2 of the first subpixel SP1 and the second subpixel SP2, the first light emitting element ED1 may not emit light or may emit light too brightly (or with unwanted brightness). For example, a defect in the first subpixel circuit SPC1 may be a case where various metal patterns or lines included or connected to the first subpixel circuit SPC1 are broken or opened, or two or more of the source node, drain node, and gate node of at least one transistor in the first subpixel circuit SPC1 are shorted, but is not limited thereto.

Referring to FIG. 4, when a defect occurs in the second subpixel circuit SPC2 of the first subpixel circuit SPC1 and the respective second subpixel circuit SPC2 of the first subpixel SP1 and the second subpixel SP2, the second light emitting element ED2 may not emit light or may emit light too brightly (or with unwanted brightness). For example, a defect in the second subpixel circuit SPC2 may be a case where various metal patterns or lines included or connected to the second subpixel circuit SPC2 are broken or opened, or two or more of the source node, drain node, and gate node of at least one transistor in the second subpixel circuit SPC2 are shorted, but is not limited thereto.

Further, referring to FIG. 4, when a defect occurs in both the respective first subpixel circuit SPC1 and the second subpixel circuit SPC2 of the first and second subpixels SP1 and SP2, both the first and second light emitting elements ED1 may not emit light or may emit light too brightly (with unwanted brightness).

For example, a defect in the first subpixel circuit SPC1 may be a case where various metal patterns or lines included or connected to the first subpixel circuit SPC1 are broken or opened, or two or more of the source node, drain node, and gate node of at least one transistor in the first subpixel circuit SPC1 are shorted, but is not limited thereto. A defect in the second subpixel circuit SPC2 may be a case where various metal patterns or lines included or connected to the second subpixel circuit SPC2 are broken or opened, or two or more of the source node, drain node, and gate node of at least one transistor in the second subpixel circuit SPC2 are shorted, but is not limited thereto.

When a defect occurs in one of the successively arranged first subpixels SP1 and the second subpixel SP2, so that one of the successively arranged first light emitting elements ED1 and ED2 does not emit light o emits light too brightly (or with unwanted brightness), the area in which one of the first light emitting elements ED1 and ED2 is disposed may be seen as a bright spot or a dark spot. Hereinafter, such a defect is referred to as "one-point defect."

When two or more subpixels SP including the first subpixel SP1 and the second subpixel SP2 are successively arranged, if a defect occurs in all of the respective subpixel circuits SPC2 of the two or more subpixels successively arranged, so that none of the two or more light emitting elements ED successively arranged emit light or emit light too brightly (or with unwanted brightness), the area in which two or more light emitting elements ED are disposed may be seen as a large bright spot or a large dark spot that may be easily recognized with the naked eye. Such a defect is referred to as a "successive defect (or connection defect)."

The successive defects may include, e.g., two-point successive defect that occurs in two subpixels SP1 and SP2 successively arranged. In the case of a two-point successive defect, as defects occur in both the first subpixel circuit SPC1 of the first subpixel SP1 and the second subpixel circuit SPC2 of the second subpixel SP2 when the first subpixel SP1 and the second subpixel SP2 are successively arranged, so that neither of the first light emitting element ED1 and the second light emitting element ED2 successively arranged emits light or they emit light too bright (or with an unwanted luminance), the area where the first light emitting element ED1 and the second light emitting element ED2 are disposed may be seen as a large bright spot or a large dark spot that may easily be recognized with the naked eye.

Accordingly, the display device 100 according to embodiments of the disclosure may disclose a repair structure for a one-point defect or a two-point connection defect. Hereinafter, a repair structure for a one-point defect or a successive defect included in the display device 100 according to embodiments of the disclosure is described. As the repair structure for successive defects, a repair structure for two-point successive defects is described as an example.

Figure 5:
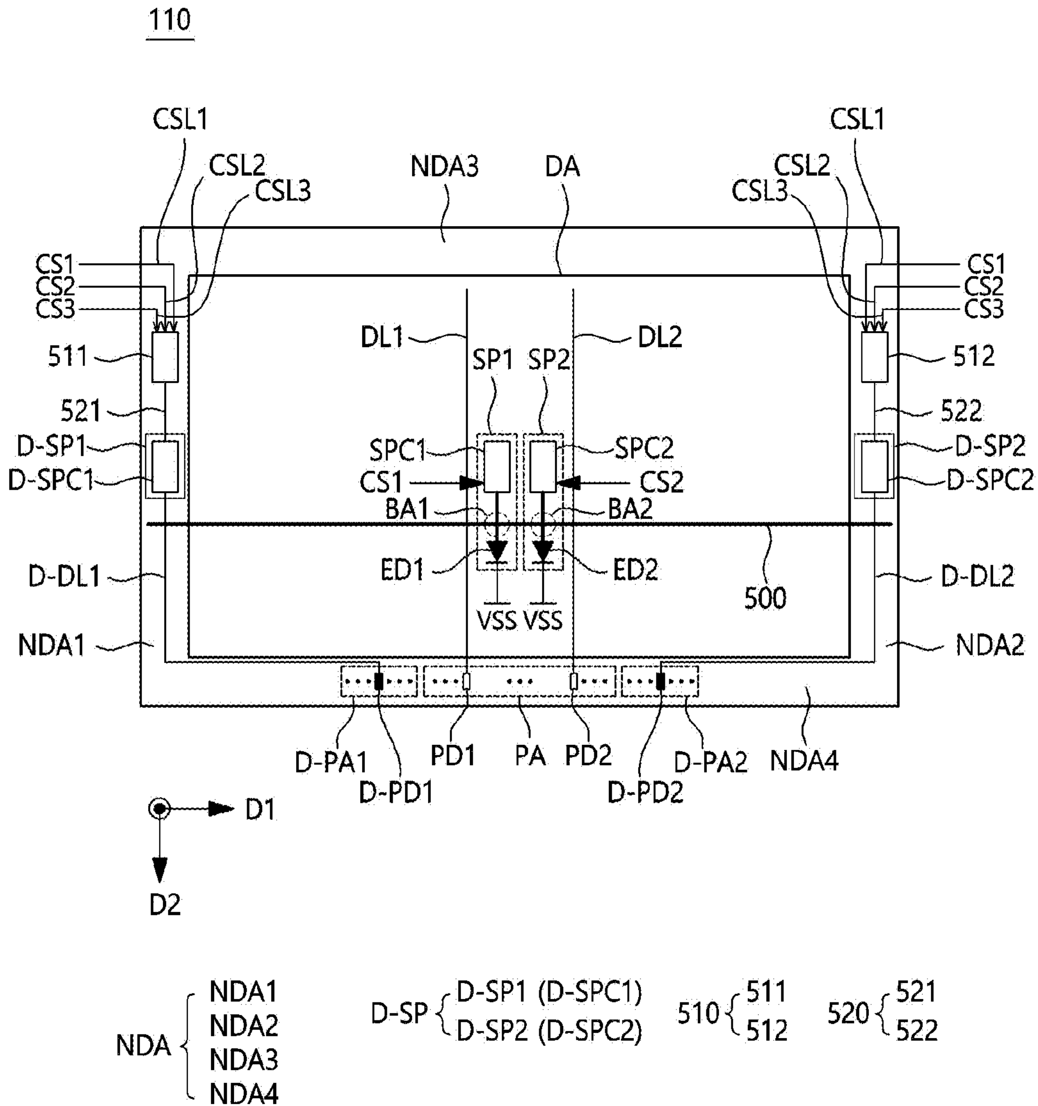
FIG. 5 illustrates a repair structure of a display panel according to embodiments of the disclosure.

FIG. 5 illustrates a repair structure of a display panel 110 according to embodiments of the disclosure.

Referring to FIG. 5, the display panel 110 according to embodiments of the disclosure may include a first subpixel SP1 and a second subpixel SP2. The first subpixel SP1 may be disposed in the display area DA, and may include a first subpixel circuit SPC1 to which a first common signal CS1 among a plurality of common signals CS1, CS2, and CS3 is applied, and a first light emitting element ED1 adjacent to the first subpixel circuit SPC1. The second subpixel SP2 is disposed in the display area DA, and may include a second subpixel circuit SPC2 to which a second common signal CS2 among the plurality of common signals CS1, CS2, and CS3 is applied, and a second light emitting element ED2 adjacent to the second subpixel circuit SPC2.

The plurality of common signals CS1, CS2, and CS3 according to embodiments of the disclosure may all be substantially the same type of signals having substantially the same role. The plurality of common signals CS1, CS2, and CS3 may be one of common driving signals commonly required for driving the plurality of subpixels SP. For example, the plurality of common signals CS1, CS2, and CS3 may be reset voltages for resetting the voltage of the pixel electrode PE of the light emitting element ED of each of the plurality of subpixels SP or the node electrically connected thereto at a predefined driving timing.

The plurality of common signals CS1, CS2, and CS3 according to embodiments of the disclosure may be signals applied to predefined nodes in the plurality of subpixels SP at a predefined driving timing. For example, the plurality of common signals CS1, CS2, and CS3 may be signals applied to the pixel electrode PE of the light emitting element ED of each of the plurality of subpixels SP or the node electrically connected thereto.

All of the plurality of common signals CS1, CS2, and CS3 according to embodiments of the disclosure may have substantially the same voltage value, and at least one of the plurality of common signals CS1, CS2, and CS3 may have a different voltage value from the rest.

Referring to FIG. 5, the first subpixel SP1 and the second subpixel SP2 may be disposed adjacent to each other in the first direction D1. For example, the first subpixel SP1 and the second subpixel SP2 may be successively arranged in the first direction D1. In this case, the first light emitting element ED1 and the second light emitting element ED2 may be successively arranged in the first direction D1. Here, the first direction D1 may be a row direction or a column direction.

When the first light emitting element ED1 and the second light emitting element ED2 are successively arranged, the first light emitting element ED1 may emit light having a first wavelength, and the second light emitting element ED2 may emit light having a second wavelength different from the first wavelength.

The light of the first wavelength may be referred to as first color light, and the light of the second wavelength may be referred to as second color light. For example, the light of the first wavelength and the light of the second wavelength may be two of red light, green light, and blue light. For example, the light of the first wavelength and the light of the second wavelength may be red light and green light. The light of the first wavelength and the light of the second wavelength may be green light and blue light. The light of the first wavelength and the light of the second wavelength may be red light and blue light.

Referring to FIG. 5, the repair structure included in the display panel 110 according to embodiments of the disclosure may include a plurality of dummy subpixels D-SP, a plurality of dummy connection control lines 500, a plurality of dummy signal lines 520, or the like.

The plurality of dummy subpixels D-SP may include a first dummy subpixel D-SP1 and a second dummy subpixel D-SP2. The plurality of dummy signal lines 520 may include a first dummy signal line 521 and a second dummy signal line 522.

Referring to FIG. 5, the repair structure included in the display panel 110 according to embodiments of the disclosure may further include a plurality of signal supply units 510. The plurality of signal supply units 510 may include a first signal supply unit 511 and a second signal supply unit 512.

Referring to FIG. 5, a repair structure for a one-point defect may include a first dummy subpixel D-SP1, a first dummy signal line 521, and a dummy connection control line 500.

The first dummy subpixel D-SP1 may be disposed in the non-display area NDA and may include a first dummy subpixel circuit D-SPC1. The first dummy subpixel D-SP1 may not include the light emitting element ED. The first dummy subpixel circuit D-SPC1 may be a circuit capable of driving the first light emitting element ED1 in place of the first subpixel circuit SPC1 when a defect occurs in the first subpixel circuit SPC1. For instance, when a defect occurs in the first subpixel circuit SPC1 preventing the light-emitting element ED from operating normally, the dummy connection control line 500 is configured to electrically connect the light-emitting element to the first dummy subpixel circuit D-SPC1. The details will be further elaborated below with reference to the accompanying figures.

The first dummy subpixel circuit D-SPC1 may be the same as the first subpixel circuit SPC1 or may be different from the first subpixel circuit SPC1.

The first dummy signal line 521 may be disposed in the non-display area NDA and may be connected to the first dummy subpixel circuit D-SPC1.

The dummy connection control line 500 may be disposed in (across or over) the display area DA and the non-display area NDA, and may be disposed adjacent to the first dummy subpixel circuit D-SPC1, the first subpixel circuit SPC1, and the second subpixel circuit SPC2. Here, the dummy connection control line 500 is a line used after the repair process and may also be referred to as a repair line.

The dummy connection control line 500 may be disposed while extending through the first area BA1 between the first subpixel circuit SPC1 and the first light emitting element ED1 and the second area BA2 between the second subpixel circuit SPC2 and the second light emitting element ED2.

The dummy connection control line 500 may be disposed in a metal layer different from the metal layer on which the first pixel electrode PE of the first light emitting element ED1 and the second pixel electrode PE2 of the second light emitting element ED2 are disposed.

For example, the dummy connection control line 500 may be disposed in a metal layer positioned under the metal layer on which the first pixel electrode PE of the first light emitting element ED1 and the second pixel electrode PE2 of the second light emitting element ED2 are disposed.

For example, the metal layer on which the first pixel electrode PE of the first light emitting element ED1 and the second pixel electrode PE2 of the second light emitting element ED2 are disposed may be a metal layer on which the pixel electrode PE of FIG. 3 is disposed.

For example, the metal layer on which the dummy connection control line 500 is disposed may be at least one of the second source-drain metal layer, the second gate metal layer, the first gate metal layer, the first shield metal layer, and the second shield metal layer in FIG. 3, but is not limited thereto.

For example, the second source-drain metal layer may be a metal layer on which the connection electrode RE of FIG. 3 is disposed. The second gate metal layer may be a metal layer on which the gate electrode E2*a* of the second thin film transistor TFT2 of FIG. 3 is disposed. The first source-drain metal layer may be a metal layer in which the source/drain electrodes E1*b*, E1*c*, E2*b* and E2*c* of the first and second thin film transistors TFT1 and TFT2 of FIG. 3 are disposed. The first gate metal layer may be a metal layer on which the gate electrode Ela of the first thin film transistor TFT1 of FIG. 3 is disposed. The first shield metal layer may be a metal layer on which the first shield pattern BSM1 of FIG. 3 is disposed. The second shield metal layer may be a metal layer on which the second shield pattern BSM2 of FIG. 3 is disposed.

Referring to FIG. 5, the display panel 110 according to embodiments of the disclosure may include a repair structure for a two-point defect. The repair structure for the two-point defect may include a repair structure for a one-point defect.

Referring to FIG. 5, the repair structure for the two-point defect may further include a second dummy subpixel D-SP2 and a second dummy signal line 522 together with the first dummy subpixel D-SP1, the first dummy signal line 521, and the dummy connection control line 500.

The second dummy subpixel D-SP2 is disposed in the non-display area NDA and may include a second dummy subpixel circuit D-SPC2.

The second dummy subpixel D-SP2 may not include the light emitting element ED.

The second dummy subpixel circuit D-SPC2 may be a circuit capable of driving the second light emitting element ED2 in place of the second subpixel circuit SPC2 when a defect occurs in the second subpixel circuit SPC2.

The second dummy subpixel circuit D-SPC2 may be the same as the second subpixel circuit SPC2 or may be different from the second subpixel circuit SPC2.

The second dummy signal line 522 may be disposed in the non-display area NDA and may be connected to the second dummy subpixel circuit D-SPC2.

The dummy connection control line 500 may be disposed across (in or over) the display area DA and the non-display area NDA, and may be disposed adjacent to the first dummy subpixel circuit D-SPC1, the first subpixel circuit SPC1, the second subpixel circuit SPC2, and the second dummy subpixel circuit D-SPC2.

Referring to FIG. 5, the non-display area NDA may include a first non-display area NDA1 positioned on one side of the display area DA and a second non-display area NDA2 positioned on the other side of the display area DA.

The first dummy subpixel D-SP1 and the first dummy signal line 521 may be disposed in the first non-display area NDA1, and the second dummy subpixel D-SP2 and the second dummy signal line 522 may be disposed in the second non-display area NDA2. However, the disclosure is not limited thereto.

Referring to FIG. 5, a display panel 110 according to embodiments of the disclosure may include a first data line DL1 connected to a first subpixel circuit SPC1, a second data line DL2 connected to a second subpixel circuit SPC2, a first pad PD1 connected to the first data line DL1, and a second pad PD2 connected to the second data line DL2.

Referring to FIG. 5, the first dummy subpixel circuit D-SPC1 should receive a first data voltage required to enable the first light emitting element ED1 to normally emit light in order to drive the first light emitting element ED1 in place of the first subpixel circuit SPC1. Further, the second dummy subpixel circuit D-SPC2 should receive a second data voltage required to enable the second light emitting element ED2 to normally emit light in order to drive the second light emitting element ED2 on behalf of the second subpixel circuit SPC2.

To that end, the display panel 110 according to embodiments of the disclosure may further include a first dummy data line D-DL1 connected to the first dummy subpixel circuit D-SPC1, a second dummy data line D-DL2 connected to the second dummy subpixel circuit D-SPC2, a first dummy pad D-PD1 connected to the first dummy data line D-DL1, and a second dummy pad D-PD2 connected to the second dummy data line D-DL2.

Referring to FIG. 5, the non-display area NDA of the display panel 110 may include a pad area PA. The first pad PD1 and the second pad PD2 may be disposed in the pad area PA in the non-display area NDA.

The non-display area NDA of the display panel 110 may include a first dummy pad area D-PA1 positioned on one side of the pad area PA and a second dummy pad area D-PA2 positioned on the other side of the pad area PA.

The first dummy pad D-PD1 may be positioned on one side of the pad area PA and may be disposed in the first dummy pad area D-PA1. The second dummy pad D-PD2 may be positioned on the other side of the pad area PA and may be disposed in the second dummy pad area D-PA2.

Referring to FIG. 5, when a defect has not occurred in the first subpixel circuit SPC1 or a repair process for defects in the first subpixel circuit SPC1 has not been performed, the first subpixel circuit SPC1 and the first light emitting element ED1 may be in a connected state, the first light emitting element ED1 and the dummy connection control line 500 may be in a disconnected state, and the dummy connection control line 500 and the first dummy subpixel circuit D-SPC1 may be in a disconnected state.

Further, when a defect has not occurred in the second subpixel circuit SPC2 or a repair process for defects in the second subpixel circuit SPC2 has not been performed, the second subpixel circuit SPC2 and the second light emitting element ED2 may be connected, the second light emitting element ED2 and the dummy connection control line 500 may be disconnected, and the dummy connection control line 500 and the second dummy subpixel circuit D-SPC2 may be disconnected.

When a defect occurs in neither the first subpixel circuit SPC1 nor the second subpixel circuit SPC2, the dummy connection control line 500 may not be disconnected from the first non-display area NDA1 to the second non-display area NDA2.

If it is identified that a defect has occurred in the first subpixel circuit SPC1, and a repair process for defects of the first subpixel circuit SPC1 is thus performed, the connection between the first subpixel circuit SPC1 and the first light emitting element ED1 is in a disconnected state, the first light emitting element ED1 and the dummy connection control line 500 are in a state of being connected to each other, and the dummy connection control line 500 and the first dummy subpixel circuit D-SPC1 may be in a state of being connected to each other.

If it is identified that a defect has occurred in the second subpixel circuit SPC2, and a repair process for defects in the second subpixel circuit SPC2 is thus performed, the connection between the second subpixel circuit SPC2 and the second light emitting element ED2 may be disconnected, the second light emitting element ED2 and the dummy connection control line 500 may be connected to each other, and the dummy connection control line 500 and the second dummy subpixel circuit D-SPC2 may be connected to each other.

Referring to FIG. 5, the display device 100 according to embodiments of the disclosure may further include a signal supply unit 510 included in the repair structure for a defect in the first subpixel circuit SPC1. The signal supply unit 510 may include a first signal supply unit 511 and a second signal supply unit 512 included in the repair structure for a defect in the second subpixel circuit SPC2.

The first signal supply unit 511 may be connected to a plurality of common signal lines CSL1, CSL2, and CSL3 to which a plurality of common signals CS1, CS2, and CS3 are input, and may be connected to a first dummy signal line 521 connected to the first dummy subpixel circuit SPC1.

Before the repair process for defects in the first subpixel circuit SPC1 is performed, the first signal supply unit 511 may have a structure in which one (e.g., the first common signal CS1) of the plurality of common signals CS1, CS2, and CS3 is not output to the first dummy signal line 521. For example, before the repair process for defects in the first subpixel circuit SPC1 is performed, none of the plurality of common signal lines CSL1, CSL2, and CSL3 may be connected to the first dummy signal line 521 in the first signal supply unit 511.

After the repair process for defects in the first subpixel circuit SPC1 is performed, the first signal supply unit 511 may have a structure in which one (e.g., the first common signal CS1) of the plurality of common signals CS1, CS2, and CS3 is output to the first dummy signal line 521. For example, after the repair process for defects in the first subpixel circuit (SPC1) is performed, the first common signal line (CSL1) among the plurality of common signal lines (CSL1, CSL2, and CSL3) may be connected to the first dummy signal line (521).

The second signal supply unit 512 may be connected to the plurality of common signal lines CSL1, CSL2, and CSL3 to which the plurality of common signals CS1, CS2, and CS3 are input, and may be connected to the second dummy signal line 522 connected to the second dummy subpixel circuit SPC2.

After the repair process for defects in the second subpixel circuit SPC2 is performed, the second signal supply unit 512 may have a structure in which one (e.g., the second common signal CS2) of the plurality of common signals CS1, CS2, and CS3 is not output to the second dummy signal line 522. For example, before the repair process for defects in the second subpixel circuit SPC2 is performed, in the second signal supply unit 512, none of the plurality of common signal lines CSL1, CSL2, and CSL3 may be connected to the second dummy signal line 522.

After the repair process for defects in the second subpixel circuit SPC2 is performed, the second signal supply unit 511 may have a structure in which one (e.g., the second common signal CS2) of the plurality of common signals CS1, CS2, and CS3 is output to the second dummy signal line 522. For example, after the repair process for defects in the second subpixel circuit SPC2 is performed, in the second signal supply unit 512, the second common signal line CSL2 of the plurality of common signal lines CSL1, CSL2, and CSL3 may be connected to the second dummy signal line 522.

Hereinafter, the display panel 110 on which a repair process has been performed when a defect occurs in the first subpixel circuit SPC1 and/or the second subpixel circuit SPC2 is described in more detail with reference to FIG. 6.

Figure 6:
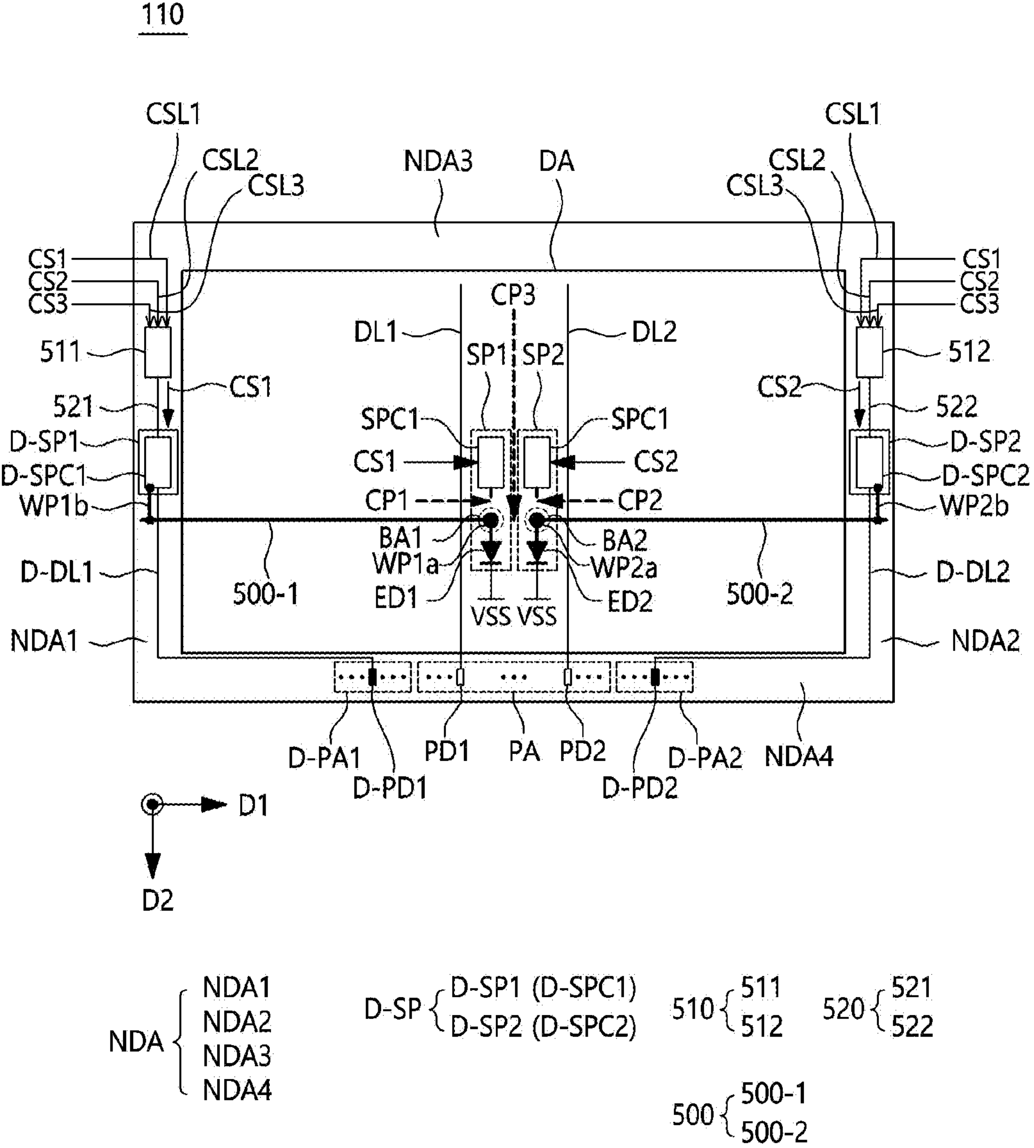
FIG. 6 illustrates a state of a display panel after a repair process according to embodiments of the disclosure.

FIG. 6 illustrates a state of a display panel 110 after a repair process according to embodiments of the disclosure.

Referring to FIG. 6, the repair process for defects in the first subpixel circuit SPC1 may include a first cutting process of cutting a first cutting point CP1 corresponding to a connection point between the first subpixel circuit SPC1 and the first light emitting element ED1, a first welding process of welding a first welding point WP1*a* to connect the first light emitting element ED1 and the dummy connection control line 500, and a second welding process of welding a second welding point WP1*b* to connect the dummy connection control line 500 and the first dummy subpixel circuit D-SPC1.

Referring to FIG. 6, the repair process for defects in the second subpixel circuit SPC2 may include a second cutting process of cutting a second cutting point CP2 corresponding to a connection point between the second subpixel circuit SPC2 and the second light emitting element ED2, a third welding process of welding a third welding point WP2*a* to connect the second light emitting element ED2 and the dummy connection control line 500, and a fourth welding process of welding a fourth welding point WP2*b* to connect the dummy connection control line 500 and the second dummy subpixel circuit D-SPC2.

Referring to FIG. 6, when a repair process for defects in the first subpixel circuit SPC1 and a repair process for defects in the second subpixel circuit SPC2 both are performed as defects occur in both the first subpixel circuit SPC1 and the second subpixel circuit SPC2, e.g., a two-point successive defect occurs, the repair process for the two-point successive defect may include a repair process (first cutting process, first welding process, and second welding process) for defects in the first subpixel circuit SPC1 and a repair process (second cutting process, third welding process, and fourth welding process) for defects in the second subpixel circuit SPC2.

Referring to FIG. 6, the repair process of the two-point successive defect may further include a third cutting process of cutting a third cutting point CP3, which is a point positioned between the first area BA1 and the second area BA2 in the dummy connection control line 500.

Hereinafter, a state of the display panel 110 where the repair process has been performed is described.

The dummy connection control line 500, which is a component of the repair structure, may be disposed while extending through the first area BA1 between the first subpixel circuit SPC1 and the first light emitting element ED1 and the second area BA2 between the second subpixel circuit SPC2 and the second light emitting element ED2.

First, after the repair process of defects in the first subpixel circuit SPC1 is performed, the state of the display panel 110 is as follows.

According to the first cutting process at the first cutting point CP1, the connection between the first subpixel circuit SPC1 and the first light emitting element ED1 may be broken. In this case, the dummy connection control line 500 and the first light emitting element ED1 may be connected at the first welding point WP1*a* in the first area BA1, and the first dummy subpixel circuit D-SPC1 and the dummy connection control line 500 may be connected at the second welding point WP1*b*.

After the repair process for defects in the first subpixel circuit SPC1 is performed, the first signal supply unit 511 may have a structure in which the first common signal CS1 among the plurality of common signals CS1, CS2, and CS3 is output to the first dummy signal line 521. For example, after the repair process for defects in the first subpixel circuit (SPC1) is performed, the first common signal line (CSL1) among the plurality of common signal lines (CSL1, CSL2, and CSL3) may be connected to the first dummy signal line (521).

Accordingly, the first common signal CS1 among the plurality of common signals CS1, CS2, and CS3 may be applied to the first dummy signal line 521, and the first common signal CS1 applied to the first dummy signal line 521 may be supplied to the first dummy subpixel circuit SPC1.

The display device 100 according to embodiments of the disclosure may further include a first data line DL1 connected to the first subpixel circuit SPC1, a first pad PD1 connected to the first data line DL1, a first dummy data line D-DL1 connected to the first dummy subpixel circuit D-SPC1, and a first dummy pad D-PD1 connected to the first dummy data line D-DL1.

For example, both before and after the repair process for defects in the first subpixel circuit SPC1 is performed, the first pad PD1 and the first dummy pad D-PD1 may be not electrically connected. In this case, the data driving circuit 120 may directly output the first data voltage to the first pad PD1 before the repair process, and may directly output the first data voltage to the first dummy pad D-PD1 after the repair process.

As another example, both before and after the repair process for defects in the first subpixel circuit SPC1 is performed, the first pad PD1 and the first dummy pad D-PD1 may be electrically connected. In this case, both before and after the repair process, the data driving circuit 120 may output the first data voltage to the first pad PD1. In this case, the first data voltage input to the first pad PD1 may be transferred to the first dummy pad D-PD1.

After the repair process for defects in the first subpixel circuit SPC1 is performed, when the connection between the first subpixel circuit SPC1 and the first light emitting element ED1 is broken, a first data voltage for enabling the first light emitting element ED1 to emit light with a desired first luminance may be applied to the first dummy subpixel circuit D-SPC1 through the first dummy data line D-DL1.

As described above, the first dummy subpixel circuit D-SPC1 may be driven by receiving each of the first common signal CS1 and the first data voltage at a predefined timing to supply a driving current to the first light emitting element ED1 in the display area DA through the dummy connection control line 500. Accordingly, the first light emitting element ED1 may normally emit light. This may mean that the first subpixel SP1 has been normalized even though a defect in the first subpixel circuit SPC1 has occurred.

Next, after the repair process for defects in the second subpixel circuit SPC2 is performed, the state of the display panel 110 is as follows.

According to the second cutting process at the second cutting point CP2, the connection between the second subpixel circuit SPC2 and the second light emitting element ED2 may be broken. In this case, the dummy connection control line 500 and the second light emitting element ED2 may be connected at the third welding point WP2*a* in the second area BA2, and the second dummy subpixel circuit D-SPC2 and the dummy connection control line 500 may be connected at the fourth welding point WP2*b*.

After the repair process for defects in the second subpixel circuit SPC2 is performed, the second signal supply unit 512 may have a structure in which the second common signal CS2 among the plurality of common signals CS1, CS2, and CS3 is output to the second dummy signal line 522. For example, after the repair process for defects in the second subpixel circuit SPC2 is performed, in the second signal supply unit 512, the second common signal line CSL2 of the plurality of common signal lines CSL1, CSL2, and CSL3 may be connected to the second dummy signal line 522.

Accordingly, the second common signal CS2 among the plurality of common signals CS1, CS2, and CS3 may be applied to the second dummy signal line 522, and the second common signal CS2 applied to the second dummy signal line 522 may be supplied to the second dummy subpixel circuit SPC2.

The display device 100 according to embodiments of the disclosure may further include a second data line DL2 connected to the second subpixel circuit SPC2, a second pad PD2 connected to the second data line DL2, a second dummy data line D-DL2 connected to the second dummy subpixel circuit D-SPC2, and a second dummy pad D-PD2 connected to the second dummy data line D-DL2.

For example, before and after the repair process for defects in the second subpixel circuit SPC2 is performed, the data driving circuit 120 may directly output the second data voltage to the second dummy pad D-PD2. In this case, the second pad PD2 and the second dummy pad D-PD2 may not be connected to each other.

As another example, before and after the repair process for defects in the second subpixel circuit SPC2 is performed, the second pad PD2 and the second dummy pad D-PD2 may be electrically connected. Accordingly, the data driving circuit 120 may output the second data voltage to the second pad PD2, and the second data voltage input to the second pad PD2 may be transferred to the second dummy pad D-PD2.

After the repair process for defects in the second subpixel circuit SPC2 is performed, when the connection between the second subpixel circuit SPC2 and the second light emitting element ED2 is broken, a second data voltage for enabling the second light emitting element ED2 to emit light with a desired second luminance may be applied to the second dummy subpixel circuit D-SPC2 through the second dummy data line D-DL2.

As described above, the second dummy subpixel circuit D-SPC2 may be driven by receiving each of the second common signal CS2 and the second data voltage at a predefined timing to supply a driving current to the second light emitting element ED2 in the display area DA through the dummy connection control line 500. Accordingly, the second light emitting element ED2 may normally emit light. This may mean that the second subpixel SP2 has been normalized even though a defect in the second subpixel circuit SPC2 has occurred.

Next, after both the repair process for defects in the first subpixel circuit SPC1 and the repair process for defects in the second subpixel circuit SPC2 are performed, the state of the display panel 110 may include both the state after the repair process for defects in the first subpixel circuit SPC1 is performed and the state after the repair process for defects in the second subpixel circuit SPC2.

In this regard, the connection between the first subpixel circuit SPC1 and the first light emitting element ED1 may be broken, and the connection between the second subpixel circuit SPC2 and the second light emitting element ED2 may be broken.

A first data voltage for enabling the first light emitting element ED1 to emit light with a desired first luminance may be applied to the first dummy subpixel circuit D-SPC1 through the first dummy data line D-DL1, and a second data voltage for enabling the second light emitting element ED2 to emit light with a desired second luminance may be applied to the second dummy subpixel circuit D-SPC2 through the second dummy data line D-DL2.

The dummy connection control line 500 and the first light emitting element ED1 may be connected in the first area BA1, and the dummy connection control line 500 and the second light emitting element ED2 may be connected in the second area BA2.

The first dummy subpixel circuit D-SPC1 and the dummy connection control line 500 may be connected, and the second dummy subpixel circuit D-SPC2 and the dummy connection control line 500 may be connected.

The first common signal CS1 may be applied to the first dummy signal line 521, and the second common signal CS2 may be applied to the second dummy signal line 522.

Referring to FIG. 6, after the repair process for defects in the first subpixel circuit SPC1 and the repair process for defects in the second subpixel circuit SPC2 are performed, the dummy connection control line 500 may be broken at the third cutting point CP3 between the first area BA1 and the second area BA2. Accordingly, the first light emitting element ED1 and the second light emitting element ED2 may emit light independently of each other.

As the dummy connection control line 500 is broken at the third cutting point CP3 between the first area BA1 and the second area BA2 after the repair process for the two-point successive defect, the dummy connection control line 500 may include a first dummy connection control line 500-1 for connecting the first dummy subpixel circuit D-SPC1 and the first pixel electrode PE of the first light emitting element ED1 and a second dummy connection control line 500-2 for connecting the second dummy subpixel circuit D-SPC2 and the second pixel electrode PE of the second light emitting element ED2. The first dummy connection control line 500-1 and the second dummy connection control line 500-2 may be separated from each other.

A display device 100 in which a repair process for two-point successive defects has been performed according to embodiments of the disclosure is described as follows.

The display device 100 according to embodiments of the disclosure may include a plurality of subpixels SP disposed in the display area DA and a plurality of dummy subpixel circuits D-SPC disposed in the non-display area NDA.

The plurality of subpixels SP may be disposed in the same row and include a first subpixel SP1 and a second subpixel SP2 adjacent to each other.

The first subpixel SP1 may include a first light emitting element ED1 and a first subpixel circuit SPC1 configured to drive the first light emitting element ED1. The second subpixel SP2 may include a second light emitting element ED2 and a second subpixel circuit SPC2 configured to drive the second light emitting element ED2.

The first light emitting element ED1 and the first subpixel circuit SPC1 may be electrically disconnected from each other, and the second light emitting element ED2 and the second subpixel circuit SPC2 may be electrically disconnected from each other.

The plurality of dummy subpixel circuits D-SPC may include a first dummy subpixel circuit D-SPC1 electrically connected to the first light emitting element ED1 and a second dummy subpixel circuit D-SPC2 electrically connected to the second light emitting element ED2.

The first light emitting element ED1 emits light of a first wavelength, the second light emitting element ED2 emits light of a second wavelength, and the second wavelength may be different from the first wavelength.

The first dummy subpixel circuit D-SPC1 may receive the first common signal CS1 for resetting the first pixel electrode PE of the first light emitting element ED1, and the second dummy subpixel circuit D-SPC2 may receive the second common signal CS2 for resetting the second pixel electrode PE of the second light emitting element ED2. The second common signal CS2 may have a voltage different from that of the first common signal CS1.

The display device 100 according to embodiments of the disclosure may further include a first dummy connection control line 500-1 connecting the first dummy subpixel circuit D-SPC1 to the first pixel electrode PE of the first light emitting element ED1, and a second dummy connection control line 500-2 connecting the second dummy subpixel circuit D-SPC2 to the second pixel electrode PE of the second light emitting element ED2. Here, the first dummy connection control line 500-1 and the second dummy connection control line 500-2 may be separated from each other.

By the repair structure according to the embodiments of the disclosure described above, even if a defect occurs in the subpixel circuit SPC of the subpixel SP in the display panel 110, the corresponding subpixel SP may be normalized.

By the repair structure according to embodiments of the disclosure, even if a defect (one-point defect) occurs in one subpixel circuit SPC in the display panel 110, the corresponding subpixel SP may be normalized. Further, by the repair structure according to the embodiments of the disclosure, even if defects (successive defects including two-point successive defects) occur in the respective subpixel circuits SPC of two or more subpixels SP successively arranged, all of the two or more subpixels SP successively arranged may be normalized.

As described above, the first subpixel SP1 and the second subpixel SP2 may be disposed adjacent to each other in the first direction or the second direction, and the first light emitting element ED1 and the second light emitting element ED2 may be disposed adjacent to each other in the first direction or the second direction. Accordingly, no other light emitting element is disposed between the first light emitting element ED1 and the second light emitting element ED2.

The first light emitting element ED1 and the second light emitting element ED2 may emit light of different colors.

Each of the first light emitting element ED1 and the second light emitting element ED2 may have a single stack structure or a tandem stack structure.

When each of the first light emitting element ED1 and the second light emitting element ED2 has a single stack structure, each of the first light emitting element ED1 and the second light emitting element ED2 may include one light emitting layer. When each of the first light emitting element ED1 and the second light emitting element ED2 has a tandem stack structure, each of the first light emitting element ED1 and the second light emitting element ED2 may include one or more light emitting layers.

Hereinafter, a stack structure (single stack structure or tandem stack structure) of the light emitting element ED is described with reference to FIGS. 7 and 8.

Figure 7:
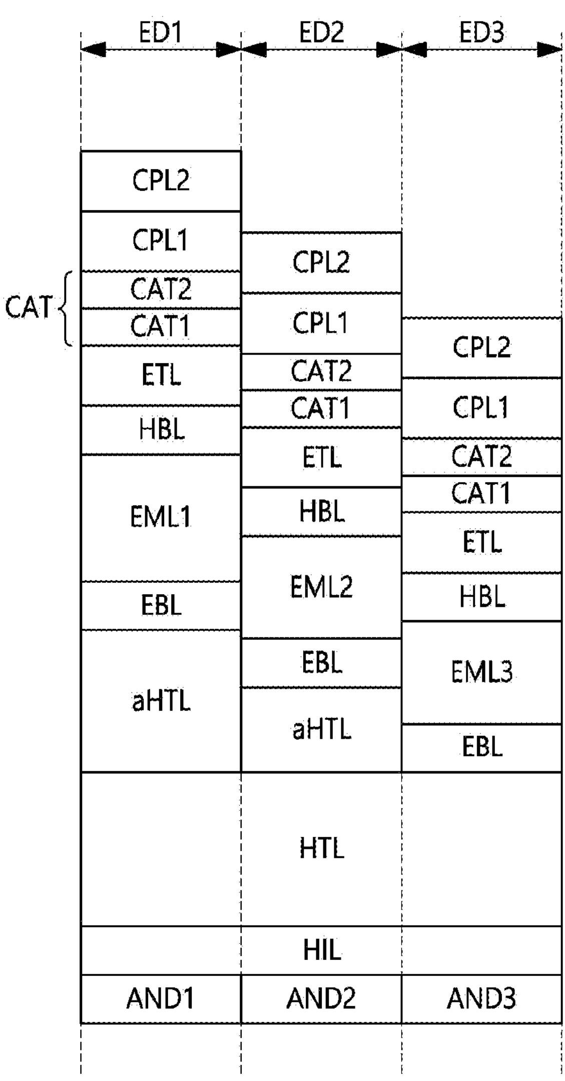
Figure 8:
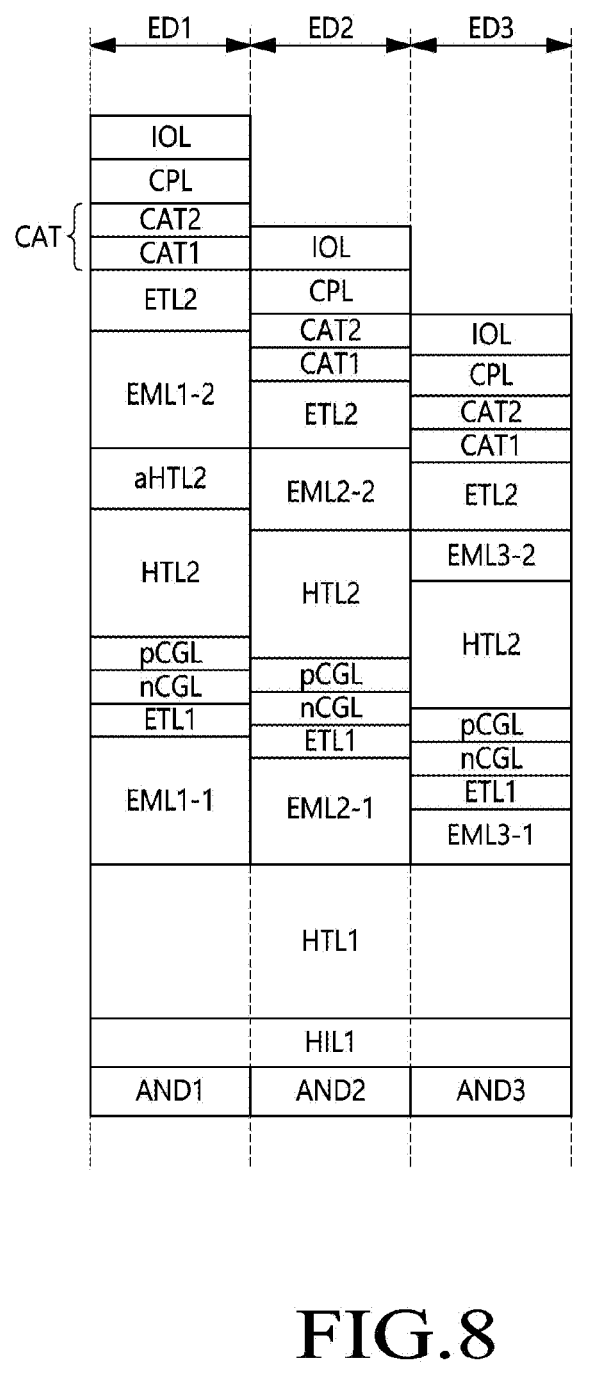

FIGS. 7 and 8 illustrate a stack structure of a light emitting element ED of a display panel 110 according to embodiments of the disclosure.

Referring to FIGS. 7 and 8, in order to describe the stack structure of the light emitting element ED, the first light emitting element ED1, the second light emitting element ED2, and the third light emitting element ED3 are taken as examples. The first light emitting element ED1 may emit first color light, the second light emitting element ED2 may emit second color light, and the third light emitting element ED3 may emit third color light. For example, the first color light may be red light, the second color light may be green light, and the third color light may be blue light. However, embodiments of the disclosure are not limited thereto.

First, a single stack structure of the first light emitting element ED1, the second light emitting element ED2, and the third light emitting element ED3 is described with reference to FIG. 7.

The first light emitting element ED1 may include a first anode AND1, a first light emitting layer EML1, and a cathode CAT, the second light emitting element ED2 may include a second anode AND2, a second light emitting layer EML2, and a cathode, and the third light emitting element ED3 may include a third anode AND3, a third light emitting layer EML3, and a cathode CAT.

The cathode CAT may be composed of a single layer or a plurality of layers. For example, the cathode CAT may include a first cathode CAT1 and a second cathode CAT2. However, embodiments of the disclosure are not limited thereto.

For example, each of the first anode AND1, the second anode AND2, and the third anode AND3 may be a pixel electrode PE, and the cathode CAT may be a common electrode CE. As another example, the first anode AND1, the second anode AND2, and the third anode AND3 may be a common electrode CE, and the cathode CAT may be a pixel electrode PE. In embodiments of the disclosure, for convenience of description, it is assumed that each of the first anode AND1, the second anode AND2, and the third anode AND3 is a pixel electrode PE and the cathode CAT is a common electrode CE. However, embodiments of the disclosure are not limited thereto.

A hole injection layer HIL and a hole transport layer HTL may be commonly disposed between the first to third anodes AND1, AND2, and the first to third light emitting layers EML1, EML2, and EML3. The hole injection layer HIL may be disposed between the first to third anodes AND1, AND2, and AND3 and the hole transport layer HTL.

In order to adjust the thickness (height) of at least one of the first light emitting element ED1, the second light emitting element ED2, and the third light emitting element ED3 or adjust hole transport characteristics, an additional hole transport layer aHTL may be further disposed between at least one of the first to third light emitting layers EML1, EML2, and EML3 and the hole transport layer HTL. According to the example of FIG. 7, an additional hole transport layer aHTL may be further disposed between the first emission layer EML1 and the electron transport layer ETL, and between the second emission layer EML2 and the hole transport layer ETL. This is merely an example, but the disclosure is not limited thereto.

An electron blocking layer HBL may be additionally disposed in common between the first to third light emitting layers EML1, EML2, and EML3 and the hole transport layer HTL.

An electron transport layer ETL may be commonly disposed between the first to third light emitting layers EML1, EML2, and EML3 and the cathode CAT.

A hole blocking layer HBL may be additionally disposed in common between the first to third light emitting layers EML1, EML2, and EML3 and the electron transport layer ETL.

The cathode CAT may include a first cathode CAT1 and a second cathode CAT2, and the first cathode CAT1 closer to the electron transport layer ETL of the first cathode CAT1 and the second cathode CAT2 may function as an electron injection layer EIL.

At least one capping layer may be disposed on the cathode CAT.

For example, a first capping layer CPL1 and a second capping layer CPL2 may be disposed on the cathode CAT. For example, the first capping layer CPL1 may be an organic layer, and the second capping layer CPL2 may be an inorganic layer, but the disclosure is not limited thereto. As such, by disposing the first capping layer CPL1 and the second capping layer CPL2 on the cathode CAT, the cathode CAT may be better protected and the light efficiency of the display device may be further enhanced.

Next, a tandem stack structure of the first light emitting element ED1, the second light emitting element ED2, and the third light emitting element ED3 is described with reference to FIG. 8.

The first light emitting element ED1 may include a first anode AND1, two first light emitting layers EML1-1 and EML1-2, and a cathode CAT. The second light emitting element ED2 may include a second anode AND2, two second light emitting layers EML2-1 and EML2-2, and a cathode CAT. The third light emitting element ED3 may include a third anode AND3, two third light emitting layers EML3-1 and EML3-2, and a cathode CAT.

The two first light emitting layers EML1-1 and EML1-2 may include a first lower light emitting layer EML1-1 and a first upper light emitting layer EML1-2. The two second light emitting layers EML2-1 and EML2-2 may include a second lower light emitting layer EML2-1 and a second upper light emitting layer EML2-2. The two third light emitting layers EML3-1 and EML3-2 may include a third lower light emitting layer EML3-1 and a third upper light emitting layer EML3-2.

The cathode CAT may be composed of a single layer or a plurality of layers. For example, the cathode CAT may include a first cathode CAT1 and a second cathode CAT2. However, embodiments of the disclosure are not limited thereto.

For example, each of the first anode AND1, the second anode AND2, and the third anode AND3 may be a pixel electrode PE, and the cathode CAT may be a common electrode CE. As another example, the first anode AND1, the second anode AND2, and the third anode AND3 may be a common electrode CE, and the cathode CAT may be a pixel electrode PE. In embodiments of the disclosure, for convenience of description, it is assumed that each of the first anode AND1, the second anode AND2, and the third anode AND3 is a pixel electrode PE and the cathode CAT is a common electrode CE. However, embodiments of the disclosure are not limited thereto.

A first hole injection layer HIL1 and a first hole transport layer HTL1 may be commonly disposed between the first to third anodes AND1, AND2, and AND3 and the first to third lower light emitting layers EML1-1, EML2-2, and EML3-2. The first hole injection layer HIL1 may be disposed between the first to third anodes AND1, AND2 and AND3 and the first hole transport layer HTL1.

A first electron transport layer ETL1 and a second hole transport layer HTL2 may be commonly disposed between the first lower emission layer EML1-1 and the first upper emission layer EML1-2, between the second lower emission layer EML2-1 and the second upper emission layer EML2-2, and between the third lower emission layer EML3-1 and the third upper emission layer EML3-2.

The first electron transport layer ETL1 of the first electron transport layer ETL1 and the second hole transport layer HTL2 may be disposed closer to the first to third lower light emitting layers EML1-1, EML2-1, and EML3-1, and the second hole transport layer HTL2 of the first electron transport layer ETL1 and the second hole transport layer HTL2 may be disposed closer to the first to third upper light emitting layers EML1-2, EML2-2, and EML3-2.

To adjust the thickness (height) of at least one of the first light emitting element ED1, the second light emitting element ED2, and the third light emitting element ED3 or adjust hole transport characteristics, a second additional hole transport layer aHTL2 may be further disposed between at least one of the first to third upper light emitting layers EML1-2, EML2-2, and EML3-2 and the second hole transport layer HTL2. According to the example of FIG. 8, a second additional hole transport layer aHTL2 may be further disposed between the first upper light emitting layer EML1-2 among the first to third upper light emitting layers EML1-2, EML2-2, and EML3-2 and the second hole transport layer HTL2. This is merely an example, but the disclosure is not limited thereto.

A first charge generation layer nCGL and a second charge generation layer pCGL may be additionally disposed in common between the first electron transport layer ETL1 and the second hole transport layer HTL2. The first charge generation layer nCGL of the first charge generation layer nCGL and the second charge generation layer pCGL may be disposed closer to the first electron transport layer ETL1, and the second charge generation layer pCGL of the first charge generation layer nCGL and the second charge generation layer pCGL may be disposed closer to the second hole transport layer HTL2. For example, the first charge generation layer nCGL may be an n-type charge generation layer, and the second charge generation layer pCGL may be a p-type charge generation layer, but the disclosure is not limited thereto.

A second electron transport layer ETL2 may be commonly disposed between the first to third upper light emitting layers EML1-2, EML2-2, and EML3-2 and the cathode CAT.

Of the first cathode CAT1 and the second cathode CAT2 constituting the cathode CAT, the first cathode CAT1 may function as a second electron injection layer EIL.

A capping layer CPL may be disposed on the cathode CAT. For example, the capping layer CPL may include an organic layer.

An inorganic layer IOL may be further disposed on the capping layer CPL. For example, the inorganic layer IOL may be a layer deposited by atomic layer deposition (ALD). The inorganic layer IOL may serve as a capping layer added on the capping layer CPL including the organic layer.

The light emitting element ED having a tandem stack structure may have a relatively large current sensitivity as compared with the light emitting element ED having a single stack structure. Accordingly, successive defects that occur when the light emitting elements ED have a tandem stack structure may lead to worse image quality degradation than successive defects that occur when the light emitting elements ED have a single stack structure.

Therefore, to increase the manufacturing yield of the display panel, a repair process for successive defects may be urgent for a display panel 110 including light emitting elements ED having a tandem stack structure.

In the foregoing, a repair structure capable of repairing the defects and a state in which the repair process has been performed when a defect occurs in at least one of the first subpixel circuit SPC1 and the second subpixel circuit SPC2 regardless of the first subpixel circuit SPC1 and the second subpixel circuit SPC2 have been described.

Examples of the first subpixel circuit SPC1 and the second subpixel circuit SPC2 are presented below, and a repair process capable of repairing defects when a defect occurs in at least one of an exemplary first subpixel circuit SPC1 and second subpixel circuit SPC2, and a state in which the repair process has been performed are described.

Figure 9:
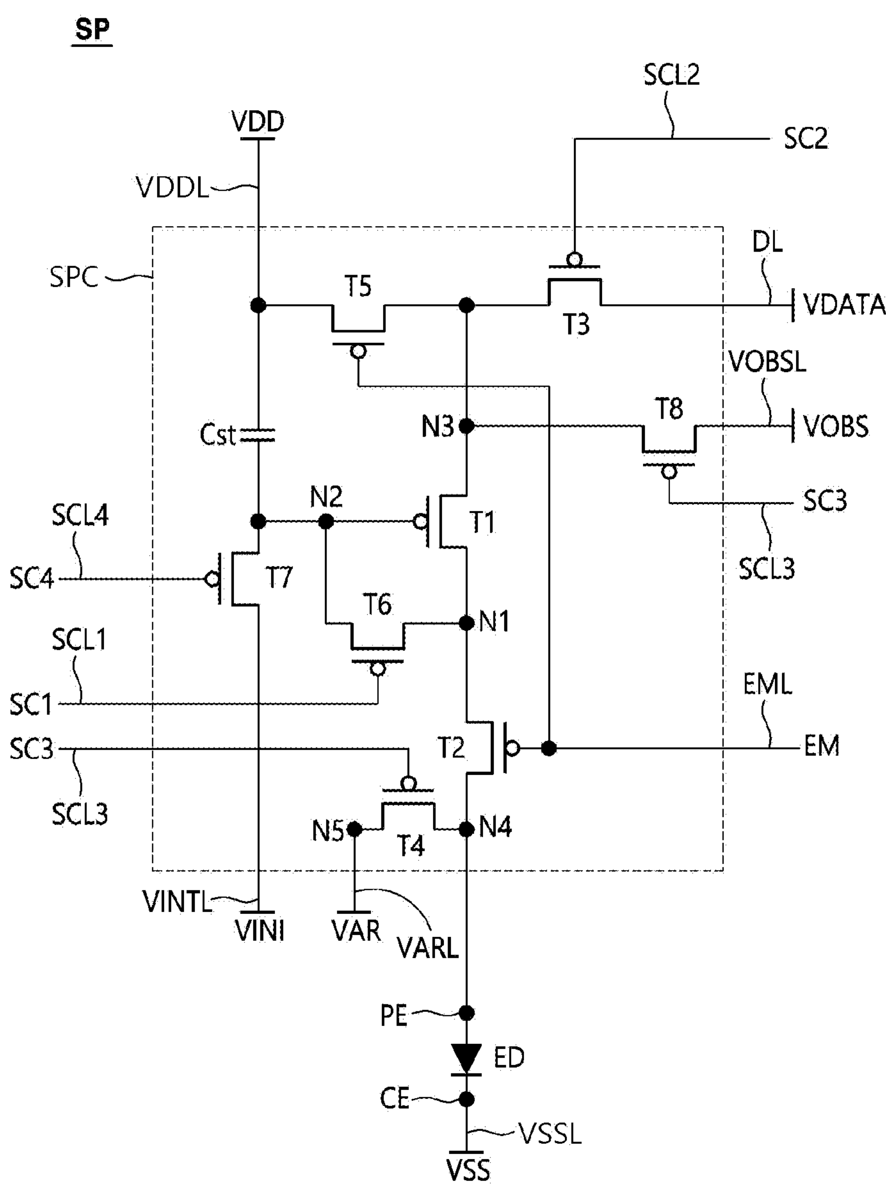
FIG. 9 illustrates an equivalent circuit of a subpixel included in a display panel according to embodiments of the disclosure.

FIG. 9 illustrates an equivalent circuit of a subpixel SP included in a display panel 110 according to embodiments of the disclosure.

Referring to FIG. 9, each of the plurality of subpixels SP including the first subpixel SP1 and the second subpixel SP2 of FIGS. 4 to 6 may include a light emitting element ED and a subpixel circuit SPC.

The light emitting element ED includes a pixel electrode ED and a common electrode CE, and the common electrode CE may be connected to the base voltage line VSSL to which the base voltage VSS is applied. According to the example of FIG. 9, the pixel electrode ED may be an anode, and the common electrode CE may be a cathode.

The subpixel circuit SPC may include first to fifth nodes N1 to N5. The fourth node N4 among the first to fifth nodes N1 to N5 may be electrically connected to the pixel electrode PE of the light emitting element ED.

The subpixel circuit SPC may receive first to fourth scan signals SC1, SC2, SC3, and SC4 from the first to fourth scan signal lines SCL1, SCL2, SCL3, and SCL4, and may receive a data voltage VDATA from the corresponding data line DL.

The subpixel circuit SPC may receive a driving voltage VDD from the driving voltage line VDDL, an initialization voltage VINT from the initialization voltage line VINT, and a bias voltage VOBS from the bias voltage line VOBSL.

The subpixel circuit SPC may receive a reset voltage VAR from the reset voltage line VARL. When the pixel electrode PE is an anode, the reset voltage VAR may be referred to as an anode reset voltage.

For example, the reset voltage VAR may be one of the plurality of common signals CS1, CS2, and CS3 described above. The reset voltage line VARL may be one of the plurality of common signal lines CSL1, CSL2, and CSL3 described above.

According to the example of FIG. 9, the subpixel circuit SPC may include eight transistors T1 to T8 and one capacitor Cst. This is merely an example for convenience of description, and the disclosure is not limited thereto, and may be variously modified.

Referring to FIG. 9, the subpixel circuit SPC may include a first transistor T1 connected between the first node N1 and the third node N3, a second transistor T2 controlled to be selectively turned on/off by the emission control signal EM supplied from the emission control signal line EML and controlling electrical connection between the first node N1 and the fourth node N4, and a third transistor T3 controlled to be selectively turned on/off by the second scan signal SC2 supplied from the second scan signal line SCL2 and controlling electrical connection between the data line DL and the third node N3.

The first transistor T1 may be a driving transistor for supplying a driving current to the light emitting element ED. When the driving current is supplied by the first transistor T1, the second transistor T2 may be in a turn-on state.

Referring to FIG. 9, the subpixel circuit SPC may further include a fourth transistor T4 controlled to be selectively turned on/off by the third scan signal SC3 supplied from the third scan signal line SCL3 and controlling electrical connection between the fourth node N4 and the fifth node N5.

Referring to FIG. 9, the fourth node N4 may be a pixel electrode PE of the light emitting element ED or a node electrically connected to the pixel electrode PE. The fifth node N5 may be electrically connected to the reset voltage line VARL to which the reset voltage VAR is applied.

If the fourth transistor T4 is turned on at a predefined driving timing, the reset voltage VAR applied to the fifth node N5 may be applied to the fourth node N4 electrically connected to the pixel electrode PE through the fourth transistor T4. Accordingly, the reset voltage VAR may be applied to the pixel electrode PE.

Referring to FIG. 9, the subpixel circuit SPC may further include a fifth transistor T5 controlled to be selectively turned on/off by the emission control signal EM supplied from the emission control signal line EML and connected between the driving voltage line VDDL to which the driving voltage VDD is applied and the fourth node N4.

The gate node of the fifth transistor T5 and the gate node of the second transistor T2 together may be electrically connected to the emission control signal line EML. Therefore, the fifth transistor T5 and the second transistor T2 together may be turned on together or turned off.

Referring to FIG. 9, the subpixel circuit SPC may further include a sixth transistor T6 controlled to be selectively turned on/off by the first scan signal SC1 supplied from the first scan signal line SCL1 and controlling electrical connection between the first node N1 and the second node N2, a seventh transistor T7 controlled to be selectively turned on/off by the fourth scan signal SC4 supplied from the fourth scan signal line SCL4 and controlling electrical connection between the initialization voltage line VINTL to which the initialization voltage VINT is applied and the second node N2, and an eighth transistor T8 controlled to be selectively turned on/off by the third scan signal SC3 supplied from the third scan signal line SCL3 and controlling electrical connection between the bias voltage line VOBSL to which the bias voltage VOBS is applied and the third node N3.

The gate node of the eighth transistor T8 and the gate node of the fourth transistor T4 together may be electrically connected to the third scan signal line SCL3. Thus, the eighth transistor T8 and the fourth transistor T4 together may be turned on or turned off.

Referring to FIG. 9, the subpixel circuit SPC may further include a storage capacitor Cst formed between the second node N2 and the driving voltage line VDDL.

Referring to FIG. 9, all of the first to eighth transistors T1 to T8 may be p-type transistors. However, the disclosure is not limited thereto. For example, all of the first to eighth transistors T1 to T8 may be n-type transistors. As another example, at least one type (n-type or p-type) of the first to eighth transistors T1 to T8 may be different from the other type (p-type or n-type).

Referring to FIG. 9, among the signals supplied to the subpixel circuit SPC, the remaining signals except for the data voltage VDATA and the first to fourth scan signals SC1 to SC4 may be common driving signals commonly supplied to the plurality of subpixel circuits SPC. For example, the common driving signals may include at least one of a driving voltage VDD, a bias voltage VOBS, an initialization voltage VINT, and a reset voltage VAR.

The common driving signals include the plurality of common signals CS1, CS2, and CS3 described in FIGS. 5 and 6, and the plurality of common signals CS1, CS2, and CS3 may be one of the driving voltage VDD, the bias voltage VOBS, the initialization voltage VINT, and the reset voltage VAR.

For example, the plurality of common signals CS1, CS2, and CS3 may be the reset voltage VAR applied to the fifth node N5, and the plurality of common signal lines CSL1, CSL2, and CSL3 may be the reset voltage line VARL connected to the fifth node N5. In this case, one of the plurality of common signals CS1, CS2, and CS3 may be the reset voltage VAR and be applied to the fourth node N4 electrically connected to the pixel electrode PE through the fourth transistor T4 at a driving timing when the fourth transistor T4 is turned on. Hereinafter, it is described as an example that the plurality of common signals CS1, CS2, and CS3 are the reset voltage VAR and the plurality of common signal lines CSL1, CSL2, and CSL3 are the reset voltage line VARL. However, the disclosure is not limited thereto.

Figure 10:
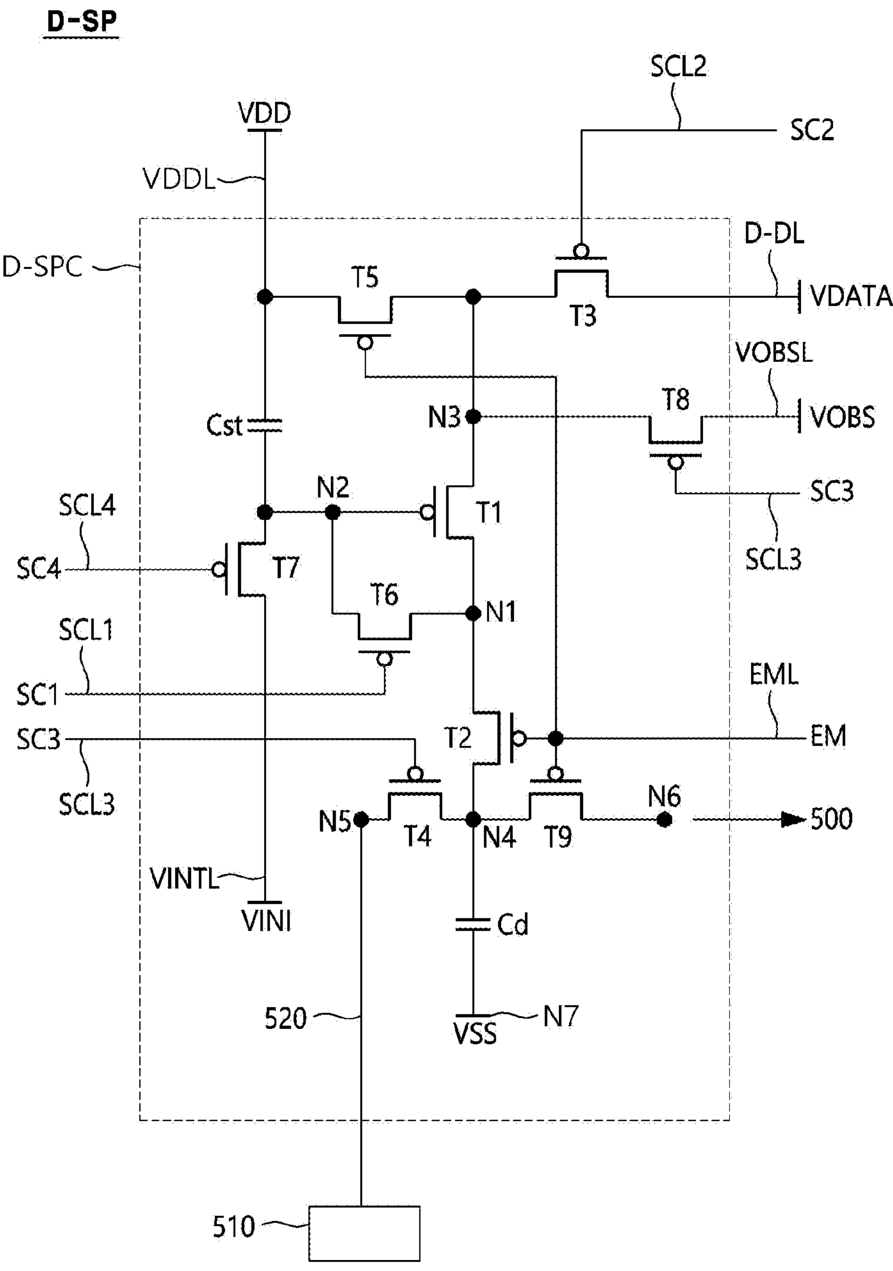
FIG. 10 illustrates an equivalent circuit of a dummy subpixel included in a display panel according to embodiments of the disclosure.

FIG. 10 illustrates an equivalent circuit of a dummy subpixel D-SP included in a display panel 110 according to embodiments of the disclosure.

Referring to FIG. 10, the display panel 110 according to embodiments of the disclosure may include a plurality of dummy subpixels D-SP including the first dummy subpixel D-SP1 and the second dummy subpixel D-SP2 of FIGS. 5 and 6.

Each of the plurality of dummy subpixels D-SP may include a dummy subpixel circuit D-SPC. However, the dummy subpixel D-SP does not include a light emitting element.

The dummy subpixel circuit D-SPC may have a circuit structure that is quite similar to the subpixel circuit SPC. Accordingly, a description of content that is substantially the same as the content of the subpixel circuit SPC may be omitted.

The dummy subpixel circuit D-SPC may include first to fifth nodes N1 to N5. Unlike the subpixel circuit SPC, the light emitting element ED is not connected to the fourth node N4.

The dummy subpixel circuit D-SPC may receive first to fourth scan signals SC1, SC2, SC3, and SC4 from the first to fourth scan signal lines SCL1, SCL2, SCL3, and SCL4, and may receive a data voltage VDATA from the corresponding data line DL.

The dummy subpixel circuit D-SPC may receive the driving voltage VDD from the driving voltage line VDDL, the initialization voltage VINT from the initialization voltage line VINT, and the bias voltage VOBS from the bias voltage line VOBSL.

The dummy subpixel circuit D-SPC may receive the reset voltage VAR from the reset voltage line VARL. When the pixel electrode PE is an anode, the reset voltage VAR may be referred to as an anode reset voltage.

For example, the reset voltage VAR may be one of the plurality of common signals CS1, CS2, and CS3 described above. The reset voltage line VARL may be one of the plurality of common signal lines CSL1, CSL2, and CSL3 described above.

Like the subpixel circuit SPC, the dummy subpixel circuit D-SPC may include eight transistors T1 to T8 and one capacitor Cst. Alternatively, unlike the subpixel circuit SPC, the dummy subpixel circuit D-SPC may further include one or more transistors and/or one or more capacitors. For example, various changes may be made to the dummy subpixel circuit D-SPC.

The dummy subpixel circuit D-SPC may include a first transistor T1 connected between the first node N1 and the third node N3, a second transistor T2 controlled to be selectively turned on/off by the emission control signal EM supplied from the emission control signal line EML and controlling electrical connection between the first node N1 and the fourth node N4, and a third transistor T3 controlled to be selectively turned on/off by the second scan signal SC2 supplied from the second scan signal line SCL2 and controlling electrical connection between the data line DL and the third node N3.

The dummy subpixel circuit D-SPC may further include a fourth transistor T4 controlled to be selectively turned on/off by the third scan signal SC3 supplied from the third scan signal line SCL3 and controlling electrical connection between the fourth node N4 and the fifth node N5.

The fifth node N5 may be electrically connected to the dummy signal line 520. After the repair process is performed, one of the plurality of common signals CS1, CS2, and CS3 corresponding to the reset voltage VAR may be selectively supplied from the signal supply unit 510. For example, one of the plurality of common signals CS1, CS2, and CS3 corresponding to the reset voltage VAR may be applied to the fourth node N4 through the fourth transistor T4 at the driving timing when the fourth transistor T4 is turned on after the repair process is performed. Accordingly, the voltage of the fourth node N4 may be reset.

The dummy subpixel circuit D-SPC may further include a fifth transistor T5 controlled to be selectively turned on/off by the emission control signal EM supplied from the emission control signal line EML and connected between the driving voltage line VDDL to which the driving voltage VDD is applied and the fourth node N4.

The dummy subpixel circuit D-SPC may further include a sixth transistor T6 controlled to be selectively turned on/off by the first scan signal SC1 supplied from the first scan signal line SCL1 and controlling electrical connection between the first node N1 and the second node N2, a seventh transistor T7 controlled to be selectively turned on/off by the fourth scan signal SC4 supplied from the fourth scan signal line SCL4 and controlling electrical connection between the initialization voltage line VINTL to which the initialization voltage VINT is applied and the second node N2, and an eighth transistor T8 controlled to be selectively turned on/off by the third scan signal SC3 supplied from the third scan signal line SCL3 and controlling electrical connection between the bias voltage line VOBSL to which the bias voltage VOBS is applied and the third node N3.

The dummy subpixel circuit D-SPC may further include a storage capacitor Cst formed between the second node N2 and the driving voltage line VDDL.

All of the first to eighth transistors T1 to T8 included in the dummy subpixel circuit D-SPC may be p-type transistors. However, the disclosure is not limited thereto. For example, all of the first to eighth transistors T1 to T8 may be n-type transistors. As another example, at least one type (n-type or p-type) of the first to eighth transistors T1 to T8 may be different from the other type (p-type or n-type).

Referring to FIG. 10, each of the plurality of dummy subpixel circuits D-SPC may further include a sixth node N6 different from the first to fifth nodes N1 to N5 and a ninth transistor T9 that controls electrical connection between the fourth node N4 and the sixth node N6.

The first transistor T1 in the dummy subpixel circuit D-SPC may be a driving transistor for supplying a driving current to the light emitting element ED in the subpixel SP defect-repaired. When a driving current is supplied by the first transistor T1 in the dummy subpixel circuit D-SPC, the second transistor T2 and the ninth transistor T9 may be in a turn-on state.

The ninth transistor T9 may be a transistor for providing a path through which a driving current is transferred to the light emitting element ED in the subpixel SP where a defect occurs after the repair process. Accordingly, the ninth transistor T9 may be referred to as a repair transistor.

After the repair process is performed, the sixth node N6 may be electrically connected to the dummy connection control line 500. The sixth node N6 may be a node corresponding to the second welding point WP1*b* or the fourth welding point WP2*b* of FIG. 6.

The ninth transistor T9 may be controlled to be selectively turned on/off by the emission control signal EM. The gate node of the ninth transistor T9 and the gate node of the second transistor T2 may be commonly connected to the emission control signal line EML. Accordingly, the ninth transistor T9 may be turned on or turned off at the same timing as the second transistor T2.

If the ninth transistor T9 and the second transistor T2 together are turned on by the emission control signal EM after the repair process for a specific subpixel SP is performed, the driving current generated in the dummy subpixel circuit D-SPC may be transferred to the dummy connection control line 500 through the ninth transistor T9, and the driving current transferred to the dummy connection control line 500 may be supplied to the light emitting element ED connected to the dummy connection control line 500. Here, the light emitting element ED connected to the dummy connection control line 500 is a light emitting element ED of a specific subpixel SP that has been normalized according to the repair process.

Referring to FIG. 10, each of the plurality of dummy subpixel circuits D-SPC may further include a dummy capacitor Cd between the fourth node N4 and the seventh node N7 to which the driving voltage VDD is applied.

The dummy capacitor Cd may be connected to the fourth node N4, and a high potential driving voltage VDD may be applied to the seventh node N7, which is one of the two opposite ends of the dummy capacitor Cd, efficiently controlling the voltage state of the fourth node N4.

The ninth transistor T9 and the dummy capacitor Cd may not be included in the subpixel circuit SPC, but may be included only in the dummy subpixel circuit D-SPC.

Figure 11:
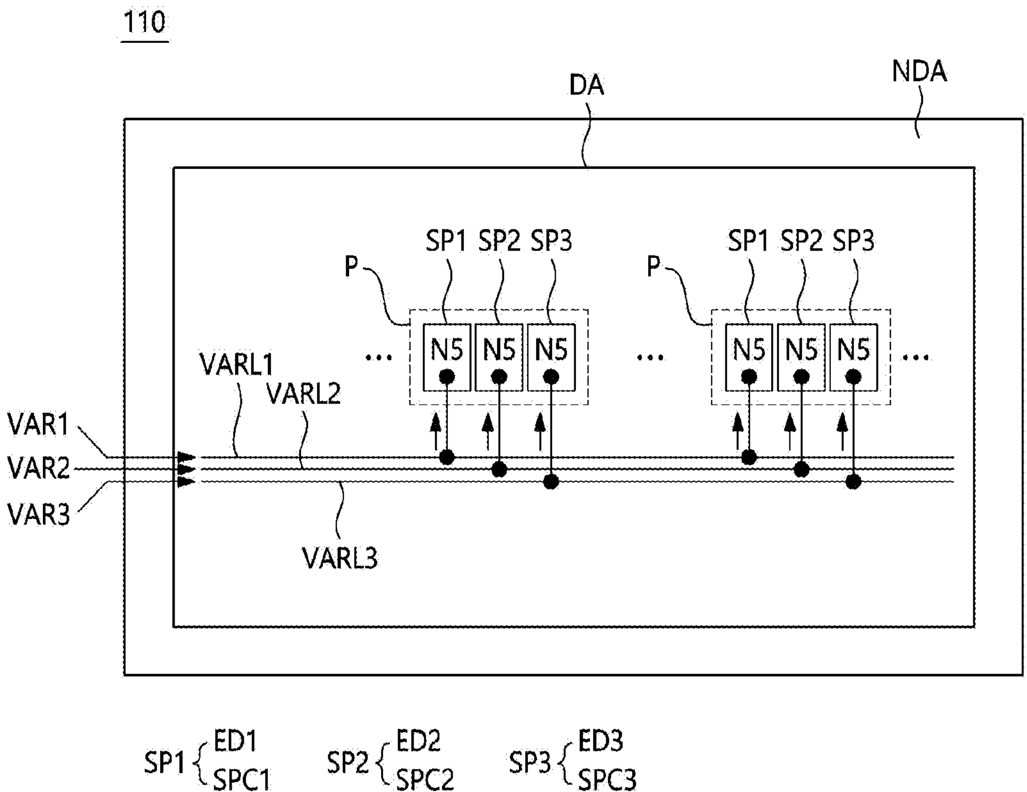
FIG. 11 is a plan view illustrating a display panel according to embodiments of the disclosure.

FIG. 11 is a plan view of a display panel 110 according to embodiments of the disclosure. However, in the following description, FIG. 9 is also referred to.

Referring to FIG. 11, the display area DA of the display panel 110 may include a plurality of pixels P, and each of the plurality of pixels P may include a first subpixel SP1, a second subpixel SP2, and a third subpixel SP3. The first subpixel SP1, the second subpixel SP2, and the third subpixel SP3 may be successively arranged in an area in which one pixel is disposed. For example, the first subpixel SP1, the second subpixel SP2, and the third subpixel SP3 may be disposed adjacent to each other.

The first subpixel SP1 may include a first light emitting element ED1 that emits light of a first wavelength, and a first subpixel circuit SPC1 adjacent to the first light emitting element ED1 and configured to drive the first light emitting element ED1.

The second subpixel SP2 may include a second light emitting element ED2 that emits light of a second wavelength, and a second subpixel circuit SPC2 adjacent to the second light emitting element ED and configured to drive the second light emitting element ED2.

The third subpixel SP3 may include a third light emitting element ED3 that emits light of a third wavelength, and a third subpixel circuit SPC3 adjacent to the third light emitting element ED3 and configured to drive the third light emitting element ED3.

The first wavelength, the second wavelength, and the third wavelength may all be different. For example, the first wavelength may be included in a wavelength range of red light, the second wavelength may be included in a wavelength range of green light, and the third wavelength may be included in a wavelength range of blue light. For example, the wavelength range of red light may be 600 nm to 650 nm, but the disclosure is not limited thereto. For example, the wavelength range of green light may be 510 nm to 590 nm, but the disclosure is not limited thereto. For example, the wavelength range of blue light may be 400 nm to 480 nm, but the disclosure is not limited thereto.

The light of the first wavelength may be first color light, the light of the second wavelength may be second color light, and the light of the third wavelength may be third color light. For example, the first color light, the second color light, and the third color light may be red light, green light, and blue light, respectively, but are not limited thereto.

Each of the first subpixel circuit SPC1, the second subpixel circuit SPC2, and the third subpixel circuit SPC3 may receive a reset voltage VAR. The reset voltage VAR may be applied to the fifth node N5 of each of the first subpixel circuit SPC1, the second subpixel circuit SPC2, and the third subpixel circuit SPC3.

The reset voltages VAR respectively applied to the first subpixel circuit SPC1, the second subpixel circuit SPC2, and the third subpixel circuit SPC3 may be different from each other. For example, the reset voltage VAR applied to the first subpixel circuit SPC1 may be a first reset voltage VAR1, the reset voltage VAR applied to the second subpixel circuit SPC2 may be a second reset voltage VAR2, and the reset voltage VAR applied to the third subpixel circuit SPC3 may be a third reset voltage VAR3.

Accordingly, the first subpixel circuit SPC1 may be connected to the first reset voltage line VARL1 among the plurality of reset voltage lines VARL1, VARL2, and VARL3, the second subpixel circuit SPC2 may be connected to the second reset voltage line VARL2 among the plurality of reset voltage lines VARL1, VARL2, and VARL3, and the third subpixel circuit SPC3 may be connected to the third reset voltage line VARL3 among the plurality of reset voltage lines VARL1, VARL2, and VARL3.

The first reset voltage VAR1 may be a voltage for resetting the voltage state of the first pixel electrode of the first light emitting element ED1 or the node electrically connected thereto, the second reset voltage VAR2 may be a voltage for resetting the voltage state of the second pixel electrode of the second light emitting element ED2 or the node electrically connected thereto, and the third reset voltage VAR3 may be a voltage for resetting the voltage state of the third pixel electrode of the third light emitting element ED3 or the node electrically connected thereto.

At least one of the first reset voltage VAR1, the second reset voltage VAR2, and the third reset voltage VAR3 may have a voltage value different from that of the rest.

For example, the second reset voltage VAR2 and the third reset voltage VAR3 may have the same voltage value, and the second reset voltage VAR2 and the third reset voltage VAR3 may have different voltage values from the first reset voltage VAR1. As another example, the first reset voltage VAR1, the second reset voltage VAR2, and the third reset voltage VAR3 may all have different voltage values.

For example, the light emitting element ED may be viewed as a kind of capacitor, and when the voltage difference between the pixel electrode and the common electrode of the light emitting element ED is large, the corresponding reset voltage VAR may have a high voltage value. This is for discharging the charged charge at the same speed considering different capacitor characteristics (different charged amounts) of each light emitting element ED.

The plurality of reset voltages VAR1, VAR2, and VAR3 may be the plurality of common signals CS1, CS2, and CS3 of FIGS. 5 and 7. For example, the first reset voltage VAR1 may be the first common signal CS1, the second reset voltage VAR2 may be the second common signal CS2, and the third reset voltage VAR3 may be the third common signal CS3.

The plurality of reset voltage lines VARL1, VARL2, and VARL3 may be the plurality of common signal lines CSL1, CSL2, and CSL3 of FIGS. 5 and 7. For example, the first reset voltage line VARL1 may be the first common signal line CSL1, the second reset voltage line VARL2 may be the second common signal line CSL2, and the third reset voltage line VARL3 may be the third common signal line CSL3.

At least one of the first to third common signals CS1 to CS3 may have a voltage value different from that of the rest, or all of the first to third common signals CS1 to CS3 may have different voltage values.

A relationship in magnitude between the first to third reset voltages VAR1 to VAR3, which are the first to third common signals CS1 to CS3, is described below in detail.

When the display panel 110 includes the first pixel electrode PE of the first light emitting element ED1, the second pixel electrode PE of the second light emitting element ED2, the third pixel electrode PE of the second light emitting element ED2, and the common electrode CE overlapping the first pixel electrode PE, the second pixel electrode PE, and the third pixel electrode PE, the first pixel electrode PE and the common electrode CE may have a first voltage difference, the second pixel electrode PE and the common electrode CE may have a second voltage difference, and the third pixel electrode PE and the common electrode CE may have a third voltage difference at a predefined time (reset timing) during a driving period of first subpixel SP1, the second subpixel SP2, and the third subpixel SP3. At least one of the first voltage difference, the second voltage difference, and the third voltage difference may have a value different from the rest. Alternatively, the first voltage difference, the second voltage difference, and the third voltage difference may all have different values.

For example, when the first voltage difference among the first voltage difference, the second voltage difference, and the third voltage difference is the largest, the first reset voltage VAR1 among the first to third reset voltages VAR1 to VAR3, which are the first to third common signals CS1 to CS3, may be set to be the highest.

As another example, when the second voltage difference among the first voltage difference, the second voltage difference, and the third voltage difference is the largest, the second reset voltage VAR2 among the first to third reset voltages VAR1 to VAR3, which are the first to third common signals CS1 to CS3, may be set to be the highest.

As another example, when the third voltage difference among the first voltage difference, the second voltage difference, and the third voltage difference is the largest, the third reset voltage VAR3 among the first to third reset voltages VAR1 to VAR3, which are the first to third common signals CS1 to CS3, may be set to be the highest.

Figure 12:
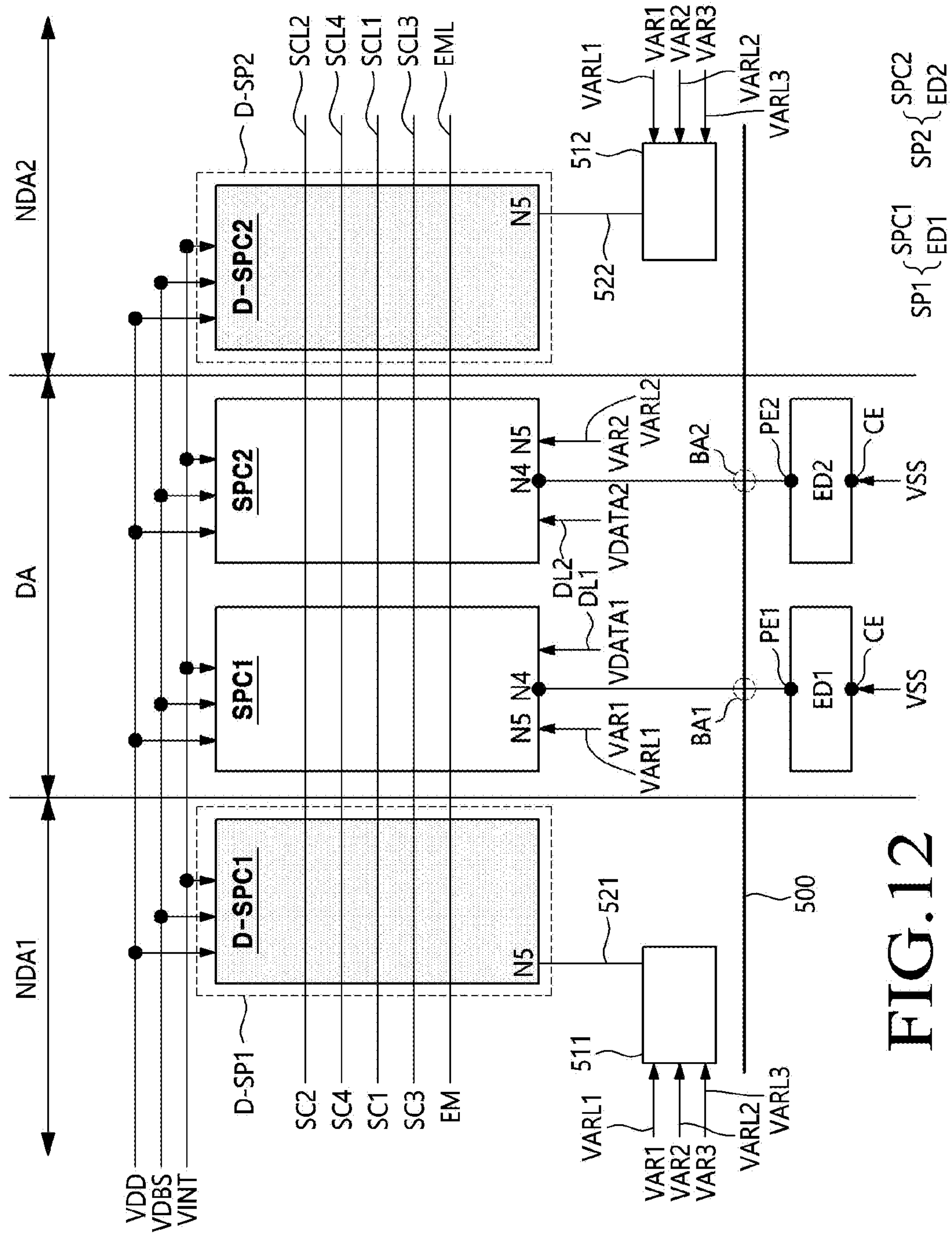
FIGS. 12 and 13 illustrate a first dummy subpixel, a first subpixel, a second subpixel, and a second dummy subpixel before/after a repair process of a display panel according to embodiments of the disclosure.

FIG. 12 illustrates a first dummy subpixel D-SP1, a first subpixel SP1, a second subpixel SP2, and a second dummy subpixel D-SP2 before a repair process for a display panel 110 according to embodiments of the disclosure. In the following description, FIGS. 9 to 11 are also referred to.

Referring to FIG. 12, the first subpixel SP1 and the second subpixel SP2 may be disposed adjacent to each other in the display area DA, the first dummy subpixel D-SP1 may be disposed in the first non-display area NDA1 on one side of the display area DA, and the second dummy subpixel D-SP2 may be disposed in the second non-display area NDA2 on the other side of the display area DA. For example, the first dummy subpixel D-SP1, the first subpixel SP1, the second subpixel SP2, and the second dummy subpixel D-SP2 may be arranged in the same row.

The first subpixel SP1 may include a first subpixel circuit SPC1 and a first light emitting element ED1, and the second subpixel SP2 may include a second subpixel circuit SPC2 and a second light emitting element ED2. Before the repair process, the first subpixel circuit SPC1 and the first light emitting element ED1 may be connected, and the second subpixel circuit SPC2 and the second light emitting element ED2 may be connected.

The first dummy subpixel D-SP1 may include a first dummy subpixel circuit D-SPC1, and the second dummy subpixel D-SP2 may include a second dummy subpixel circuit D-SPC2.

The first light emitting element ED1 may include a first pixel electrode PE1 and a common electrode CE, and the second light emitting element ED2 may include a second pixel electrode PE2 and a common electrode CE.

The first pixel electrode PE1 may be connected to the fourth node N4 in the first subpixel circuit SPC1. The second pixel electrode PE2 may be connected to the fourth node N4 in the second subpixel circuit SPC2. A base voltage VSS may be applied to the common electrode CE.

The driving voltage VDD, the bias voltage VOBS, and the initialization voltage VINT may be supplied to the first dummy subpixel D-SP1, the first subpixel SP1, the second subpixel SP2, and the second dummy subpixel D-SP2.

The first to fourth scan signals SC1 to SC4 and the emission control signal EM may be supplied to the first dummy subpixel D-SP1, the first subpixel SP1, the second subpixel SP2, and the second dummy subpixel D-SP2.

When the first subpixel SP1 and the second subpixel SP2 are disposed in the same row, the first to fourth scan signal lines SCL1 to SCL4 and the emission control signal line EML may be connected to the first dummy subpixel D-SP1, the first subpixel SP1, the second subpixel SP2, and the second dummy subpixel D-SP2.

The driving voltage VDD, the bias voltage VOBS, and the initialization voltage VINT may be supplied to the first dummy subpixel D-SP1, the first subpixel SP1, the second subpixel SP2, and the second dummy subpixel D-SP2.

The first subpixel circuit SPC1 may receive the first data voltage VDATA1 through the first data line DL1, and the second subpixel circuit SPC2 may receive the second data voltage VDATA2 through the second data line DL2.

The first reset voltage line VARL1 to which the first reset voltage VAR1 is applied may be connected to the fifth node N5 in the first subpixel circuit SPC1. Here, the first reset voltage VAR1 may correspond to the first common signal CS1. The first reset voltage line VARL1 may correspond to the first common signal line CSL1.

In other words, the first subpixel circuit SPC1 may connect the fifth node N5 to the first reset voltage line VARL1. The first subpixel circuit SPC1 may receive the first reset voltage VAR1 from the first reset voltage line VARL1 connected to the fifth node N5.

The second reset voltage line VARL2 to which the second reset voltage VAR2 is applied may be connected to the fifth node N5 in the second subpixel circuit SPC2. Here, the second reset voltage VAR2 may correspond to the second common signal CS2. The second reset voltage line VARL2 may correspond to the second common signal line CSL2.

In other words, the second subpixel circuit SPC2 may connect the fifth node N5 to the second reset voltage line VARL2. The second subpixel circuit SPC2 may receive the second reset voltage VAR2 from the second reset voltage line VARL2 connected to the fifth node N5.

The first dummy subpixel circuit D-SPC1 may be connected to the first dummy signal line 521 through the fifth node N5. The first dummy signal line 521 may be connected to the first signal supply unit 511.

The first signal supply unit 511 may receive the first to third reset voltages VAR1, VAR2, and VAR3 from the first to third reset voltage lines VARL1, VARL2, and VARL3. Here, the first to third reset voltage lines VARL1, VARL2, and VARL3 may respectively correspond to the first to third common signal lines CSL1, CSL2, and CSL3, and the first to third reset voltages VAR1, VAR2, and VAR3 may respectively correspond to the first to third common signals CS1, CS2, and CS3.

After the repair process, the first signal supply unit 511 may output one (e.g., the first reset voltage VAR1) of the first to third reset voltages VAR1, VAR2, and VAR3 to the first dummy signal line 521. For example, after the repair process, in the first signal supply unit 511, one (e.g., the first reset voltage line VARL1) of the first to third reset voltage lines VARL1, VARL2, and VARL3 and the first dummy signal line 521 may be connected.

However, before the repair process, in the first signal supply unit 511, none of the first to third reset voltage lines VARL1, VARL2, and VARL3 may be connected to the first dummy signal line 521.

The second dummy subpixel circuit D-SPC2 may be connected to the second dummy signal line 522 through the fifth node N5. The second dummy signal line 522 may be connected to the second signal supply unit 512.

The second signal supply unit 512 may receive the first to third reset voltages VAR1, VAR2, and VAR3 from the first to third reset voltage lines VARL1, VARL2, and VARL3.

After the repair process, the second signal supply unit 512 may output one (e.g., the second reset voltage VAR2) of the first to third reset voltages VAR1, VAR2, and VAR3 to the second dummy signal line 522. For example, after the repair process, in the second signal supply unit 512, one (e.g., the second reset voltage line VARL2) of the first to third reset voltage lines VARL1, VARL2, and VARL3 and the second dummy signal line 522 may be connected.

However, before the repair process, in the second signal supply unit 512, none of the first to third reset voltage lines VARL1, VARL2, and VARL3 may be connected to the first dummy signal line 521.

The dummy connection control line 500 may be disposed in (across or over) the first non-display area NDA1, the display area DA, and the second non-display area NDA2, and may be disposed adjacent to the first dummy subpixel circuit D-SPC1, the first subpixel circuit SPC1, the second subpixel circuit SPC2, and the second dummy subpixel circuit D-SPC2.

The dummy connection control line 500 may be disposed while extending through the first area BA1 between the first subpixel circuit SPC1 and the first light emitting element ED1 and the second area BA2 between the second subpixel circuit SPC2 and the second light emitting element ED2.

Before the repair process, the first subpixel circuit SPC1 may be electrically connected to the first pixel electrode PE1, the dummy connection control line 500 may be electrically separated from the first pixel electrode PE1 in the first area BA1, and the first dummy subpixel circuit D-SPC1 may be electrically separated from the dummy connection control line 500.

Before the repair process, the second subpixel circuit SPC2 may be electrically connected to the second pixel electrode PE2, the dummy connection control line 500 may be electrically separated from the second pixel electrode PE2 in the second area BA2, and the second dummy subpixel circuit D-SPC2 may be electrically separated from the dummy connection control line 500.

Figure 13:
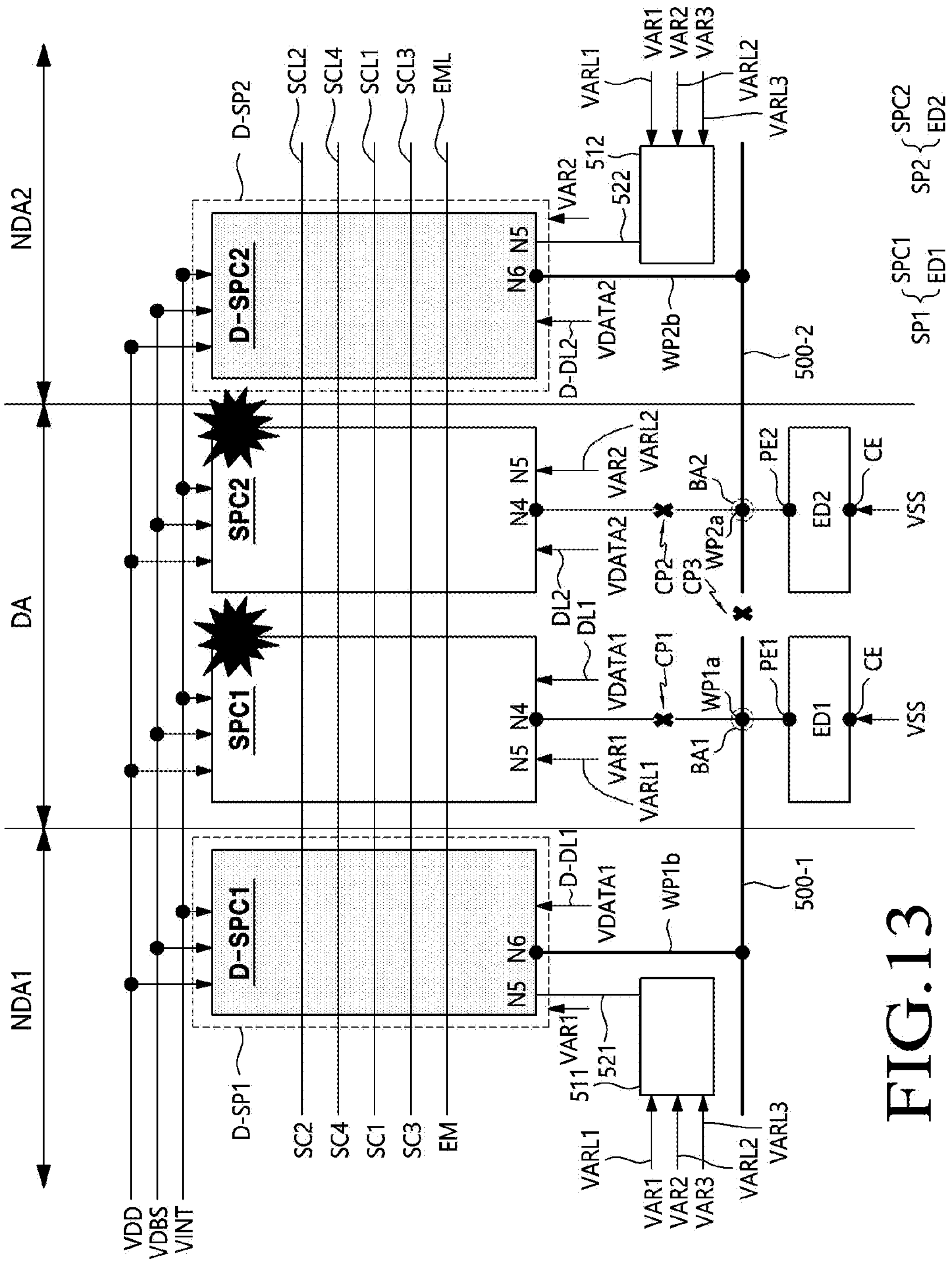
Figure 14:
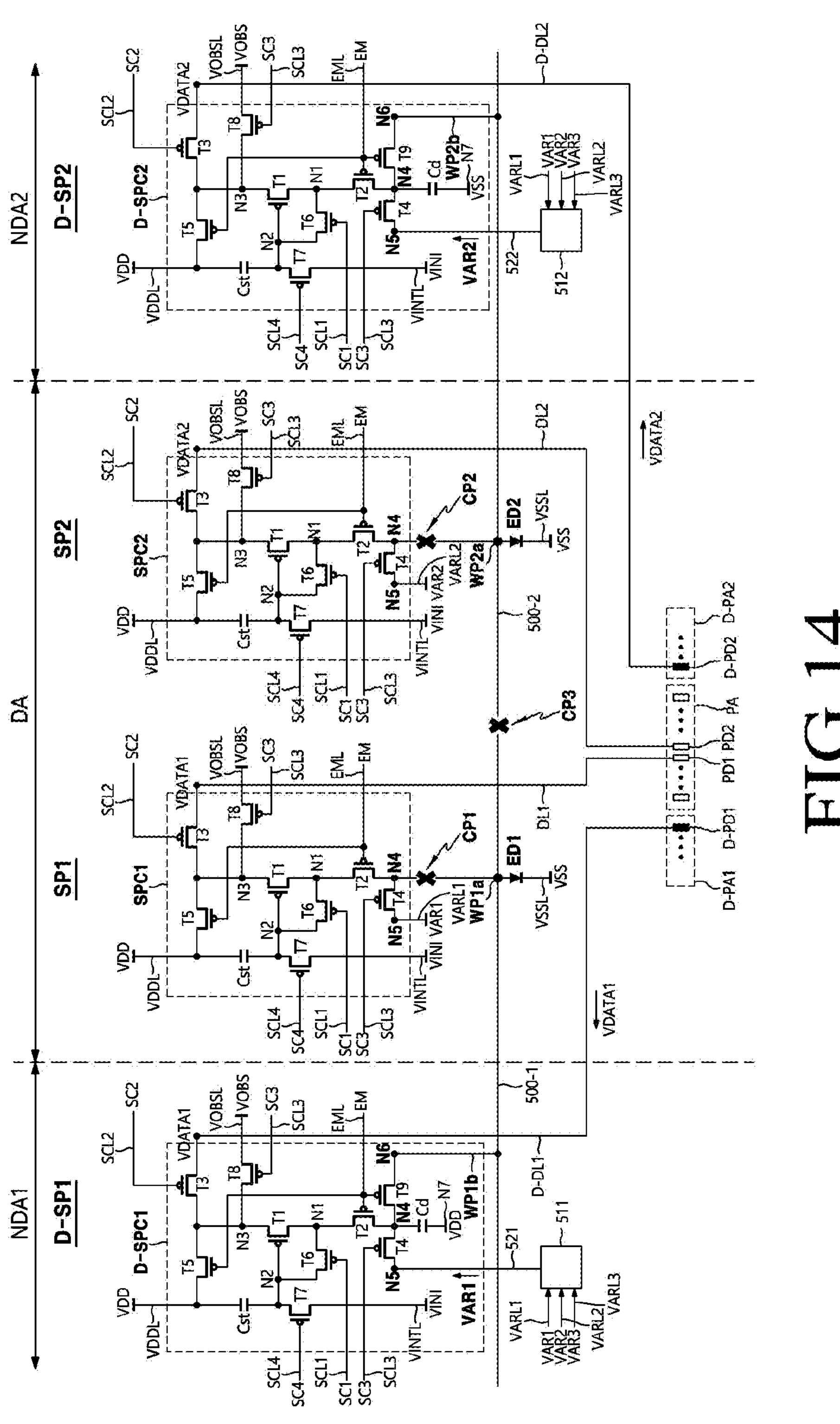
FIG. 14 illustrates, in detail, a first dummy subpixel, a first subpixel, a second subpixel, and a second dummy subpixel after a repair process of a display panel according to embodiments of the disclosure.

FIG. 13 illustrates a first dummy subpixel D-SP1, a first subpixel SP1, a second subpixel SP2, and a second dummy subpixel D-SP2 after a repair process of a display panel 110 according to embodiments of the disclosure. FIG. 14 illustrates, in detail, a first dummy subpixel D-SP1, a first subpixel SP1, a second subpixel SP2, and a second dummy subpixel D-SP2 after a repair process of a display panel 110 according to embodiments of the disclosure. In the following description, FIGS. 9 to 12 are also referred to. Further, it is assumed that a repair process for defects (two-point successive defects) that have occurred in both the first subpixel circuit SPC1 and the second subpixel circuit SPC2 has been performed.

Referring to FIGS. 13 and 14, the connection between the fourth node N4 of the first subpixel circuit SPC1 and the first pixel electrode PE1 of the first light emitting element ED1 may be broken as the first cutting process is performed at the first cutting point CP1 during the repair process for two-point successive defects. Further, the connection between the fourth node N4 of the second subpixel circuit SPC2 and the second pixel electrode PE2 of the second light emitting element ED2 may be broken by the second cutting process at the second cutting point CP2.

In the repair process for two consecutive defects, as the third cutting process is performed at the third cutting point CP3, the dummy connection control line 500 may be cut between the first area BA1 and the second area BA2, so that the dummy connection control line 500-1 and the second dummy connection control line 500-2 may be spaced apart and separated.

In the repair process for two-point successive defects, as the first welding process is performed at the first welding point WP1*a* in the first area BA1, the first pixel electrode PE1 and the first dummy connection control line 500-1 may be connected. Further, as the third welding process is performed at the third welding point WP2*a* in the second area BA2, the second pixel electrode PE2 and the second dummy connection control line 500-2 may be connected.

In the repair process for two-point successive defects, the sixth node N6 in the first dummy subpixel circuit D-SPC1 may be connected to the first dummy connection control line 500-1, and the sixth node N6 in the second dummy subpixel circuit D-SPC2 may be connected to the second dummy connection control line 500-2.

More specifically, as the second welding process is performed at the second welding point WP1*b* during the repair process for two-point consecutive defects, the sixth node N6 of the first dummy subpixel circuit D-SPC1 may be connected to the first dummy connection control line 500-1. Further, as the fourth welding process is performed at the fourth welding point WP2*b*, the sixth node N6 of the second dummy subpixel circuit D-SPC2 may be connected to the second dummy connection control line 500-2.

During the repair process for two-point successive defects, the first dummy signal line 521 to which the first reset voltage VAR1 is applied may be connected to the fifth node N5 in the first dummy subpixel circuit D-SPC1.

Specifically, in the repair process for two-point successive defects, in the first signal supply unit 511, the first reset voltage line VARL1 among the first to third reset voltage lines VARL1 to VARL3 and the first dummy signal line 521 may be electrically connected to each other. Accordingly, in the first signal supply unit 511, the first reset voltage VAR1 among the first to third reset voltages VAR1 to VAR3 supplied from the first to third reset voltage lines VAR1 to VAR3 may be output to the first dummy signal line 521. The first reset voltage VAR1 input to the first dummy signal line 521 may be applied to the fifth node N5 of the first dummy subpixel circuit D-SPC1.

During the repair process for two-point successive defects, the second dummy signal line 522 to which the second reset voltage VAR2 is applied may be connected to the fifth node N5 in the second dummy subpixel circuit D-SPC2.

Specifically, in the repair process for two-point successive defects, in the second signal supply unit 512, the second reset voltage line VARL2 among the first to third reset voltage lines VARL1 to VARL3 and the second dummy signal line 522 may be electrically connected to each other. Accordingly, in the second signal supply unit 512, the second reset voltage VAR2 among the first to third reset voltages VAR1 to VAR3 supplied from the first to third reset voltage lines VAR1 to VAR3 may be output to the second dummy signal line 522. The second reset voltage VAR2 input to the second dummy signal line 522 may be applied to the fifth node N5 of the second dummy subpixel circuit D-SPC2.

Referring to FIGS. 13 and 14, the pad area PA in the non-display area NDA of the display panel 110 may include a first pad PD1 electrically connected to the first data line DL1 and a second pad PD2 electrically connected to the second data line DL2.

For a repair process, the display panel 110 according to embodiments of the disclosure may include a first dummy data line D-DL1 connected to the first dummy subpixel circuit D-SPC1, a second dummy data line D-DL2 connected to the second dummy subpixel circuit D-SPC2, a first dummy pad D-PD1 connected to the first dummy data line D-DL1, and a second dummy pad D-PD2 connected to the second dummy data line D-DL2.

The first dummy pad D-PD1 may be disposed in the first dummy pad area D-PA1 positioned on one side of the pad area PA, and the second dummy pad D-PD2 may be disposed in the second dummy pad area D-PA2 positioned on the other side of the pad area PA.

After the repair process for defects in the first subpixel circuit SPC1 is performed, when the connection between the first subpixel circuit SPC1 and the first light emitting element ED1 is broken, the first data voltage VDATA1 for enabling the first light emitting element ED1 to emit light with a desired first luminance may be applied to the first dummy subpixel circuit D-SPC1 through the first dummy data line D-DL1.

After the repair process for defects in the second subpixel circuit SPC2 is performed, when the connection between the second subpixel circuit SPC2 and the second light emitting element ED2 is broken, the second data voltage VDATA2 for enabling the second light emitting element ED2 to emit light with a desired second luminance may be applied to the second dummy subpixel circuit D-SPC2 through the second dummy data line D-DL2.

For example, both before and after the repair process for defects in the first subpixel circuit SPC1 is performed, the first pad PD1 and the first dummy pad D-PD1 may be not electrically connected. In this case, the data driving circuit 120 may directly output the first data voltage VDATA1 to the first pad PD1 before the repair process, and may directly output the first data voltage VDATA1 to the first dummy pad D-PD1 after the repair process.

Both before and after the repair process for defects in the second subpixel circuit SPC2 is performed, the second pad PD2 and the second dummy pad D-PD2 may be not electrically connected. In this case, the data driving circuit 120 may directly output the second data voltage VDATA2 to the second pad PD2 before the repair process, and may directly output the second data voltage VDATA2 to the second dummy pad D-PD2 after the repair process.

As another example, both before and after the repair process for defects in the first subpixel circuit SPC1 is performed, the first pad PD1 and the first dummy pad D-PD1 may be electrically connected. In this case, both before and after the repair process, the data driving circuit 120 may output the first data voltage VDATA1 to the first pad PD1. In this case, the first data voltage VDATA1 input to the first pad PD1 may be transferred to the first dummy pad D-PD1.

Both before and after the repair process for defects in the second subpixel circuit SPC2 is performed, the second pad PD2 and the second dummy pad D-PD2 may be electrically connected. In this case, both before and after the repair process, the data driving circuit 120 may output the second data voltage VDATA2 to the second pad PD2. In this case, the second data voltage VDATA2 input to the second pad PD2 may be transferred to the second dummy pad D-PD2.

When the first subpixel SP1 is driven after the repair process for two-point successive defects is completed, the first transistor T1 in the first dummy subpixel circuit D-SPC1 may serve as a driving transistor for supplying the first driving current to the first light emitting element ED1 in the first subpixel SP1 in which the defect has been repaired. Accordingly, when the first driving current is supplied by the first dummy subpixel circuit T1 in the first dummy subpixel circuit D-SPC1, the second transistor T2 and the ninth transistor T9 in the first dummy subpixel circuit D-SPC1 may be in a turned-on state. The first driving current generated in the first dummy subpixel circuit D-SPC1 may be supplied to the first dummy connection control line 500-1 through the second transistor T2 and the ninth transistor T9 in the first dummy subpixel circuit D-SPC1. The first driving current supplied to the first dummy connection control line 500-1 may be input to the first pixel electrode PE1 of the first light emitting element ED1. Accordingly, the first light emitting element ED1 may normally emit light.

Further, when the second subpixel SP2 is driven after the repair process for two successive defects is completed, the first transistor T1 in the second dummy subpixel circuit D-SPC2 may serve as a driving transistor to supply the second driving current to the second light emitting element ED2 in the second subpixel SP2 in which the defect has been repaired. Accordingly, when the second driving current is supplied by the first transistor T1 in the second dummy subpixel circuit D-SPC2, the second transistor T2 and the ninth transistor T9 in the second dummy subpixel circuit D-SPC2 may be in a turned-on state. The second driving current generated in the second dummy subpixel circuit D-SPC2 may be supplied to the second dummy connection control line 500-2 through the second transistor T2 and the ninth transistor T9 in the second dummy subpixel circuit D-SPC2. The second driving current supplied to the second dummy connection control line 500-2 may be input to the second pixel electrode PE2 of the second light emitting element ED2. Accordingly, the second light emitting element ED2 may normally emit light.

Hereinafter, each of the first signal supply unit 511 and the second signal supply unit 512 is described in more detail.

FIGS. 15A, 15B, 16A, and 16B illustrate a welding-based repair process in each of a first signal supply unit 511 and a second signal supply unit 512 of a display panel 110 according to embodiments of the disclosure.

Figure 15A:
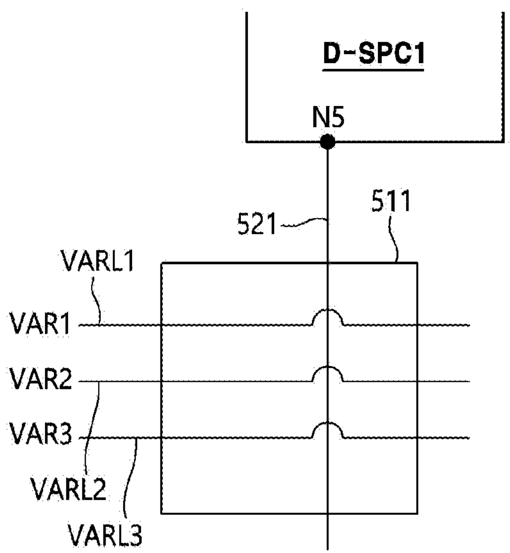
FIGS. 15A, 15B, 16A, and 16B illustrate a welding-based repair process in each of a first signal supply unit and a second signal supply unit of a display panel according to embodiments of the disclosure.
Figure 15B:
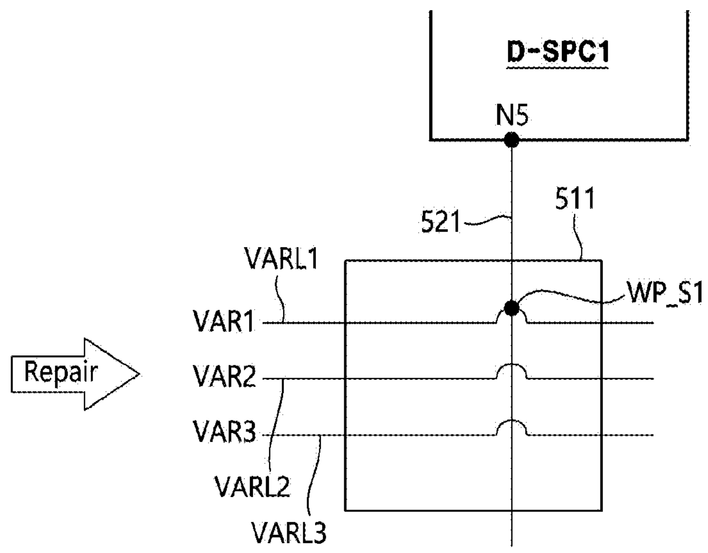
Figure 16A:
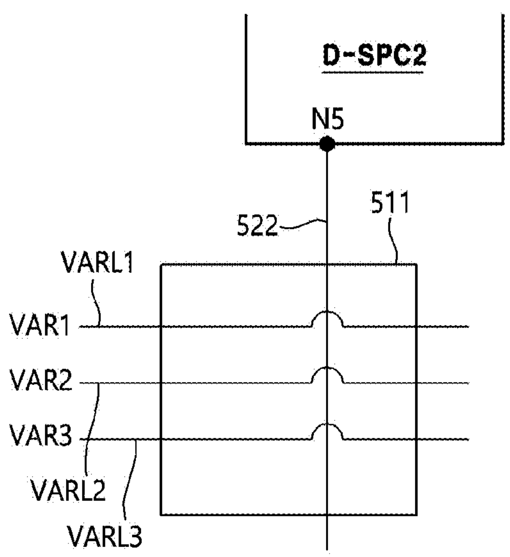
Figure 16B:
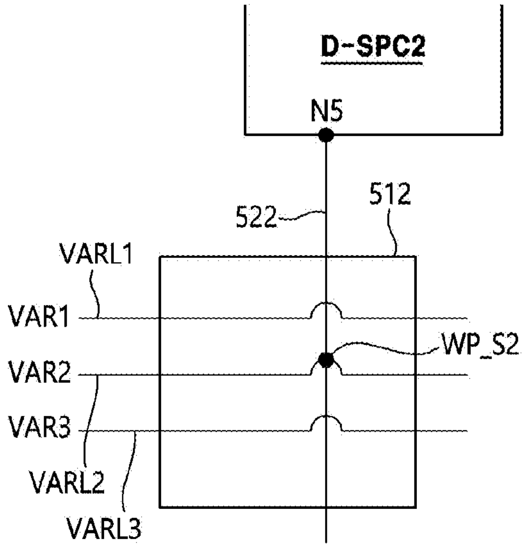

FIG. 15A illustrates the first signal supply unit 511 in the state before the welding-based repair process, and FIG. 15B illustrates the first signal supply unit 511 in the state after the welding-based repair process. FIG. 16A illustrates the second signal supply unit 512 in the state before the welding-based repair process, and FIG. 16B illustrates the second signal supply unit 512 in the state after the welding-based repair process.

Referring to FIGS. 15A and 15B, the first signal supply unit 511 may include first to third reset voltage lines VARL1, VARL2, and VARL3 and a first dummy signal line 521. The first to third reset voltage lines VARL1, VARL2, and VARL3, respectively, may transfer the first to third reset voltages VAR1, VAR2, and VAR3 and may cross and overlap the first dummy signal line 521. Here, the first to third reset voltages VAR1, VAR2, and VAR3 may correspond to the first to third common signals CS1, CS2, and CS3. The first to third reset voltage lines VARL1, VARL2, and VARL3 may correspond to the first to third common signal lines CSL1, CSL2, and CSL3.

Referring to FIG. 15A, before the repair process, each of the first to third reset voltage lines VARL1, VARL2, and VARL3 only overlaps the first dummy signal line 521, but is not electrically connected to the first dummy signal line 521. Here, the first to third reset voltage lines VARL1, VARL2, and VARL3 and the first dummy signal line 521 may be disposed in different metal layers.

Referring to FIG. 15B, when the connection between the first subpixel circuit SPC1 and the first light emitting element ED1 is broken after the repair process, the first reset voltage line VARL1 among the first to third reset voltage lines VARL1, VARL2, and VARL3 may be electrically connected to the first dummy signal line 521 through the first connection pattern WP_S1.

The first connection pattern WP_S1 may be a welding pattern connecting the first reset voltage line VARL1 to which the first reset voltage VAR1 is applied among the first to third reset voltage lines VARL1, VARL2, and VARL3 and the first dummy signal line 521.

Accordingly, the first reset voltage VAR1 may be transferred to the first dummy subpixel circuit D-SPC1 through the first dummy signal line 521 connected to the first reset voltage line VARL1 by the first connection pattern WP_S1.

Referring to FIGS. 16A and 16B, the second signal supply unit 512 may include first to third reset voltage lines VARL1, VARL2, and VARL3 and a second dummy signal line 522. The first to third reset voltage lines VARL1, VARL2, and VARL3, respectively, may transfer the first to third reset voltages VAR1, VAR2, and VAR3 and may cross and overlap the second dummy signal line 522. Here, the first to third reset voltages VAR1, VAR2, and VAR3 may correspond to the first to third common signals CS1, CS2, and CS3. The first to third reset voltage lines VARL1, VARL2, and VARL3 may correspond to the first to third common signal lines CSL1, CSL2, and CSL3.

Referring to FIG. 16A, before the repair process, each of the first to third reset voltage lines VARL1, VARL2, and VARL3 only overlaps the second dummy signal line 522, but is not electrically connected to the second dummy signal line 522. Here, the first to third reset voltage lines VARL1, VARL2, and VARL3 and the second dummy signal line 522 may be disposed in different metal layers.

Referring to FIG. 16B, when the connection between the second subpixel circuit SPC2 and the second light emitting element ED2 is broken after the repair process, the second reset voltage line VARL2 among the first to third reset voltage lines VARL1, VARL2, and VARL3 may be electrically connected to the second dummy signal line 522 through the second connection pattern WP_S2.

The second connection pattern WP_S2 may be a welding pattern connecting the second reset voltage line VARL2 to which the second reset voltage VAR2 is applied among the first to third reset voltage lines VARL1, VARL2, and VARL3 and the second dummy signal line 522.

Accordingly, the second reset voltage VAR2 may be transferred to the second dummy subpixel circuit D-SPC2 through the second dummy signal line 522 connected to the second reset voltage line VARL2 by the second connection pattern WP_S2.

FIGS. 17A, 17B, 18A, and 18B illustrate a switch-based repair process in each of a first signal supply unit 511 and a second signal supply unit 512 of a display panel 110 according to embodiments of the disclosure.

Figure 17A:
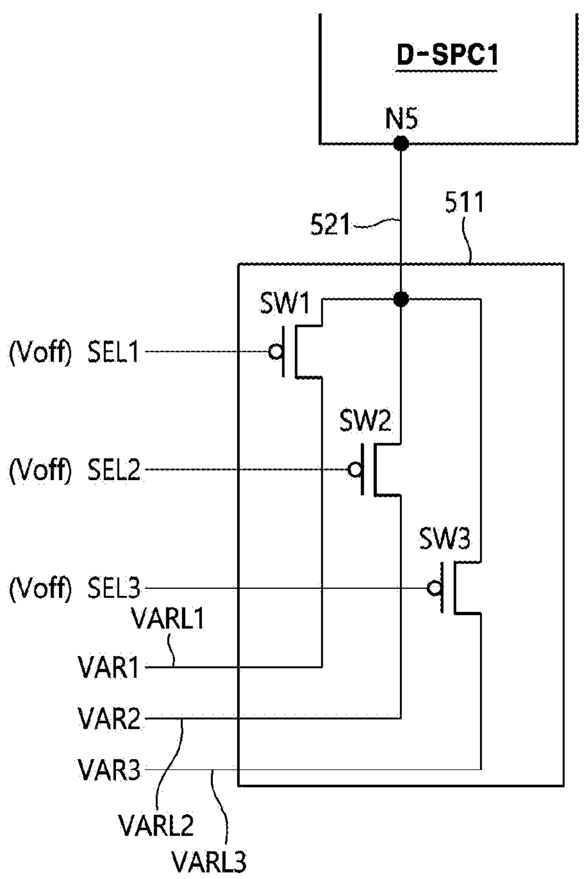
FIGS. 17A, 17B, 18A, and 18B illustrate a switch-based repair process in each of a first signal supply unit and a second signal supply unit of a display panel according to embodiments of the disclosure.
Figure 17B:
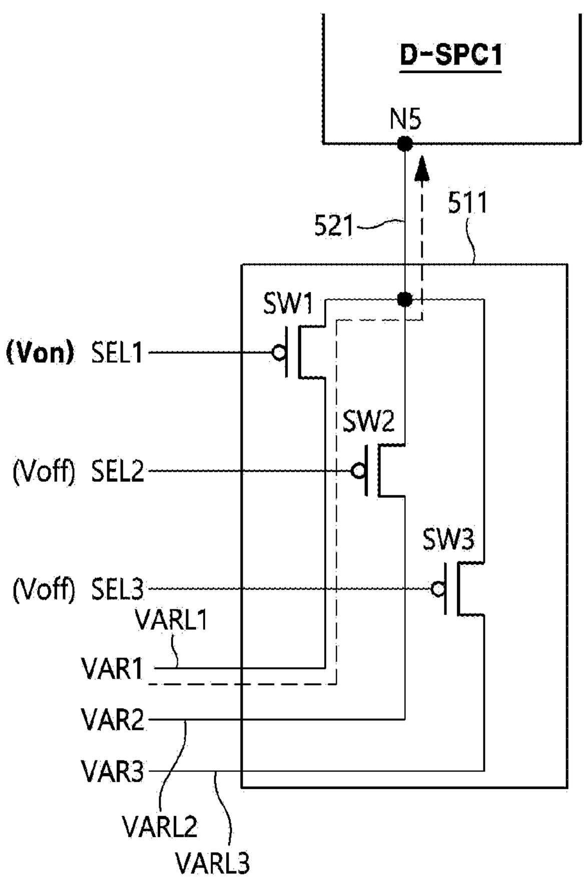
Figure 18A:
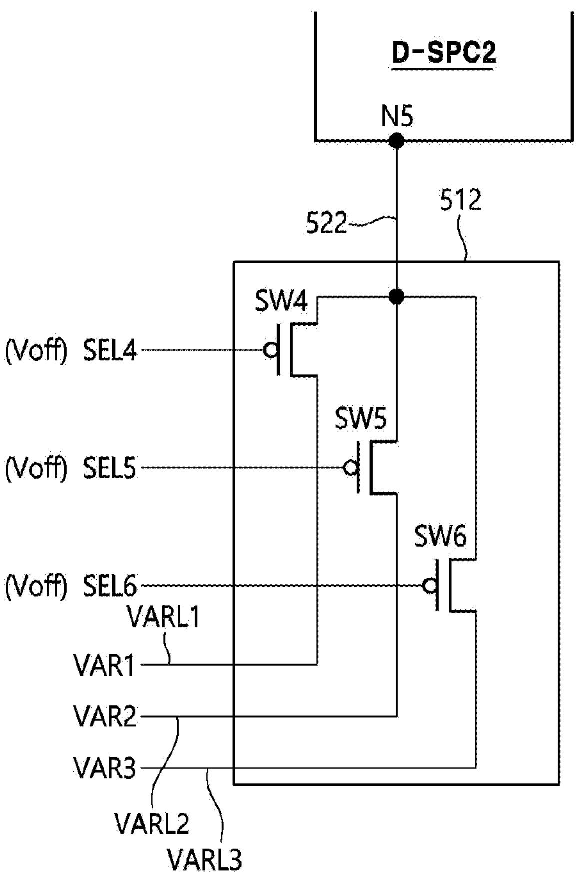
Figure 18B:
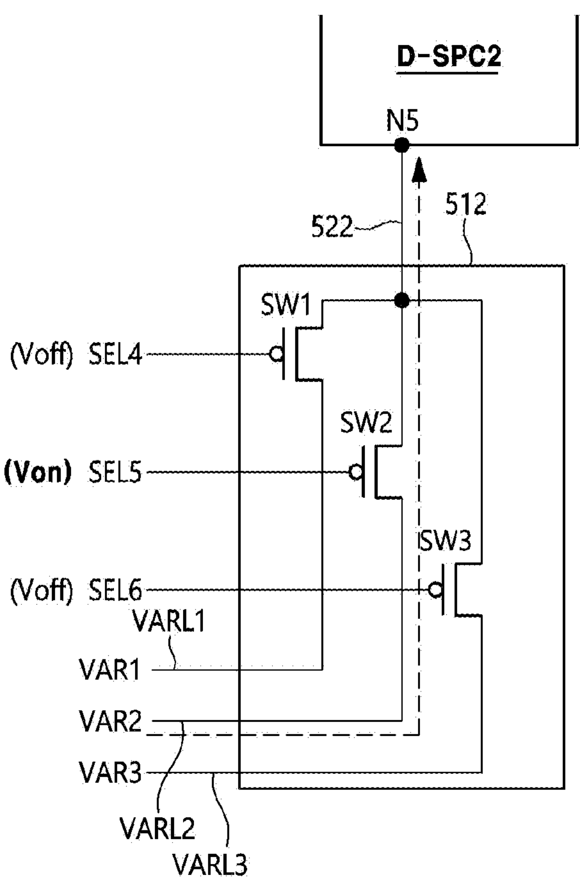

FIG. 17A illustrates the first signal supply unit 511 in the state before the switch-based repair process, and FIG. 17B illustrates the first signal supply unit 511 in the state after the switch-based repair process. FIG. 18A illustrates the second signal supply unit 512 in the state before the switch-based repair process, and FIG. 18B illustrates the second signal supply unit 512 in the state after the switch-based repair process.

Referring to FIGS. 17A and 17B, the first signal supply unit 511 may include first to third switching transistors SW1, SW2, and SW3 that are controlled to be selectively turned on/off by first to third selection control signals SEL1, SEL2, and SEL3, respectively, and control electrical connection between the first to third reset voltage lines VARL1, VARL2, and VARL3 and the first dummy signal line 521.

The first to third reset voltage lines VARL1, VARL2, and VARL3 may transfer the first to third reset voltages VAR1, VAR2, and VAR3, respectively. Here, the first to third reset voltages VAR1, VAR2, and VAR3 may correspond to the first to third common signals CS1, CS2, and CS3. The first to third reset voltage lines VARL1, VARL2, and VARL3 may correspond to the first to third common signal lines CSL1, CSL2, and CSL3.

Referring to FIG. 17A, before the repair process, the first to third selection control signals SEL1, SEL2, and SEL3 may have a turn-off level voltage Voff capable of turning off the first to third switching transistors SW1, SW2, and SW3. Accordingly, the first to third reset voltage lines VARL1, VARL2, and VARL3 are not electrically connected to the first dummy signal line 521.

Referring to FIG. 17B, after the repair process, when the connection between the first subpixel circuit SPC1 and the first light emitting element ED1 is broken, among the first to third selection control signals SEL1, SEL2, and SEL3, the first selection control signal SEL1 may have a turn-on level voltage Von capable of turning on the first switching transistor SW1, and the second and third selection control signals SEL2 and SEL3 may have a turn-off level voltage Voff capable of turning off the second and third switching transistors SW2 and SW3.

Thus, among the first to third switching transistors SW1, SW2, and SW3, the first switching transistor SW1 may be in a turned-on state, and the remaining second and third switching transistors SW2 and SW3 may be in a turned-off state.

The first switching transistor SW1 may connect the first reset voltage line VARL1 and the first dummy signal line 521 according to the turn-on level voltage Von of the first selection control signal SEL1.

The first reset voltage VAR1 applied to the first reset voltage line VARL1 may be transferred to the first dummy signal line 521 through the first switching transistor SW1 and input to the first dummy subpixel circuit D-SPC1.

Referring to FIGS. 18A and 18B, the second signal supply unit 512 may include fourth to sixth switching transistors SW4, SW5, and SW6 that are controlled to be selectively turned on/off by the fourth to sixth selection control signals SEL4, SEL5, and SEL6, respectively, to control electrical connection between the first to third reset voltage lines VARL1, VARL2, and VARL3 and the second dummy signal line 522.

The first to third reset voltage lines VARL1, VARL2, and VARL3 may transfer the first to third reset voltages VAR1, VAR2, and VAR3, respectively. Here, the first to third reset voltages VAR1, VAR2, and VAR3 may correspond to the first to third common signals CS1, CS2, and CS3. The first to third reset voltage lines VARL1, VARL2, and VARL3 may correspond to the first to third common signal lines CSL1, CSL2, and CSL3.

Referring to FIG. 18A, before the repair process, the fourth to sixth selection control signals SEL4, SEL5, and SEL6 may have a turn-off level voltage Voff capable of turning off the fourth to sixth switching transistors SW4, SW5, and SW6. Accordingly, the first to third reset voltage lines VARL1, VARL2, and VARL3 are not electrically connected to the second dummy signal line 522.

Referring to FIG. 18B, after the repair process, when the connection between the second subpixel circuit SPC2 and the second light emitting element ED2 is broken, among the fourth to sixth selection control signals SEL4, SEL5, and SEL6, the fifth selection control signal SEL5 may have a turn-on level voltage Von capable of turning on the fifth switching transistor SW5, and the fourth and sixth selection control signals SEL4 and SEL6 may have a turn-off level voltage Voff capable of turning off the fourth and sixth switching transistors SW4 and SW6.

Thus, among the fourth to sixth selection control signals SEL4, SEL5, and SEL6, the fifth switching transistor SW5 may be in a turned-on state, and the remaining fourth and sixth switching transistors SW4 and SW6 may be in a turned-off state.

The fifth switching transistor SW5 may connect the second reset voltage line VARL2 and the second dummy signal line 522 according to the turn-on level voltage Von of the fifth selection control signal SEL5.

The second reset voltage VAR2 applied to the second reset voltage line VARL2 may be transferred to the second dummy signal line 522 through the fifth switching transistor SW5 and input to the second dummy subpixel circuit D-SPC2.

In some embodiments, the plurality of switching transistors is each configured to be selectively turned on or off by a corresponding selection control signal among a plurality of selection control signals, to control an electrical connection between the plurality of common signal lines CSL1, CSL2, and CSL3 and the dummy signal line (e.g., the first dummy signal line 521). Here, when a defect is detected in a subpixel circuit (e.g., the first subpixel circuit), a corresponding switching transistor is turned on to establish an electrical connection between a common signal line among the plurality of common signals CS1, CS2, and CS3 (e.g., the first common signal line) and a dummy signal line (e.g., the first dummy signal line), thereby applying the first common signal to the first dummy subpixel circuit.

Figure 19:
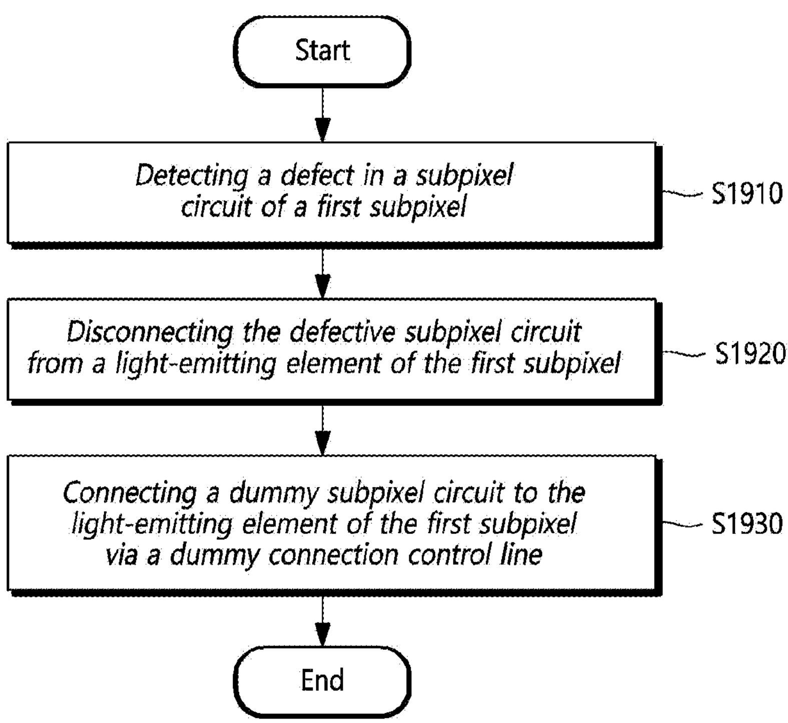
FIG. 19 is a flow chart of a repair method according to embodiments of the disclosure.

FIG. 19 is a flow chart of a repair method according to embodiments of the disclosure.

Referring to FIG. 19, the repair method according to various embodiments of the disclosure may comprise a step S1910 of detecting a defect in a subpixel circuit of a first subpixel disposed in a display area of the display device, a step S1920 of electrically disconnecting the defective subpixel circuit from a light-emitting element of the first subpixel, and a step S1930 of electrically connecting a dummy subpixel circuit disposed in a non-display area of the display device to the light-emitting element of the first subpixel via a dummy connection control line.

According to the repair method according to embodiments of the disclosure, a defective subpixel in a display device can be repaired to drive the defective subpixel normally.

Various embodiments of the disclosure are briefly described as follows.

A display device according to various embodiments of the disclosure may comprise a first subpixel disposed in a display area, and including a first subpixel circuit to which a first common signal among a plurality of common signals is applied and a first light emitting element adjacent to the first subpixel circuit, a second subpixel disposed in the display area, and including a second subpixel circuit to which a second common signal among the plurality of common signals is applied and a second light emitting element adjacent to the second subpixel circuit, a first dummy subpixel disposed in a non-display area and including a first dummy subpixel circuit, a first dummy signal line disposed in the non-display area and connected to the first dummy subpixel circuit, and a dummy connection control line disposed across (in or over) the display area and the non-display area and disposed adjacent to the first dummy subpixel circuit, the first subpixel circuit, and the second subpixel circuit.

According to various embodiments of the disclosure, the dummy connection control line may be configured to electrically connect the first light-emitting element or the second light-emitting element to the first dummy subpixel circuit.

According to various embodiments of the disclosure, when a defect occurs in the first subpixel circuit preventing the first light-emitting element from operating normally, the dummy connection control line may be configured to electrically connect the first light-emitting element to the first dummy subpixel circuit.

According to various embodiments of the disclosure, the first subpixel and the second subpixel may be disposed adjacent to each other. The first light emitting element may emit light of a first wavelength, and the second light emitting element may emit light of a second wavelength different from the first wavelength.

The display device according to various embodiments of the disclosure may further comprise a third subpixel disposed in the display area, and including a third subpixel circuit to which a third common signal among the plurality of common signals is applied and a third light emitting element adjacent to the third subpixel circuit.

According to various embodiments of the disclosure, the third subpixel may be disposed adjacent to the first subpixel and the second subpixel. The third light emitting element may emit light of a third wavelength different from the first wavelength and the second wavelength.

The display device according to various embodiments of the disclosure may further comprise a first pixel electrode of the first light emitting element, a second pixel electrode of the second light emitting element, a third pixel electrode of the second light emitting element, and a common electrode overlapping the first pixel electrode, the second pixel electrode, and the third pixel electrode.

According to various embodiments of the disclosure, in a predetermined portion of a driving period of the first subpixel, the second subpixel, and the third subpixel, the first pixel electrode and the common electrode may have a first voltage difference, the second pixel electrode and the common electrode may have a second voltage difference, and the third pixel electrode and the common electrode may have a third voltage difference. At least one of the first voltage difference, the second voltage difference, and the third voltage difference may have a value different from the rest.

According to various embodiments of the disclosure, the first common signal may be a first reset voltage, the second common signal may be a second reset voltage, and the third common signal may be a third reset voltage.

According to various embodiments of the disclosure, when the first voltage difference among the first voltage difference, the second voltage difference, and the third voltage difference is the largest, the first common signal among the first common signal, the second common signal, and the third common signal may be set to be the highest.

According to various embodiments of the disclosure, when the second voltage difference among the first voltage difference, the second voltage difference, and the third voltage difference is the largest, the second common signal among the first common signal, the second common signal, and the third common signal may be set to be the highest.

According to various embodiments of the disclosure, when the third voltage difference among the first voltage difference, the second voltage difference, and the third voltage difference is the largest, the third common signal among the first common signal, the second common signal, and the third common signal may be set to be the highest.

According to various embodiments of the disclosure, the dummy connection control line may pass through a first area between the first subpixel circuit and the first light emitting element and a second area between the second subpixel circuit and the second light emitting element. When a connection between the first subpixel circuit and the first light emitting element is broken, the dummy connection control line and the first light emitting element may be connected in the first area, the first dummy subpixel circuit and the dummy connection control line may be connected, and the first common signal among the plurality of common signals may be applied to the first dummy signal line.

The display device according to various embodiments of the disclosure may further comprise a first data line connected to the first subpixel circuit, a first pad connected to the first data line, a first dummy data line connected to the first dummy subpixel circuit, and a first dummy pad connected to the first dummy data line.

According to various embodiments of the disclosure, when a connection between the first subpixel circuit and the first light emitting element is broken, a first data voltage for enabling the first light emitting element to emit light with a desired first luminance may be applied to the first dummy subpixel circuit through the first dummy data line.

The display device according to various embodiments of the disclosure may further comprise a plurality of common signal lines respectively transferring the plurality of common signals. Each of the plurality of common signal lines may overlap the first dummy signal line.

According to various embodiments of the disclosure, the plurality of common signal lines may be a plurality of reset voltage lines.

According to various embodiments of the disclosure, the display device may further comprise, when a connection between the first subpixel circuit and the first light emitting element is broken, a first connection pattern connecting the first common signal line to which the first common signal is applied among the plurality of common signal lines and the first dummy signal line.

According to various embodiments of the disclosure, the first common signal may be transferred to the first dummy subpixel circuit through the first dummy signal line connected to the first common signal line by the first connection pattern.

The display device according to various embodiments of the disclosure may further comprise a plurality of common signal lines respectively transferring the plurality of common signals, and a plurality of switching transistors controlled to be selectively turned on/off by a plurality of selection control signals, respectively, to control an electrical connection between the plurality of common signal lines and the first dummy signal line.

According to various embodiments of the disclosure, the plurality of switching transistors may include a first switching transistor controlled to be selectively turned on/off by a first selection control signal among the plurality of common signal lines and controlling an electrical connection between the first common signal line to which the first common signal is applied among the plurality of common signal lines and the first dummy signal line.

According to various embodiments of the disclosure, when a connection between the first subpixel circuit and the first light emitting element is broken, the first switching transistor may be in a turned-on state, among the plurality of switching transistors, a remaining switching transistor except for the first switching transistor may be in a turned-off state, the first switching transistor may connect the first common signal line and the first dummy signal line according to a turn-on voltage of the first selection control signal, and the first common signal applied to the first common signal line may be transferred to the first dummy signal line through the first switching transistor and input to the first dummy subpixel circuit.

The display device according to various embodiments of the disclosure may further comprise a second dummy subpixel disposed in the non-display area and including a second dummy subpixel circuit, and a second dummy signal line disposed in the non-display area and connected to the second dummy subpixel circuit.

According to various embodiments of the disclosure, the dummy connection control line may be disposed adjacent to the first dummy subpixel circuit, the first subpixel circuit, the second subpixel circuit, and the second dummy subpixel circuit.

According to various embodiments of the disclosure, the non-display area may include a first non-display area positioned on one side of the display area and a second non-display area positioned on another side of the display area, the first dummy subpixel and the first dummy signal line may be disposed in the first non-display area, and the second dummy subpixel and the second dummy signal line may be disposed in the second non-display area.

The display device according to various embodiments of the disclosure may further comprise a first data line connected to the first subpixel circuit, a second data line connected to the second subpixel circuit, a first dummy data line connected to the first dummy subpixel circuit, a second dummy data line connected to the second dummy subpixel circuit, a first pad connected to the first data line, a second pad connected to the second data line, a first dummy pad connected to the first dummy data line, and a second dummy pad connected to the second dummy data line.

According to various embodiments of the disclosure, when a connection between the first subpixel circuit and the first light emitting element is broken, and a connection between the second subpixel circuit and the second light emitting element is broken, a first data voltage for allowing the first light emitting element to emit light with a desired first luminance may be applied to the first dummy subpixel circuit through the first dummy data line, and a second data voltage for enabling the second light emitting element to emit light with a desired second luminance may be applied to the second dummy subpixel circuit through the second dummy data line.

According to various embodiments of the disclosure, the first pad and the second pad may be disposed in a pad area of the non-display area, the first dummy pad may be positioned on one side of the pad area, and the second dummy pad may be positioned on another side of the pad area.

According to various embodiments of the disclosure, the dummy connection control line may pass through a first area between the first subpixel circuit and the first light emitting element and a second area between the second subpixel circuit and the second light emitting element. When a connection between the first subpixel circuit and the first light emitting element is broken, and a connection between the second subpixel circuit and the second light emitting element is broken, the dummy connection control line and the first light emitting element may be connected in the first area, the dummy connection control line and the second light emitting element may be connected in the second area, the first dummy subpixel circuit and the dummy connection control line may be connected, and the second dummy subpixel circuit and the dummy connection control line may be connected, the first common signal may be applied to the first dummy signal line, and the second common signal may be applied to the second dummy signal line, and the dummy connection control line may be disconnected between the first area and the second area.

According to various embodiments of the disclosure, the first light emitting element and the second light emitting element may be disposed adjacent to each other and emit light of different colors, and each of the first light emitting element and the second light emitting element may include one or more light emitting layers.

In the display device according to various embodiments of the disclosure, each of the first subpixel circuit, the second subpixel circuit, the first dummy subpixel circuit, and the second dummy subpixel circuit may include first to fifth nodes, a first transistor connected between the first node and the third node, a second transistor controlled to be selectively turned on/off by an emission control signal to control an electrical connection between the first node and the fourth node, a third transistor controlled to be selectively turned on/off by a scan signal to control an electrical connection between a data line and the third node, and a fourth transistor controlled to be selectively turned on/off by another scan signal to control an electrical connection between the fourth node and the fifth node.

According to various embodiments of the disclosure, the first common signal line to which the first common signal is applied may be connected to the fifth node of the first subpixel circuit, the second common signal line to which the second common signal is applied may be connected to the fifth node of the second subpixel circuit, a first dummy signal line to which the first common signal is applied may be connected to the fifth node of the first dummy subpixel circuit, and a second dummy signal line to which the second common signal is applied may be connected to the fifth node of the second dummy subpixel circuit.

In the display device according to various embodiments of the disclosure, each of the first dummy subpixel circuit and the second dummy subpixel circuit may include a sixth node different from the first to fifth nodes, and a repair transistor controlling an electrical connection between the fourth node and the sixth node.

According to various embodiments of the disclosure, the repair transistor may be selectively turned on/off at the same time as the second transistor.

According to various embodiments of the disclosure, when a connection between the fourth node of the first subpixel circuit and the first pixel electrode of the first light emitting element is broken, and a connection between the fourth node of the second subpixel circuit and the second pixel electrode of the second light emitting element is broken, the sixth node in each of the first dummy subpixel circuit and the second dummy subpixel circuit may be connected to the dummy connection control line.

In the display device according to various embodiments of the disclosure, each of the first subpixel circuit, the second subpixel circuit, the first dummy subpixel circuit, and the second dummy subpixel circuit may further include a fifth transistor connected between a driving voltage line to which a driving voltage is applied and the fourth node.

In the display device according to various embodiments of the disclosure, each of the first dummy subpixel circuit and the second dummy subpixel circuit may further include a dummy capacitor between the fourth node and a seventh node to which the driving voltage is applied.

A display device according to embodiments of the disclosure may comprise a plurality of subpixels disposed in a display area and including a first subpixel and a second subpixel, and a plurality of dummy subpixel circuits disposed in a non-display area. The first subpixel may include a first light emitting element and a first subpixel circuit, and the second subpixel may include a second light emitting element and a second subpixel circuit. The first light emitting element and the first subpixel circuit may be electrically disconnected from each other, and the second light emitting element and the second subpixel circuit may be electrically disconnected from each other. The plurality of dummy subpixel circuits may include a first dummy subpixel circuit electrically connected to the first light emitting element and a second dummy subpixel circuit electrically connected to the second light emitting element.

According to various embodiments of the disclosure, the first light emitting element may emit light of a first wavelength, and the second light emitting element may emit light of a second wavelength. The second wavelength may be different from the first wavelength.

According to various embodiments of the disclosure, the first dummy subpixel circuit may receive a first common signal for resetting a first pixel electrode of the first light emitting element, and the second dummy subpixel circuit may receive a second common signal for resetting a second pixel electrode of the second light emitting element. The first common signal may be a first reset voltage for resetting a voltage state of the first pixel electrode, and the second common signal may be a second reset voltage for resetting a voltage state of the second pixel electrode.

According to various embodiments of the disclosure, the second common signal may have a different voltage than the first common signal.

The display device according to various embodiments of the disclosure may further comprise a first dummy connection control line connecting the first dummy subpixel circuit and a first pixel electrode of the first light emitting element, and a second dummy connection control line connecting the second dummy subpixel circuit and a second pixel electrode of the second light emitting element.

According to various embodiments of the disclosure, the first dummy connection control line and the second dummy connection control line may be separated.

According to various embodiments of the disclosure, at a predefined driving timing, a first reset voltage may be applied to a first pixel electrode of the first light emitting element, and a second reset voltage different from the first reset voltage may be applied to the second pixel electrode of the second light emitting element.

According to embodiments of the disclosure, there may be provided a display device that enables high yield.

According to embodiments of the disclosure, there may be provided a display device having a repair structure capable of normalizing a defective subpixel.

According to embodiments of the disclosure, there may be provided a display device with a defective subpixel normalized.

According to embodiments of the disclosure, there may be provided a display device having a repair structure capable of normalizing all of successively disposed subpixels when a defect occurs in all of the successively disposed subpixels.

According to embodiments of the disclosure, there may be provided a display device with all defects of successively disposed subpixels normalized.

According to embodiments of the disclosure, there may be provided a display device capable of recycling and process optimization and reducing manufacturing yields through an effective repair process for defects even when a defect occurs in at least one subpixel that is not disposed successively or in two or more subpixels that are disposed successively.

According to embodiments of the disclosure, a display device may include: a display area including a plurality of subpixels, wherein each subpixel comprises: a subpixel circuit; a light-emitting element, wherein the subpixel circuit and the light-emitting element are electrically disconnected from each other prior to defect correction; a non-display area including a plurality of dummy subpixel circuits; a dummy connection control line extending across the display area and the non-display area, the dummy connection control line disposed adjacent to the plurality of subpixel circuits and the plurality of dummy subpixel circuits; wherein, upon a defect occurring in a subpixel circuit of the plurality of subpixel circuits, the dummy connection control line is configured to establish an electrical connection between a dummy subpixel circuit in the non-display area and the light-emitting element of a subpixel having the defect.

According to embodiments of the disclosure, the display device may include a switching transistor configured to selectively turn on or off the electrical connection between the dummy subpixel circuit and the light-emitting element of the defective subpixel.

According to embodiments of the disclosure, the dummy connection control line is configured to connect different dummy subpixel circuits of the plurality of dummy subpixel circuits to compensate for multiple adjacent defective subpixels.

According to embodiments of the disclosure, the dummy connection control line includes a first section and a second section. In response detection of multiple adjacent defective subpixels, the dummy connection control line is cut at a selected cutting point to form a first dummy connection control line and a second dummy connection control line, enabling independent defect repair for each subpixel.

According to embodiments of the disclosure, the first dummy connection control line is welded to a first pixel electrode of a first light-emitting element at a first welding point, and the second dummy connection control line is welded to a second pixel electrode of a second light-emitting element at a second welding point.

According to embodiments of the disclosure, the first dummy connection control line and the second dummy connection control line are separated from each other.

According to embodiments of the disclosure, the dummy connection control line is configured to be divided into multiple sections upon defect detection. Here, each separated section is independently connected to a corresponding dummy subpixel circuit, and a first dummy subpixel circuit of the plurality of dummy subpixel circuits compensates for a first defective subpixel, and a second dummy subpixel circuit of the plurality of dummy subpixel circuits compensates for a second defective subpixel.

According to embodiments of the disclosure, a method for repairing a defective subpixel in a display device is described. The method includes detecting a defect in a subpixel circuit of a first subpixel disposed in a display area of the display device. The method includes electrically disconnecting the defective subpixel circuit from a light-emitting element of the first subpixel. The method includes electrically connecting a dummy subpixel circuit disposed in a non-display area of the display device to the light-emitting element of the first subpixel via a dummy connection control line. The method includes restoring the functionality of the first subpixel by addressing the defect through the establishment of an electrical connection between the dummy subpixel circuit and the light-emitting element of the first subpixel.

Although the embodiments of the disclosure have been described in more detail with reference to the accompanying drawings, the disclosure is not necessarily limited to these embodiments, and may be variously modified without departing from the technical spirit of the disclosure. Accordingly, the embodiments set forth herein are provided for illustrative purposes, but not to limit the scope of the disclosure, and should be appreciated that the scope of the disclosure is not limited by the embodiments. Thus, it should be noted that the above-described embodiments are provided as examples and should not be interpreted as limiting.

The various embodiments described above can be combined to provide further embodiments. [Note: essential matter cannot be incorporated by reference from foreign patents, foreign patent application or non-patent publications; however the U.S. PTO should allow the improperly incorporated subject matter to be expressly added to the specification by way of amendment without affecting the filing date. The ability to incorporate by reference to the ADS is untested. We strongly encourage you to explicitly list those references you wish to incorporate by reference at the appropriate location within the sentence.]

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a first subpixel disposed in a display area, and including a first subpixel circuit to which a first common signal among a plurality of common signals is applied and a first light emitting element adjacent to the first subpixel circuit;

a second subpixel disposed in the display area, and including a second subpixel circuit to which a second common signal among the plurality of common signals is applied and a second light emitting element adjacent to the second subpixel circuit;

a first dummy subpixel disposed in a non-display area and including a first dummy subpixel circuit;

a first dummy signal line disposed in the non-display area and connected to the first dummy subpixel circuit; and a dummy connection control line disposed across the display area and the non-display area and disposed adjacent to the first dummy subpixel circuit, the first subpixel circuit, and the second subpixel circuit, wherein the dummy connection control line is configured to electrically connect the first light emitting element or the second light emitting element to the first dummy subpixel circuit, and wherein the first dummy subpixel circuit includes:

a first transistor for supplying a driving current, a second transistor for allowing the driving current from the first transistor to flow, a fourth node located in a path through which the driving current passing through the second transistor flows, a fourth transistor for transferring a signal from the first dummy signal line to the fourth node, a repair transistor for allowing the driving current passing through the fourth node to flow, and a sixth node located between the repair transistor and the dummy connection control line, the driving current passing through the repair transistor flowing through the dummy connection control line, and wherein the repair transistor is selectively turned on or off at the same time as the second transistor.

2. The display device of claim 1, wherein, when a defect occurs in the first subpixel circuit preventing the first light emitting element from operating normally, the dummy connection control line is configured to electrically connect the first light emitting element to the first dummy subpixel circuit.

3. The display device of claim 1, wherein the first subpixel and the second subpixel are disposed adjacent to each other, and wherein the first light emitting element emits light of a first wavelength, and the second light emitting element emits light of a second wavelength different from the first wavelength.

4. The display device of claim 3, further comprising a third subpixel disposed in the display area, and including a third subpixel circuit to which a third common signal among the plurality of common signals is applied and a third light emitting element adjacent to the third subpixel circuit, wherein the third subpixel is disposed adjacent to the first subpixel and the second subpixel, and the third light emitting element emits light of a third wavelength different from the first wavelength and the second wavelength.

5. The display device of claim 4, further comprising:

a first pixel electrode of the first light emitting element;

a second pixel electrode of the second light emitting element;

a third pixel electrode of the second light emitting element; and a common electrode overlapping the first pixel electrode, the second pixel electrode, and the third pixel electrode, wherein in a selected portion of a driving period of the first subpixel, the second subpixel, and the third subpixel, the first pixel electrode and the common electrode have a first voltage difference, the second pixel electrode and the common electrode have a second voltage difference, and the third pixel electrode and the common electrode have a third voltage difference, and wherein at least one of the first voltage difference, the second voltage difference, and the third voltage difference has a value different from the rest.

6. The display device of claim 5, wherein when the first voltage difference among the first voltage difference, the second voltage difference, and the third voltage difference is the largest, the first common signal among the first common signal, the second common signal, and the third common signal is set to be the highest, wherein when the second voltage difference among the first voltage difference, the second voltage difference, and the third voltage difference is the largest, the second common signal among the first common signal, the second common signal, and the third common signal is set to be the highest, and wherein when the third voltage difference among the first voltage difference, the second voltage difference, and the third voltage difference is the largest, the third common signal among the first common signal, the second common signal, and the third common signal is set to be the highest.

7. The display device of claim 1, wherein the dummy connection control line extends through a first area between the first subpixel circuit and the first light emitting element and a second area between the second subpixel circuit and the second light emitting element, wherein, upon disconnection of the first subpixel circuit from the first light emitting element, the dummy connection control line establishes an electrical connection between the first light emitting element and the first dummy subpixel circuit, thereby enabling the first common signal among the plurality of common signals to be applied via the first dummy signal line.

8. The display device of claim 7, further comprising:

a first data line connected to the first subpixel circuit;

a first pad connected to the first data line;

a first dummy data line connected to the first dummy subpixel circuit; and a first dummy pad connected to the first dummy data line, wherein when a connection between the first subpixel circuit and the first light emitting element is broken, a first data voltage for enabling the first light emitting element to emit light with a desired first luminance is applied to the first dummy subpixel circuit through the first dummy data line.

9. The display device of claim 1, further comprising a plurality of common signal lines respectively transferring the plurality of common signals, wherein each of the plurality of common signal lines overlaps the first dummy signal line.

10. The display device of claim 9, further comprising, when a connection between the first subpixel circuit and the first light emitting element is broken, a first connection pattern connecting a first common signal line to which the first common signal is applied among the plurality of common signal lines and the first dummy signal line, wherein the first common signal is transferred to the first dummy subpixel circuit through the first dummy signal line connected to the first common signal line by the first connection pattern.

11. The display device of claim 1, further comprising:

a plurality of common signal lines respectively transferring the plurality of common signals; and a plurality of switching transistors, each configured to be selectively turned on or off by a corresponding selection control signal among a plurality of selection control signals, to control an electrical connection between the plurality of common signal lines and the first dummy signal line, wherein, when a defect is detected in the first subpixel circuit, a corresponding switching transistor is turned on to establish an electrical connection between a first common signal line of the plurality of common signal lines and the first dummy signal line, thereby applying the first common signal to the first dummy subpixel circuit.

12. The display device of claim 11, wherein the plurality of switching transistors include a first switching transistor controlled to be selectively turned on or off by a first selection control signal among the plurality of common signal lines and controlling an electrical connection between the first common signal line to which the first common signal is applied among the plurality of common signal lines and the first dummy signal line, wherein when a connection between the first subpixel circuit and the first light emitting element is broken, the first switching transistor is in a turned-on state, among the plurality of switching transistors, a remaining switching transistor except for the first switching transistor is in a turned-off state, the first switching transistor connects the first common signal line and the first dummy signal line according to a turn-on voltage of the first selection control signal, and the first common signal applied to the first common signal line is transferred to the first dummy signal line through the first switching transistor and input to the first dummy subpixel circuit.

13. The display device of claim 1, further comprising:

a second dummy subpixel disposed in the non-display area and including a second dummy subpixel circuit; and a second dummy signal line disposed in the non-display area and connected to the second dummy subpixel circuit, wherein the dummy connection control line is disposed adjacent to the first dummy subpixel circuit, the first subpixel circuit, the second subpixel circuit, and the second dummy subpixel circuit.

14. The display device of claim 13, wherein the non-display area includes a first non-display area positioned on one side of the display area and a second non-display area positioned on another side of the display area, wherein the first dummy subpixel and the first dummy signal line are disposed in the first non-display area, and wherein the second dummy subpixel and the second dummy signal line are disposed in the second non-display area.

15. The display device of claim 13, further comprising:

a first data line connected to the first subpixel circuit;

a second data line connected to the second subpixel circuit;

a first dummy data line connected to the first dummy subpixel circuit;

a second dummy data line connected to the second dummy subpixel circuit;

a first pad connected to the first data line;

a second pad connected to the second data line;

a first dummy pad connected to the first dummy data line; and a second dummy pad connected to the second dummy data line, wherein when a connection between the first subpixel circuit and the first light emitting element is broken and a connection between the second subpixel circuit and the second light emitting element is broken, a first data voltage for allowing the first light emitting element to emit light with a desired first luminance is applied to the first dummy subpixel circuit through the first dummy data line, and a second data voltage for enabling the second light emitting element to emit light with a desired second luminance is applied to the second dummy subpixel circuit through the second dummy data line.

16. The display device of claim 15, wherein the first pad and the second pad are disposed in a pad area of the non-display area, wherein the first dummy pad is positioned on one side of the pad area, and wherein the second dummy pad is positioned on another side of the pad area.

17. The display device of claim 13, wherein the dummy connection control line extends through a first area between the first subpixel circuit and the first light emitting element and a second area between the second subpixel circuit and the second light emitting element, wherein when a connection between the first subpixel circuit and the first light emitting element is broken and a connection between the second subpixel circuit and the second light emitting element is broken, the dummy connection control line and the first light emitting element are connected in the first area, the dummy connection control line and the second light emitting element are connected in the second area, the first dummy subpixel circuit and the dummy connection control line are connected, and the second dummy subpixel circuit and the dummy connection control line are connected, the first common signal is applied to the first dummy signal line, and the second common signal is applied to the second dummy signal line, and the dummy connection control line is disconnected between the first area and the second area.

18. The display device of claim 1, wherein the first light emitting element and the second light emitting element are disposed adjacent to each other and emit light of different colors, and wherein each of the first light emitting element and the second light emitting element includes one or more light emitting layers.

19. The display device of claim 13, wherein each of the first subpixel circuit, the second subpixel circuit, the first dummy subpixel circuit, and the second dummy subpixel circuit includes:

first to third nodes, the fourth node, a fifth node, and the sixth node;

the first transistor connected between the first node and the third node;

the second transistor controlled to be selectively turned on/off by an emission control signal to control an electrical connection between the first node and the fourth node;

a third transistor controlled to be selectively turned on/off by a scan signal to control an electrical connection between a data line and the third node; and the fourth transistor controlled to be selectively turned on/off by another scan signal to control an electrical connection between the fourth node and the fifth node, wherein the first common signal line to which the first common signal is applied is connected to the fifth node of the first subpixel circuit, wherein a second common signal line to which the second common signal is applied is connected to the fifth node of the second subpixel circuit, wherein a first dummy signal line to which the first common signal is applied is connected to the fifth node of the first dummy subpixel circuit, and wherein a second dummy signal line to which the second common signal is applied is connected to the fifth node of the second dummy subpixel circuit.

20. The display device of claim 19, wherein the repair transistor controls an electrical connection between the fourth node and the sixth node.

21. The display device of claim 20, wherein when a connection between the fourth node of the first subpixel circuit and a first pixel electrode of the first light emitting element is broken and a connection between the fourth node of the second subpixel circuit and a second pixel electrode of the second light emitting element is broken, the sixth node in each of the first dummy subpixel circuit and the second dummy subpixel circuit is connected to the dummy connection control line.

22. The display device of claim 19, wherein each of the first subpixel circuit, the second subpixel circuit, the first dummy subpixel circuit, and the second dummy subpixel circuit further includes a fifth transistor connected between a driving voltage line to which a driving voltage is applied and the fourth node, wherein each of the first dummy subpixel circuit and the second dummy subpixel circuit further includes a dummy capacitor between the fourth node and a seventh node to which the driving voltage is applied.

23. A display device, comprising:

a plurality of subpixels disposed in a display area and including a first subpixel and a second subpixel; and a plurality of dummy subpixel circuits disposed in a non-display area, wherein the first subpixel includes a first light emitting element and a first subpixel circuit, wherein the second subpixel includes a second light emitting element and a second subpixel circuit, wherein the first light emitting element and the first subpixel circuit are electrically disconnected from each other and the second light emitting element and the second subpixel circuit are electrically disconnected from each other, and wherein the plurality of dummy subpixel circuits includes a first dummy subpixel circuit electrically connected to the first light emitting element and a second dummy subpixel circuit electrically connected to the second light emitting element, wherein the first dummy subpixel circuit includes a first transistor for supplying a driving current, a second transistor for allowing the driving current from the first transistor to flow, a first node located in a path through which the driving current passing through the second transistor flows, a third transistor for transferring a signal from a first dummy signal line to the first node, a repair transistor for allowing the driving current passing through the first node to flow, and a second node located between the repair transistor and a dummy connection control line connected to the first light emitting element, the driving current passing through the repair transistor flowing through the dummy connection control line, and wherein the repair transistor is selectively turned on or off at the same time as the second transistor.

24. The display device of claim 23, wherein the first light emitting element emits light of a first wavelength, and the second light emitting element emits light of a second wavelength, and wherein the second wavelength is different from the first wavelength.

25. The display device of claim 23, further comprising:

a second dummy connection control line connecting the second dummy subpixel circuit and a second pixel electrode of the second light emitting element, wherein the dummy connection control line connects the first dummy subpixel circuit and a first pixel electrode of the first light emitting element, and wherein the dummy connection control line and the second dummy connection control line are separated.

26. The display device of claim 23, wherein at a predefined driving timing, a first reset voltage is applied to a first pixel electrode of the first light emitting element, and a second reset voltage different from the first reset voltage is applied to a second pixel electrode of the second light emitting element.

27. A display device, comprising:

a display area including a plurality of subpixels, wherein each subpixel comprises:

a subpixel circuit;

a light emitting element, wherein the subpixel circuit and the light emitting element are electrically disconnected from each other prior to defect correction;

a non-display area including a plurality of dummy subpixel circuits;

a dummy connection control line extending across the display area and the non-display area, the dummy connection control line disposed adjacent to the plurality of subpixel circuits and the plurality of dummy subpixel circuits;

wherein, upon a defect occurring in a subpixel circuit of the plurality of subpixel circuits, the dummy connection control line is configured to establish an electrical connection between a dummy subpixel circuit in the non-display area and the light emitting element of a subpixel having the defect, wherein the dummy subpixel circuit includes a first transistor for supplying a driving current, a second transistor for allowing the driving current from the first transistor to flow, a first node located in a path through which the driving current passing through the second transistor flows, a third transistor for transferring a signal from a first dummy signal line to the first node, a repair transistor for allowing the driving current passing through the first node to flow, and a second node located between the repair transistor and the dummy connection control line connected to the light emitting element of a subpixel having the defect, the driving current passing through the repair transistor flowing through the dummy connection control line, and wherein the repair transistor is selectively turned on or off at the same time as the second transistor.

28. The display device of claim 27, further comprising:

a switching transistor configured to selectively turn on or off the electrical connection between the dummy subpixel circuit and the light emitting element of the defective subpixel.

29. The display device of claim 27, wherein the dummy connection control line is configured to connect different dummy subpixel circuits of the plurality of dummy subpixel circuits to compensate for multiple adjacent defective subpixels.

30. The display device of claim 29, wherein the dummy connection control line includes a first section and a second section, wherein, upon detection of multiple adjacent defective subpixels, the dummy connection control line is cut at a selected cutting point to form a first dummy connection control line and a second dummy connection control line, enabling independent defect repair for each subpixel.

31. The display device of claim 30, wherein the first dummy connection control line is welded to a first pixel electrode of a first light emitting element at a first welding point, and the second dummy connection control line is welded to a second pixel electrode of a second light emitting element at a second welding point.

32. The display device of claim 31, wherein the first dummy connection control line and the second dummy connection control line are separated from each other.

33. The display device of claim 27, wherein the dummy connection control line is configured to be divided into multiple sections upon defect detection, wherein each separated section is independently connected to a corresponding dummy subpixel circuit, and wherein a first dummy subpixel circuit of the plurality of dummy subpixel circuits compensates for a first defective subpixel, and a second dummy subpixel circuit of the plurality of dummy subpixel circuits compensates for a second defective subpixel.

34. A method for repairing a defective subpixel in a display device, the method comprising:

detecting a defect in a subpixel circuit of a first subpixel disposed in a display area of the display device;

electrically disconnecting the defective subpixel circuit from a light emitting element of the first subpixel; and electrically connecting a dummy subpixel circuit disposed in a non-display area of the display device to the light emitting element of the first subpixel via a dummy connection control line, wherein the dummy subpixel circuit includes a first transistor for supplying a driving current, a second transistor for allowing the driving current from the first transistor to flow, a first node located in a path through which the driving current passing through the second transistor flows, a third transistor for transferring a signal from a first dummy signal line to the first node, a repair transistor for allowing the driving current passing through the first node to flow, and a second node located between the repair transistor and the dummy connection control line connected to the light emitting element of the first subpixel, the driving current passing through the repair transistor flowing through the dummy connection control line, and wherein the repair transistor is selectively turned on or off at the same time as the second transistor.

* * * * *